(12) United States Patent
Lee et al.

(10) Patent No.: US 12,029,068 B2
(45) Date of Patent: Jul. 2, 2024

(54) DISPLAY DEVICE AND SOUND SYSTEM INCLUDING THE SAME

(71) Applicant: Samsung Display Co., LTD., Yongin-si (KR)

(72) Inventors: Jae Been Lee, Seoul (KR); Yi Joon Ahn, Seoul (KR); Sung Hoon Kim, Asan-si (KR); Eun Kyung Yeon, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 110 days.

(21) Appl. No.: 17/476,763

(22) Filed: Sep. 16, 2021

(65) Prior Publication Data

US 2022/0190060 A1    Jun. 16, 2022

(30) Foreign Application Priority Data

Dec. 10, 2020   (KR) .................. 10-2020-0172210

(51) Int. Cl.
*H10K 59/00* (2023.01)
*H04R 1/02* (2006.01)
*H10K 59/10* (2023.01)
*H10K 77/10* (2023.01)

(52) U.S. Cl.
CPC ............. *H10K 59/00* (2023.02); *H04R 1/028* (2013.01); *H10K 59/10* (2023.02); *H10K 77/10* (2023.02); *H04R 2499/15* (2013.01)

(58) Field of Classification Search
CPC ........ H10K 59/10; H10K 59/00; H04N 5/642; H01L 27/3225
See application file for complete search history.

(56) References Cited

U.S. PATENT DOCUMENTS

| | | | |
|---|---|---|---|
| 9,030,386 B2 | 5/2015 | Park | |
| 2013/0094126 A1* | 4/2013 | Rappoport | G06F 1/1688 361/679.01 |
| 2016/0192511 A1* | 6/2016 | Won | G06F 1/1688 361/752 |
| 2018/0012069 A1* | 1/2018 | Chung | G06V 40/1318 |
| 2018/0121703 A1* | 5/2018 | Jung | G06V 40/1324 |
| 2019/0246190 A1* | 8/2019 | Park | G06V 40/1306 |

(Continued)

FOREIGN PATENT DOCUMENTS

| | | |
|---|---|---|
| JP | 2005117267 | 4/2005 |
| KR | 101122204 | 3/2012 |

(Continued)

*Primary Examiner* — Yuzhen Shen
(74) *Attorney, Agent, or Firm* — CANTOR COLBURN LLP

(57) ABSTRACT

A display device includes a display panel in which first holes arranged in a first direction and a second direction that intersects the first direction are defined, and a first panel bottom member which is disposed on one surface of the display panel and in which second holes arranged in the first and second directions are defined. A maximum length of a second hole among the second holes in the first direction satisfies "e×(a+c)" where a denotes a maximum length of a first hole among the first holes in the first direction, c denotes a minimum distance between neighboring first holes among the first holes in the first direction, and e is a positive integer.

24 Claims, 45 Drawing Sheets

(56) References Cited

U.S. PATENT DOCUMENTS

2020/0035766 A1\* 1/2020 Moon .................. H10K 59/122
2021/0193012 A1\* 6/2021 Jung ...................... H01Q 13/10
2021/0360097 A1\* 11/2021 Sun ....................... G06F 1/1626

FOREIGN PATENT DOCUMENTS

KR      1020220033535      3/2022
WO    WO-2017191957 A1 \* 11/2017 ........... G09G 3/2003

\* cited by examiner

FIG. 2
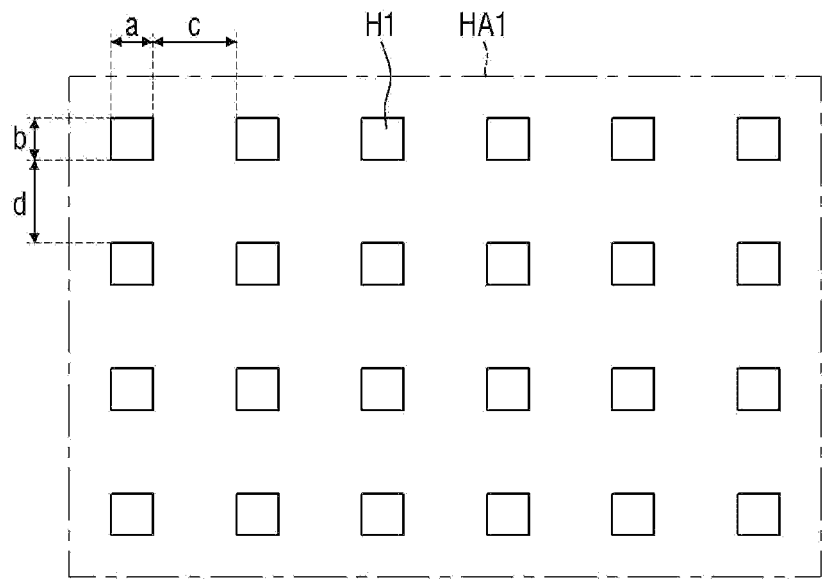
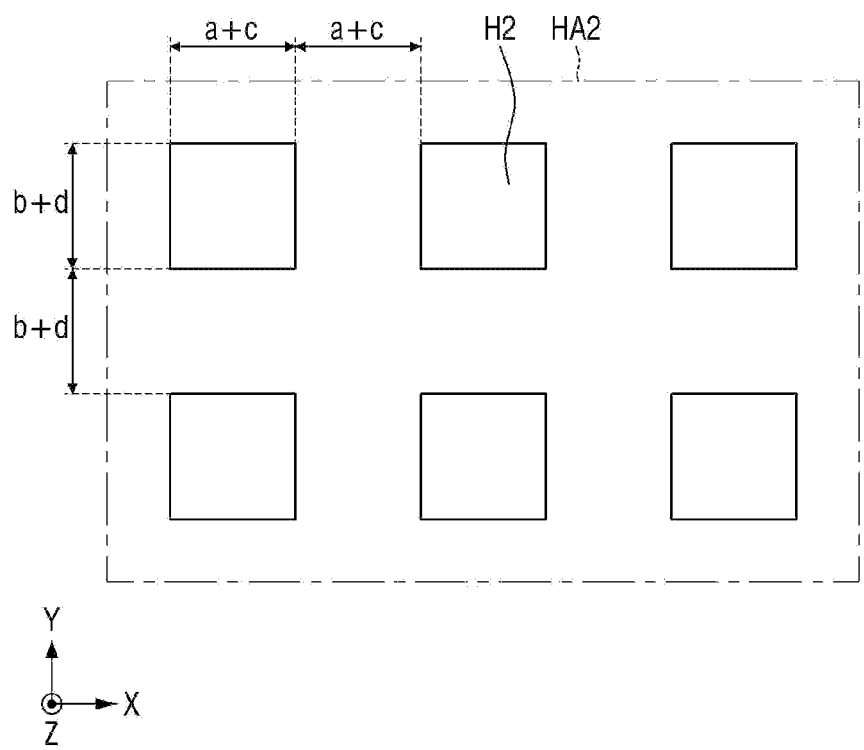

FIG. 7
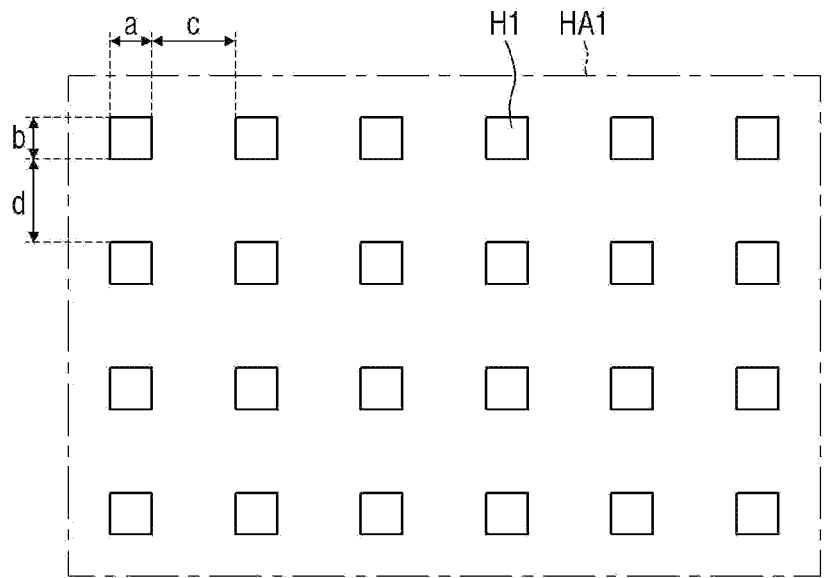
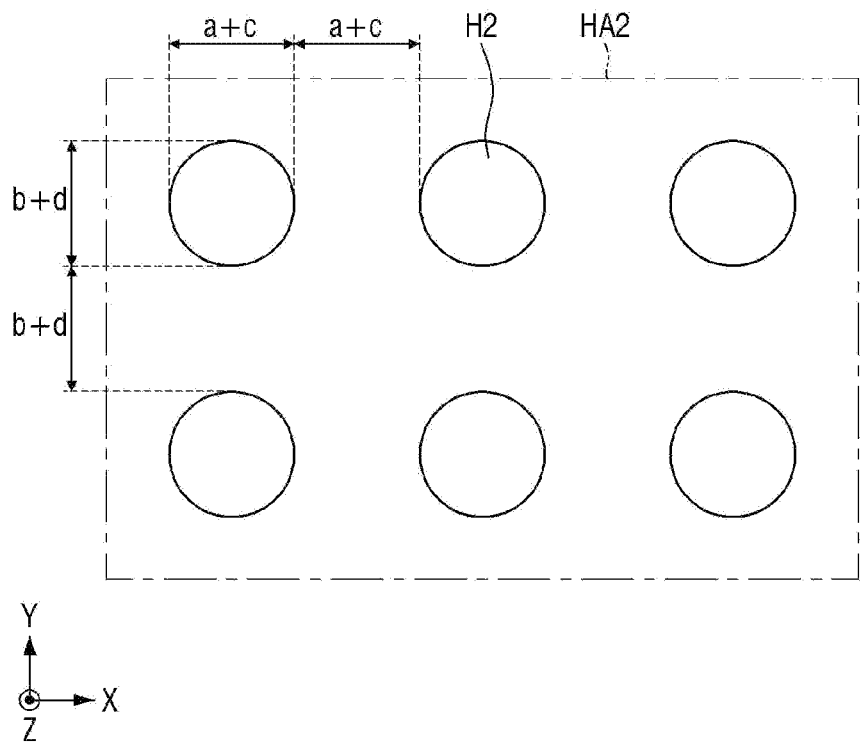

FIG. 9
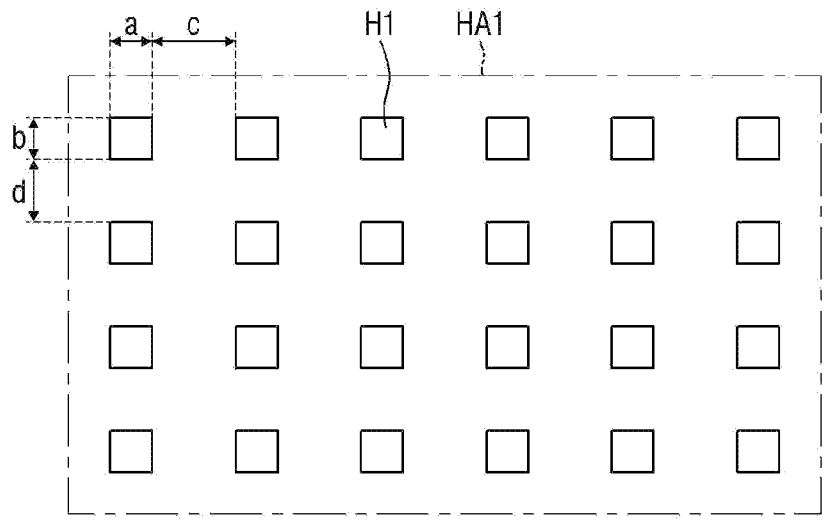
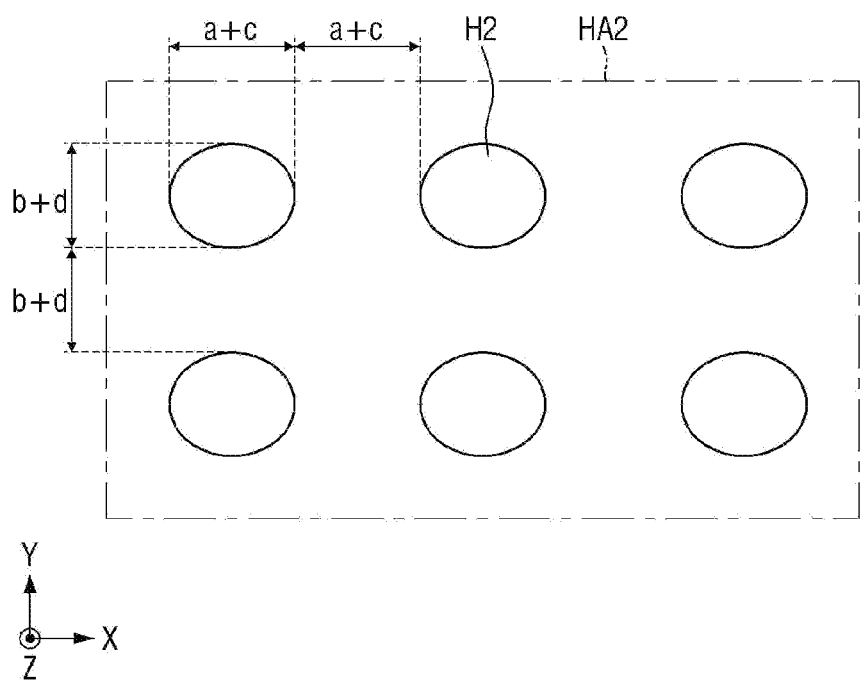

FIG. 11
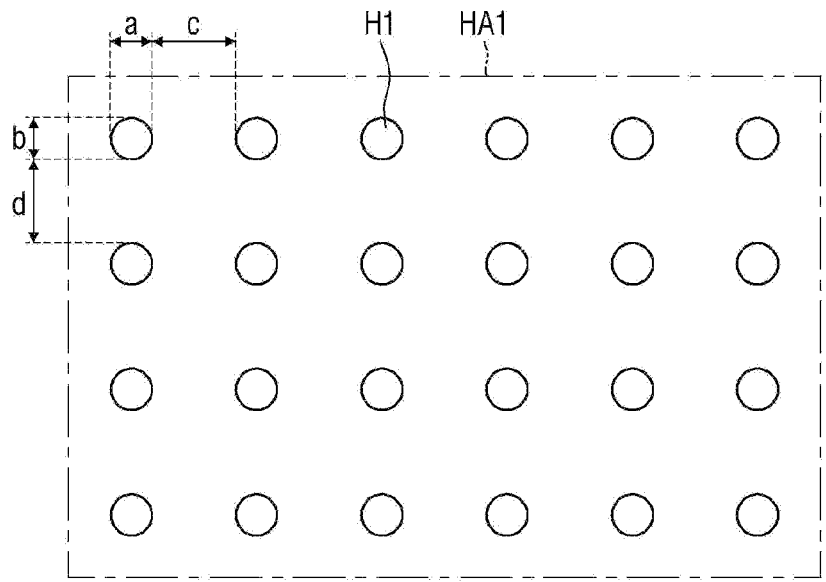
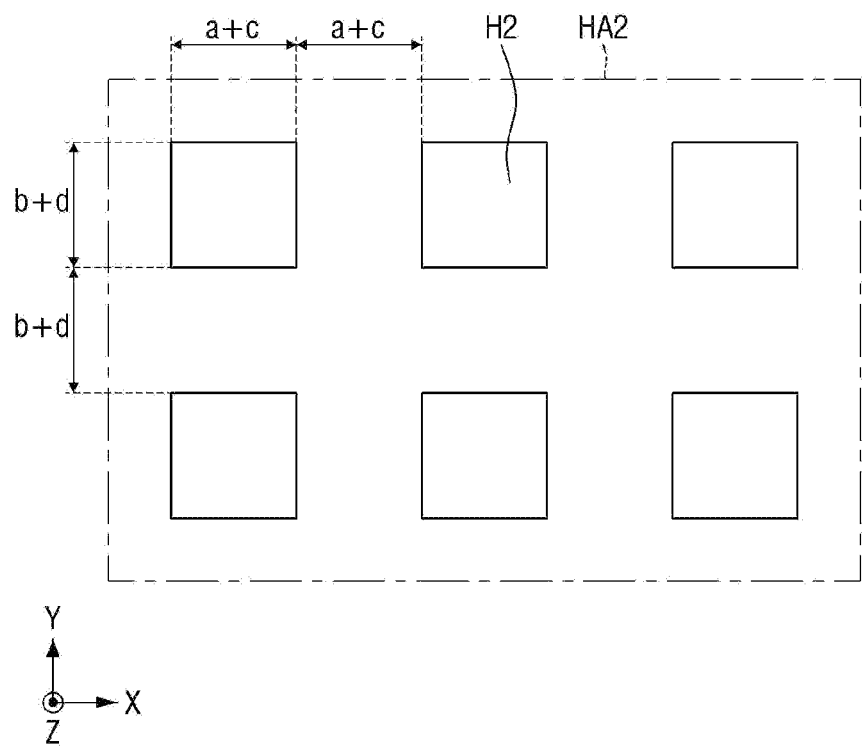

FIG. 13
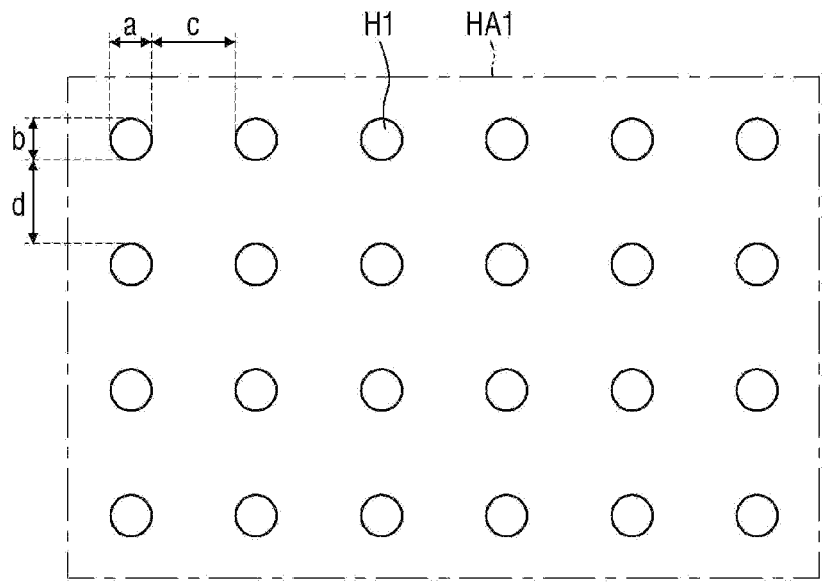
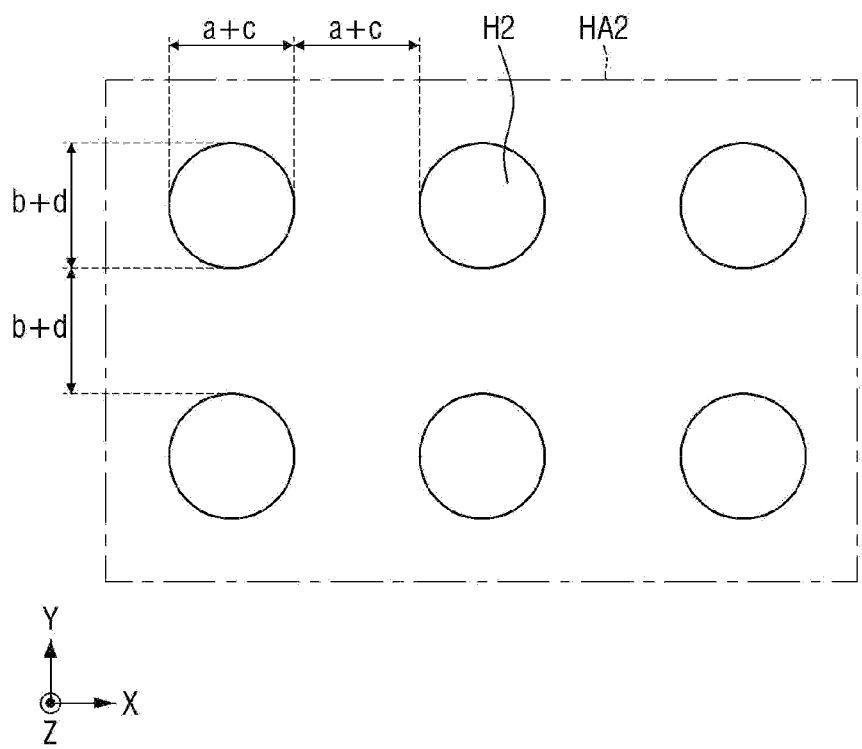

FIG. 15
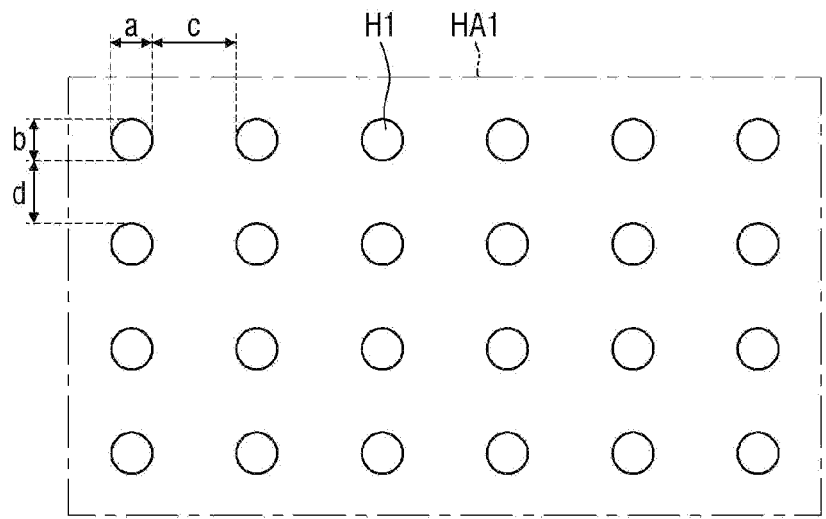
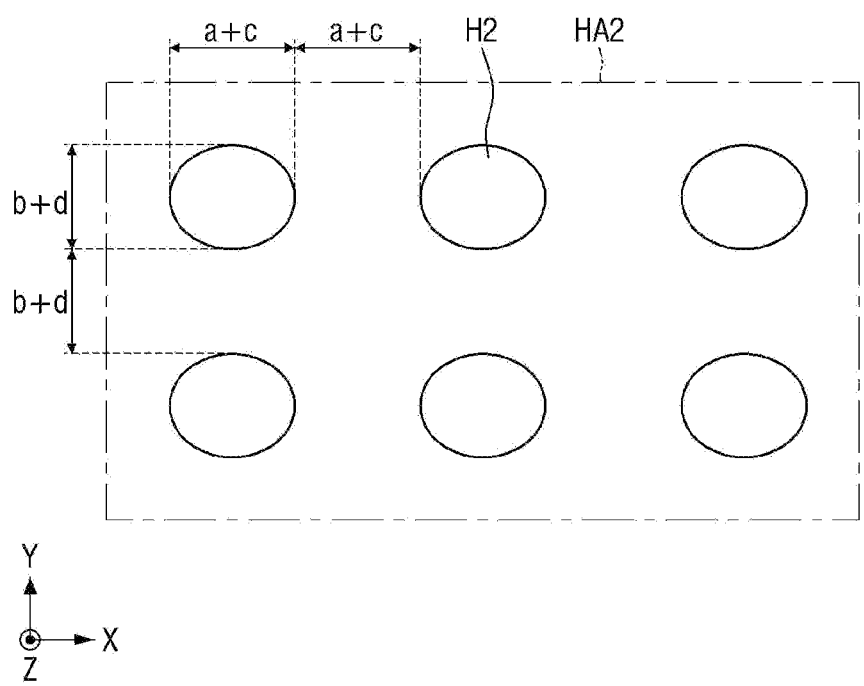

FIG. 17
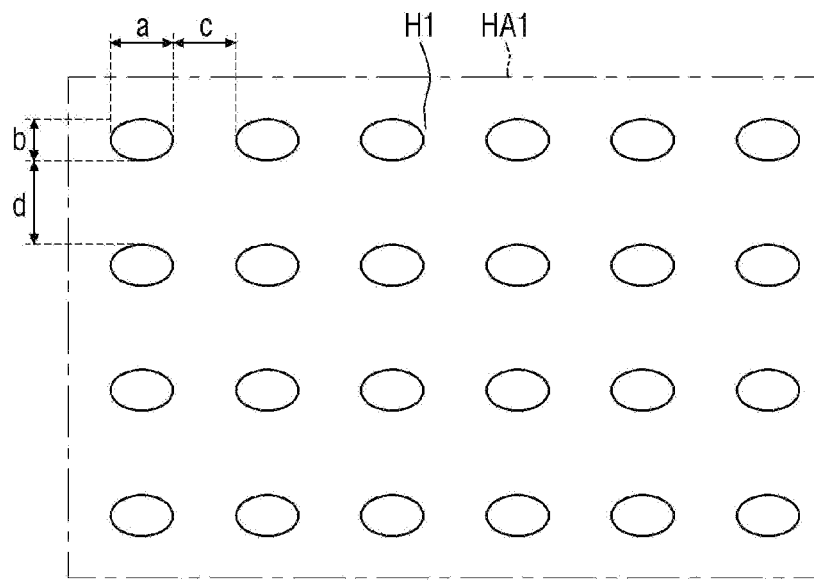
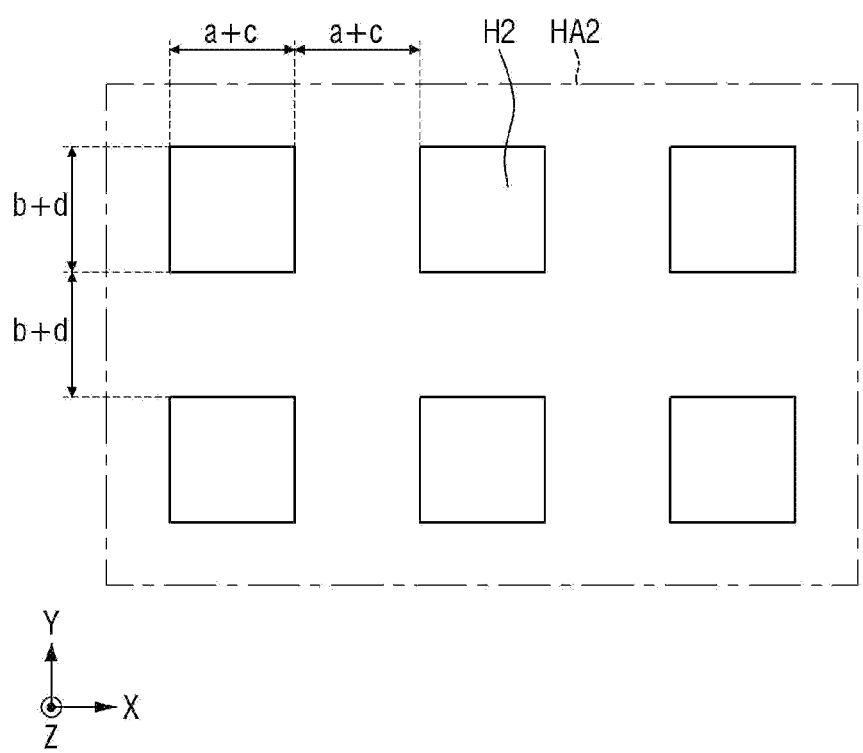

FIG. 19
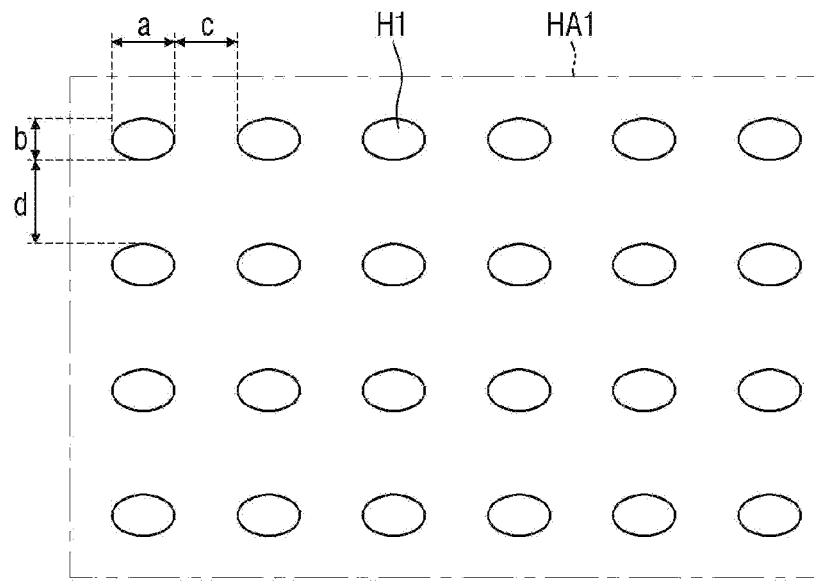
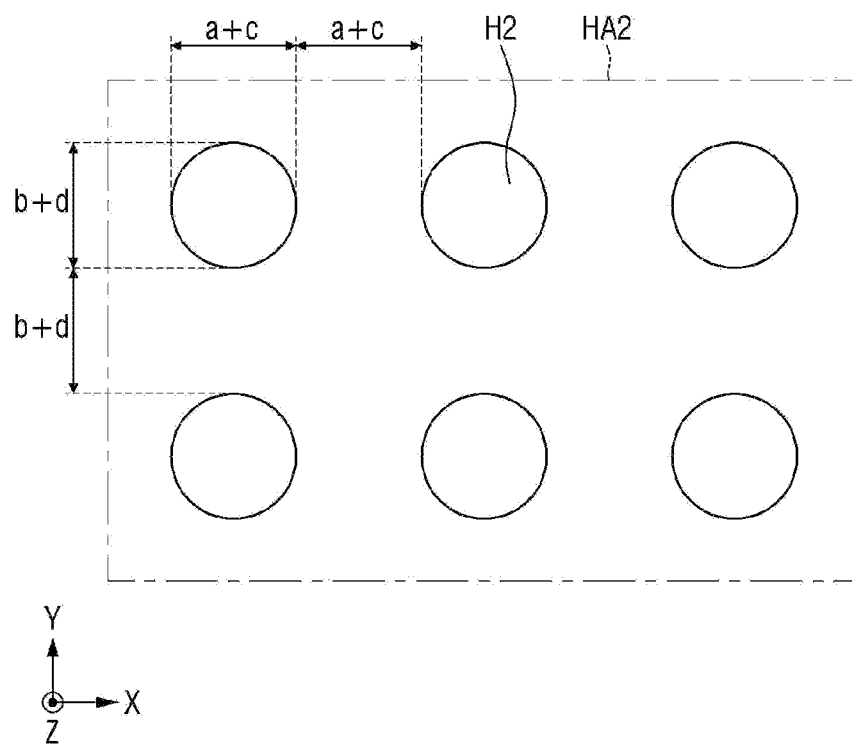

FIG. 21
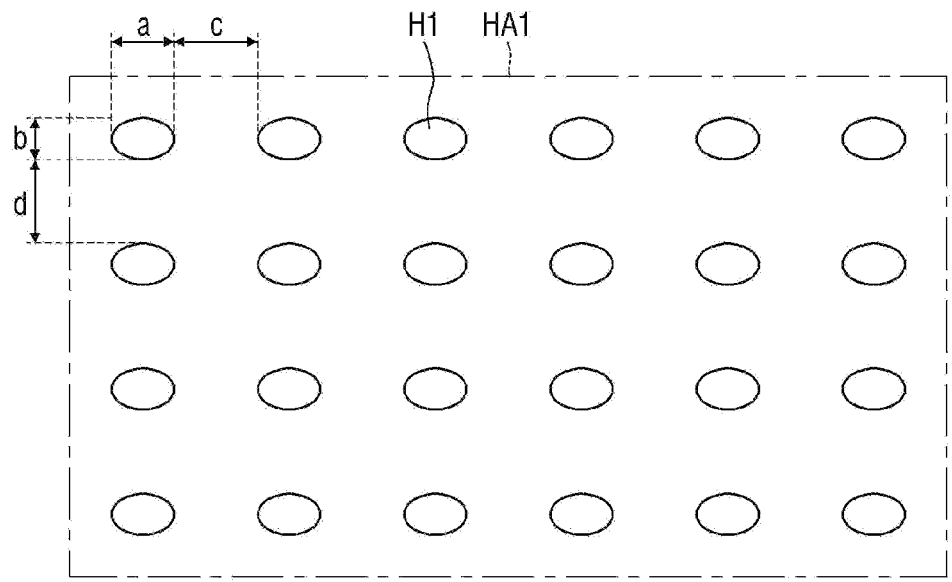
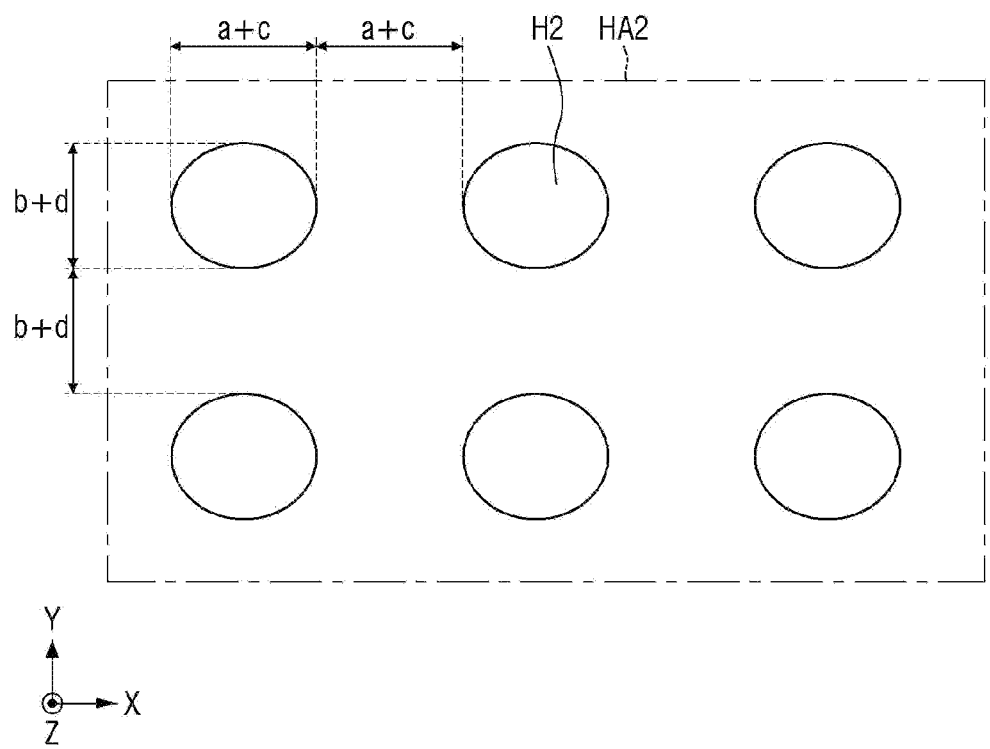

DISPLAY DEVICE AND SOUND SYSTEM INCLUDING THE SAME

This application claims priority to Korean Patent Application No. 10-2020-0172210, filed on Dec. 10, 2020, and all the benefits accruing therefrom under 35 U.S.C. § 119, the content of which in its entirety is herein incorporated by reference.

BACKGROUND

1. Field

Embodiments of the invention relate to a display device and a sound system including the same.

2. Description of the Related Art

Display devices are becoming more important with developments in multimedia technology. Accordingly, various display devices such as an organic light-emitting diode ("OLED") display device, a liquid crystal display ("LCD") device, and the like are being used. Typically, a display device, which displays an image, includes a display panel such as a light-emitting display panel or an LCD panel.

Recently, there is an increasing demand not only for a display device capable of displaying a high-quality image, but also for a display device capable of providing sound with a sense of presence together with a separate sound device.

SUMMARY

When a sound device is disposed on a rear surface of a display panel of a display device, a sound from the sound device may be blocked by the display panel. Therefore, even a sound device capable of outputting high-quality sound may not be able to provide sound with a full sense of presence when it is disposed on the rear surface of the display panel of a display device.

Features of some embodiments of the invention provide a display device including a hole that may pass sound therethrough and thereby capable of providing sound with a sense of presence even when a sound device is disposed on the rear surface of a display panel.

Features of some embodiments of the invention a sound system including a display panel with a hole that may pass sound therethrough and thereby capable of providing sound with a sense of presence even when a sound device is disposed on the rear surface of the display panel.

According to some embodiments of the invention, there is provided a display device including a display panel in which first holes arranged in a first direction and a second direction that intersects the first direction are defined, and a first panel bottom member which is disposed on one surface of the display panel and in which second holes arranged in the first and second directions are defined. A maximum length of a second hole among the second holes in the first direction satisfies "e×(a+c)" where a denotes a maximum length of a first hole among the first holes in the first direction, c denotes a minimum distance between neighboring first holes among the first holes in the first direction, and e is a positive integer.

In an embodiment, a minimum distance between neighboring second holes among the second holes in the first direction may satisfy "e×(a+c)".

In an embodiment, a maximum length of the first hole in the first direction may be smaller than the minimum distance between the neighboring first holes in the first direction.

In an embodiment, a maximum length of a second hole among the second holes in the second direction may satisfy "f×(b+d)" where b denotes a maximum length of the first hole in the second direction, d denotes a minimum distance between neighboring first holes in the second direction, and f is a positive integer.

In an embodiment, a minimum distance between neighboring second holes in the second direction may satisfy "f×(b+d)" where b denotes a maximum length of the first hole in the second direction, d denotes a minimum distance between neighboring first holes in the second direction, and f is a positive integer.

In an embodiment, a maximum length of the first hole in the second direction may be smaller than the minimum distance between the neighboring first holes in the second direction.

In an embodiment, the first holes may have a polygonal, circular, or elliptical shape in a plan view.

In an embodiment, the second holes may have a polygonal, circular, or elliptical shape in a plan view.

In an embodiment, the display device may further include a second panel bottom member which is disposed on one surface of the first panel bottom member and in which third holes, which are arranged in the first and second directions are defined.

In an embodiment, a maximum length of a third hole among the third holes in the first direction may satisfy "g×(a+c)" where g is a positive integer greater than e.

In an embodiment, a minimum distance between neighboring third holes in the first direction among the third holes may satisfy "g×(a+c)" where g is a positive integer greater than e.

In an embodiment, a maximum length of a third hole among the third holes in the second direction may satisfy "h×(b+d)" where b denotes a maximum length of the first hole in the second direction, d denotes a minimum distance between neighboring first holes in the second direction, and h is a positive integer greater than f.

In an embodiment, a minimum distance between neighboring third holes among the third holes in the second direction may satisfy "h×(b+d)" where b denotes a maximum length of the first hole in the second direction, d denotes a minimum distance between neighboring first holes in the second direction, and h is a positive integer greater than f.

In an embodiment, each of the third holes may overlap with at least one second hole and at least one first hole.

According to some embodiments of the invention, there is provided a display device including a first display panel in which first holes arranged in a first direction and a second direction that intersects the first direction are defined, and a first panel bottom member which is disposed on one surface of the first display panel and in which second holes arranged in the first and second directions are defined. One of the second holes overlaps with at least one first hole among the first holes.

In an embodiment, the one of the second holes may have a larger size than the at least one first hole.

In an embodiment, the one of the second holes may overlap with at least two first holes. An overlapping area of the one of the second holes and one of the at least two first holes may be different from an overlapping area of the one of the second holes and another first hole of the at least two first holes.

In an embodiment, the display device may further includes a second panel bottom member which is disposed on one surface of the first panel bottom member and in which third holes arranged in the first and second directions are defined, where one of the third holes overlaps with at least one first hole and at least one second hole.

In an embodiment, the one of the third holes may have a larger size than the at least one first hole and the at least one second hole.

In an embodiment, pad holes which penetrate the substrate may be defined in the substrate.

In an embodiment, the pad holes may not overlap with the second holes.

In an embodiment, the first display panel may further include routing lines, which are disposed on a front surface of the substrate, connecting lines, which are disposed on a rear surface of the substrate, and connecting electrodes, which are disposed in the pad holes and connect the routing lines and the connecting lines.

In an embodiment, the first display panel may further include display pads, which are connected to the connecting lines.

In an embodiment, the display device may further include a second display panel disposed adjacent to the first display panel in the first or second direction.

In an embodiment, first holes and pad holes may be defined in the second display panel.

According to some embodiments of the invention, there is provided a sound system including a display panel in which first holes arranged in a first direction and a second direction that intersects the first direction are defined, a first panel bottom member which is disposed on one surface of the display panel and in which second holes arranged in the first and second directions are defined, and a sound output device, which is disposed on one surface of the first panel bottom member and outputs sound. A maximum length of a second hole among the second holes in the first direction satisfies "e×(a+c)" where a denotes a maximum length of a first hole among the first holes in the first direction, c denotes a minimum distance between neighboring first holes among the first holes in the first direction, and e is a positive integer.

According to the aforementioned and other embodiments of the invention, as each of the second holes of a panel bottom member overlaps with at least one of the first holes in the thickness direction of a display panel, first and second sounds from first and second sound generating devices may be output to the front of a display device through the second holes of the panel bottom member and the first holes of the display panel. That is, even when the first and second sound generating devices are disposed at the rear of the display device, the first and second sounds may not be blocked by the panel bottom member. Accordingly, even when the first and second sound generating devices are disposed at the rear of the display device, sound with a sense of presence may be provided.

BRIEF DESCRIPTION OF THE DRAWINGS

The above and other embodiments and features of the invention will become more apparent by describing embodiments thereof with reference to the attached drawings, in which:

FIG. 2 is a plan view illustrating an embodiment of first holes of a display panel and second holes of a first panel bottom member according to the invention;

FIG. 7 is a plan view illustrating another embodiment of first holes of a display panel and second holes of a first panel bottom member according to the invention;

FIG. 9 is a plan view illustrating another embodiment of first holes of a display panel and second holes of a first panel bottom member according to the invention;

FIG. 11 is a plan view illustrating another embodiment of first holes of a display panel and second holes of a first panel bottom member according to the invention;

FIG. 13 is a plan view illustrating another embodiment of first holes of a display panel and second holes of a first panel bottom member according to the invention;

FIG. 15 is a plan view illustrating another embodiment of first holes of a display panel and second holes of a first panel bottom member according to the invention;

FIG. 17 is a plan view illustrating another embodiment of first holes of a display panel and second holes of a first panel bottom member according to the invention;

FIG. 19 is a plan view illustrating another embodiment of first holes of a display panel and second holes of a first panel bottom member according to the invention;

FIG. 21 is a plan view illustrating another embodiment of first holes of a display panel and second holes of a first panel bottom member according to the invention;

DETAILED DESCRIPTION

Figure 1A:
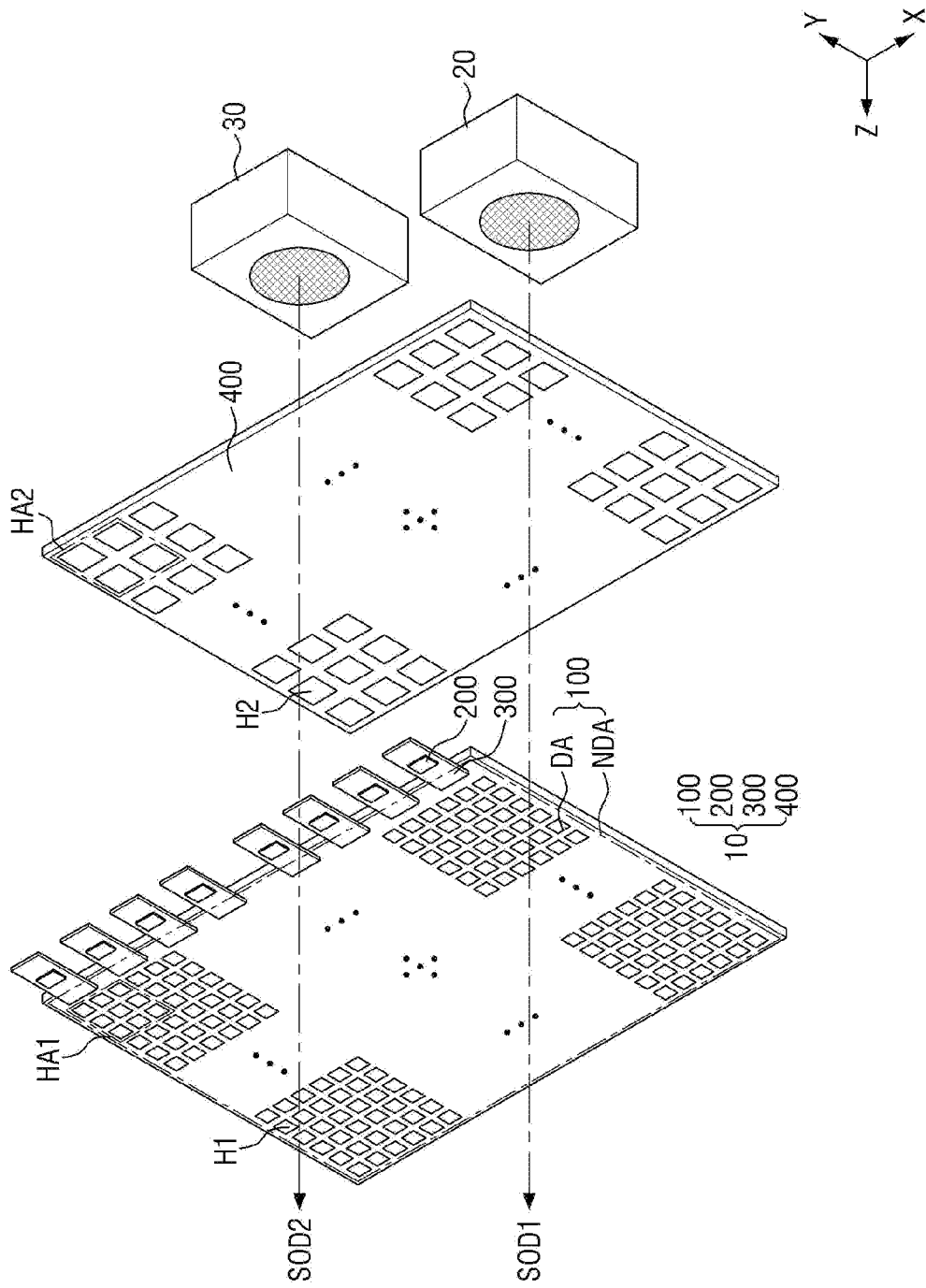
FIG. 1A is an exploded perspective view of an embodiment of a sound system including a display device according to the invention.

Features of some embodiments of the invention and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the features of the disclosure to those skilled in the art. Accordingly, processes, elements, and techniques that are not necessary to those having ordinary skill in the art for a complete understanding of the features of the disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to cross-sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the drawing figures. It will be understood that the spatially relative terms are intended to encompass different orientations of the device in use or in operation, in addition to the orientation depicted in the drawing figures. For example, if the device in the drawing figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "in a plan view" means viewing a target portion from the top, and the phrase "on a cross-section" means viewing a cross-section formed by vertically cutting a target portion from the side.

It will be understood that when an element, layer, region, or component is referred to as being "disposed on," "on," "connected to," or "coupled to" another element, layer, region, or component, it can be directly disposed on, on, connected to, or coupled to the other element, layer, region, or component, or indirectly disposed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group including X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the disclosure refers to "one or more embodiments of the disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components in embodiments of the disclosure described herein may be implemented utilizing any suitable hardware, firmware (e.g. an application-specific integrated circuit), software, or a combination of software, firmware, and hardware. For example, the various components of these devices may be disposed on one integrated circuit ("IC") chip or on separate IC chips. Further, the various components of these devices may be implemented on a flexible printed circuit film, a tape carrier package ("TCP"), a printed circuit board ("PCB"), or disposed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the disclosure.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and/or the specification, and should not be interpreted in an idealized or overly formal sense, unless expressly so defined herein.

Figure 1B:
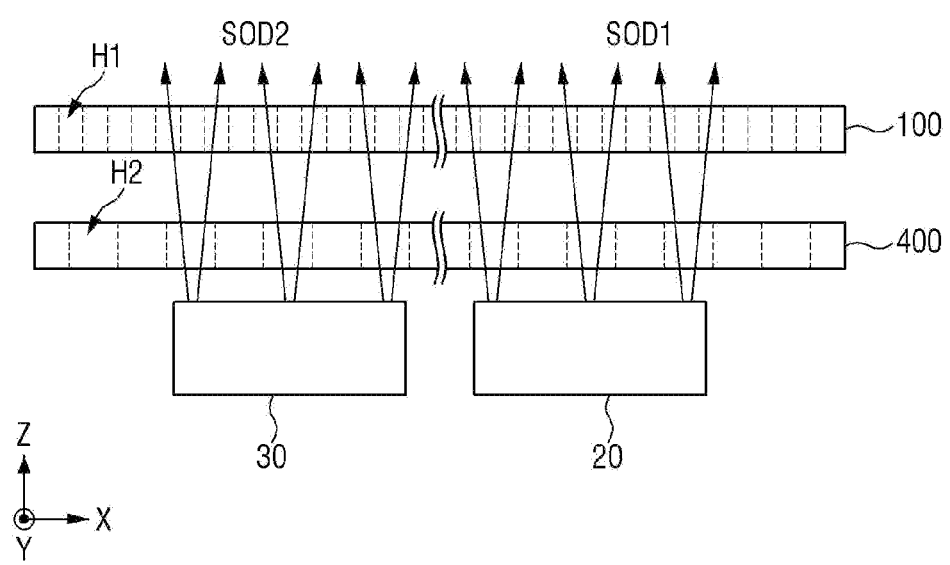
FIG. 1B is a side view of the sound system of FIG. 1A.

FIG. 1A is an exploded perspective view of an embodiment of a sound system including a display device according to the invention. FIG. 1B is a side view of the sound system of FIG. 1A.

Referring to FIGS. 1A and 1B, the sound system includes a display device 10, a first sound generating device 20, and a second sound generating device 30.

The display device 10, which is a device displaying a moving or still image, may be used not only in a portable electronic device such as a mobile phone, a smartphone, a tablet personal computer (PC), a smartwatch, a watchphone, a mobile communication terminal, an electronic notepad, an electronic book, a portable multimedia player ("PMP"), a navigation device, or an ultramobile PC ("UMPC"), but also in various other products such as a television ("TV"), a notebook computer, a monitor, a billboard, or an Internet-of-Things ("IoT") device.

The display device 10 is illustrated as being, for example, an inorganic light-emitting display device including inorganic semiconductor elements as its light-emitting elements, but the invention is not limited thereto.

The display device 10 includes a display panel 100, a display driving circuit 200, a circuit board 300, and a first panel bottom member 400.

The display panel 100 may be provided in a quadrangular (e.g., rectangular) shape including long sides in a first direction (or an X-axis direction) and short sides in a second direction (or a Y-axis direction) in a plan view. The corners where the long sides and the short sides of the display panel 100 meet may be rounded to have a predetermined curvature or may be right-angled. The planar shape of the display panel 100 is not particularly limited, and the display panel 100 may be provided in various other shapes such as another polygonal shape, a circular shape, or an elliptical shape. The display panel 100 may be flat, but the invention is not limited thereto. In an embodiment, the display panel 100 may include curved parts having a uniform or varying curvature. The display panel 100 may be flexible such as foldable, bendable, or rollable.

The display panel 100 may include a display area DA, which displays an image, and a non-display area NDA, which is disposed around the display area DA. The display area DA may occupy most of the display panel 100. The display area DA may be disposed in a middle portion of the display panel 100. Pixels may be disposed in the display are DA to display an image.

First holes H1 may be defined in the display area DA. The first holes H1 may be holes that penetrate the display panel 100. The first holes H1 may be arranged in the first direction (or the X-axis direction) and the second direction (or the Y-axis direction). That is, the first holes H1 may be arranged in a matrix form.

The non-display area NDA may be disposed adjacent to the display area DA. The non-display area NDA may be an area outside the display area DA. The non-display area NDA may surround the display area DA. The non-display area NDA may be an edge area of the display panel 100.

Display pads, which are to be connected to circuit boards 300, may be disposed in the non-display area NDA. The display pads may be disposed on one side of the display panel 100. In an embodiment, the display pads may be disposed on the upper side of the display panel 100.

A plurality of circuit boards 300 may be disposed on the display pads, which are disposed along one edge of the display panel 100. FIG. 1A illustrates that there are provided eight circuit boards 300, but the number of circuit boards 300 is not particularly limited.

The circuit boards 300 may be attached to the display pads via a low-resistance, high-reliability material such as an anisotropic conductive film ("ACF") or a self-assembly anisotropic conductive paste ("SAP"). Accordingly, the circuit boards 300 may be electrically connected to signal lines of the display panel 100. The display panel 100 may receive various signals via the circuit boards 300. In an embodiment, the circuit boards 300 may be flexible films such as flexible printed circuit boards ("FPCBs"), printed circuit boards ("PCBs"), or chip-on-films ("COFs").

Display driving circuits 200 may generate various signals such as data voltages and/or power supply voltages. The display driving circuits 200 may provide the generated signals to the display panel 100 via the circuit boards 300.

The display driving circuits 200 may be provided as integrated circuits ("ICs") and may be attached on the circuit boards 300. In an alternative embodiment, the display driving circuits 200 may be attached on the display panel 100 in a chip-on-glass ("COG") or chip-on-plastic ("COP") manner or via ultrasonic bonding.

The first panel bottom member 400 may be disposed on one surface of the display panel 100. The first panel bottom member 400 may be disposed on a surface of the display panel 100 that is opposite to a display surface of the display panel 100 that displays an image. In an embodiment, in a case where the display panel 100 displays an image on the front surface thereof, the first panel bottom member 400 may be disposed on the rear surface of the display panel 100.

Second holes H2 may be defined in the first panel bottom member 400. The second holes H2 may be holes that penetrate the first panel bottom member 400. The second holes H2 may be arranged in the first direction (or the X-axis direction) and the second direction (or the Y-axis direction). That is, the second holes H2 may be arranged in a matrix form. Each of the second holes H2 may overlap with at least one first hole H1 in a third direction (or a Z-axis direction).

The first panel bottom member 400 may include at least one of a light-absorbing member for absorbing incident light from the outside, a buffer member for absorbing external shock, and a heat dissipation member for efficiently releasing heat from the display panel 100.

The light-absorbing member may block the transmission of light therethrough and may prevent elements (e.g., the circuit boards 300) disposed therebelow from becoming visible from above the display panel 300. The light-absorbing member may include a light-absorbing material such as a black pigment or a black dye.

The buffer member may absorb external shock and may prevent the display panel 100 from being broken. In an embodiment, the buffer member may include a polymer resin such as polyurethane, polycarbonate, polypropylene, or polyethylene or may include an elastic material such as rubber, a urethane-based material, or a sponge obtained by foam-molding an acrylic material.

The heat dissipation member may dissipate heat generated by the display panel 100. The heat dissipation member may include a thin metal film including a metal with excellent thermal conductivity such as copper, nickel, ferrite, or silver. In an alternative embodiment, the heat dissipation member may include graphite or carbon nanotubes, in which case, the heat dissipation member may block electromagnetic waves.

The first panel bottom member 400 may be a lower chassis. The first panel bottom member 400 may form the exterior of the rear surface of the display device 10. In an embodiment, the first panel bottom member 400 may include a metal or tempered glass.

The first panel bottom member 400 will be described later with reference to FIGS. 26A and 26B.

The first and second sound generating devices (also referred to as first and second sound output devices) 20 and 30 may output sound. The first and second sound generating devices 20 and 30 may output the same sound or different sounds. The first and second sound generating devices 20 and 30 may be speakers.

The first and second sound generating devices 20 and 30 may be disposed on one surface of the first panel bottom member 400. In an embodiment, in a case where the display panel 100 is disposed on the front surface of the first panel bottom member 400, the first and second sound generating devices 20 and 30 may be disposed on the rear surface of the first panel bottom member 400. The first and second sound generating devices 20 and 30 may output sound toward the rear surface of the first panel bottom member 400.

The first sound generating device 20 may be disposed adjacent to the right side of the display device 10, and the second sound generating device 30 may be disposed adjacent to the left side of the display device 10. However, the locations of the first and second sound generating devices 20 and 30 are not particularly limited.

As illustrated in FIGS. 1A and 1B, as each of the second holes H2 overlaps with at least one first hole H1 in the third direction (or the Z-axis direction), first and second sounds SOD1 and SOD2 may be output from the first and second sound generating devices 20 and 30, respectively, to the front surface of the display device 10 through the second holes H2 of the first panel bottom member 400 and the first holes H1 of the display panel 100. That is, the first holes H1 and the second holes H2 may be holes that pass sound therethrough. Thus, even when the first and second sound generating devices 20 and 30 are disposed at the rear of the display device 10, the first and second sounds SOD1 and SOD2 from the first and second sound generating devices 20 and 30 may not be blocked by the display panel 100 and the first panel bottom member 400. Accordingly, even when the first and second sound generating devices 20 and 30 are disposed at the rear of the display device 10, sound with a sense of presence may be provided.

In order for each of the second holes H2 to overlap with at least one first hole H1 in the third direction (or the Z-axis direction), the display panel 100 and the first panel bottom member 400 need to be aligned, and the first panel bottom member 400 needs to be attached on one surface of the display panel 100. In this case, separate equipment for attaching the first panel bottom member 400 on one surface of the display panel 100 is needed, which, however, increases the manufacturing cost and time of the sound system. Thus, even when the display panel 100 and the first panel bottom member 400 are attached together without being aligned, the first holes H1 and the second holes H2 need to be designed such that each of the second holes H2 may overlap with at least one first hole H1 in the third direction (or the Z-axis direction). This will be described later with reference to FIGS. 2 through 6.

Figure 3:
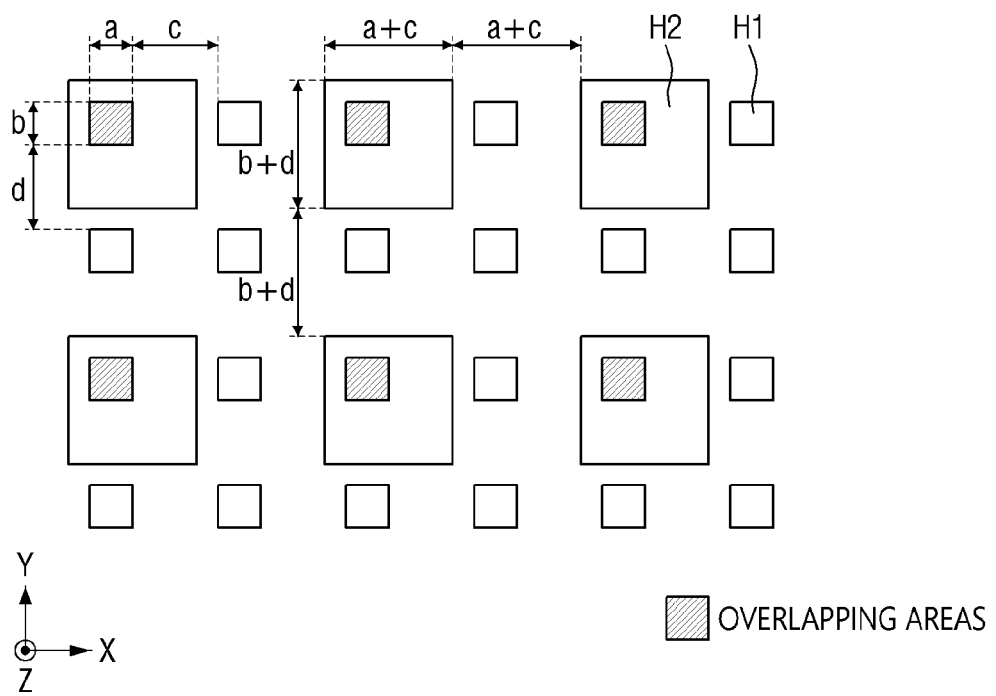
FIG. 3 illustrates the overlapping areas of the first holes of the display panel of FIG. 2 and the second holes of the first panel bottom member of FIG. 2.

FIG. 2 is a plan view illustrating an embodiment of first holes of a display panel and second holes of a first panel bottom member according to the invention. FIG. 3 illustrates the overlapping areas of the first holes of the display panel of FIG. 2 and the second holes of the first panel bottom member of FIG. 2.

For convenience, FIG. 2 illustrates only first holes H1 in a first hole area HA1 of FIG. 1A, and FIG. 3 illustrates only second holes H2 in a second hole area HA2 of FIG. 1A.

Referring to FIGS. 2 and 3, the first holes H1 and the second holes H2 may have a polygonal shape in a plan view. FIGS. 2 and 3 illustrate that the first holes H1 and the second holes H2 have a quadrangular (e.g., rectangular) shape in a plan view, but the invention is not limited thereto. The first holes H1 may have a different planar shape from the second holes H2. In an embodiment, the first holes H1 may have a non-tetragonal polygonal shape in a plan view, and the second holes H2 may have a quadrangular (e.g., rectangular) shape in a plan view. In another embodiment, the first holes H1 may have a quadrangular (e.g., rectangular) shape in a plan view, and the second holes H2 may have a rhombus shape in a plan view.

The second holes H2 may have a different size from that of the first holes H1. That is, the second holes H2 may have a larger size than that of the first holes H1. In an embodiment, the first holes H1 may have a size of several micrometers to several hundreds of micrometers.

The maximum length of each first hole H1 in the first direction (or the X-axis direction) may be defined as "a", and the minimum distance between neighboring first holes H1 in the first direction (or the X-axis direction) may be defined as "c". Also, the maximum length of each first hole H1 in the second direction (or the Y-axis direction) may be defined as "b", and the minimum distance between neighboring second holes H2 in the second direction (or the Y-axis direction) may be defined as "d".

When the maximum length a of each first hole H1 in the first direction (or the X-axis direction) is greater than the minimum distance c between the neighboring first holes H1 in the first direction (or the X-axis direction), the size of a region in the display area DA in which pixels are arranged may be considerably reduced due to the first holes H1. Thus, the maximum length a between the neighboring first holes H1 in the first direction (or the X-axis direction) may be smaller than the minimum distance c between the neighboring first holes H1 in the first direction (or the X-axis direction).

Also, when the maximum length b between the neighboring first holes H1 in the second direction (or the Y-axis direction) is greater than the minimum distance d between the neighboring second holes H2 in the second direction (or the Y-axis direction), the size of the region in the display area DA in which the pixels are arranged may be considerably reduced due to the first holes H1. Thus, the maximum length b between the neighboring first holes H1 in the second direction (or the Y-axis direction) may be smaller than the minimum distance d between the neighboring second holes H2 in the second direction (or the Y-axis direction).

The maximum length a of each first hole H1 in the first direction (or the X-axis direction) may be different from the maximum length b of each first hole H1 in the second direction (or the Y-axis direction), but the invention is not limited thereto. In an alternative embodiment, the maximum length a of each first hole H1 in the first direction (or the X-axis direction) may be substantially the same as the maximum length b of each first hole H1 in the second direction (or the Y-axis direction).

The minimum distance c between the neighboring first holes H1 in the first direction (or the X-axis direction) may be different from the minimum distance d between the neighboring second holes H2 in the second direction (or the Y-axis direction), but the invention is not limited thereto. In an alternative embodiment, the minimum distance c between the neighboring first holes H1 in the first direction (or the X-axis direction) may be substantially the same as the minimum distance d between the neighboring second holes H2 in the second direction (or the Y-axis direction).

Also, the maximum length of each second hole H2 in the first direction (or the X-axis direction) and the minimum distance between the neighboring second holes H2 in the first direction (or the X-axis direction) may be defined as "e×(a+c)" where e is a positive integer. Also, the maximum length of each second hole H2 in the second direction (or the Y-axis direction) and the minimum distance between the neighboring second holes H2 in the second direction (or the Y-axis direction) may be defined as "f×(b+d)" where f is a positive integer. FIGS. 2 and 3 illustrate an embodiment in which e and f are both 1.

That is, the length, in the first direction (or the X-axis direction), of the second holes H2 and the minimum distance between the neighboring second holes H2 in the first direction (or the X-axis direction) may both be defined as the sum of the maximum length a of each first hole H1 in the first direction (or the X-axis direction) and the minimum distance c between the neighboring first holes H1 in the first direction (or the X-axis direction), i.e., (a+c). Also, the length, in the second direction (or the Y-axis direction), of the second holes H2 and the minimum distance between the neighboring second holes H2 in the second direction (or the Y-axis direction) may both be defined as the sum of the maximum length b of each second hole H2 in the second direction (or the Y-axis direction) and the minimum distance d between the neighboring second holes H2 in the second direction (or the Y-axis direction), i.e., (b+d).

In this case, each of the second holes H2 can overlap with at least one first hole H1 in the third direction (or the Z-axis direction) without the need to align the display panel 100 in which is the first holes H1 are defined and the first panel bottom member 400 in which the second holes H2 are defined.

FIG. 3 illustrates that each of the second holes H2 overlaps with one first hole H1. In an embodiment, each of the second holes H2 may overlap with one of four first holes H1 that form a 2×2 matrix, but not with the other three first holes H1 among the four first holes H1. In this embodiment, each of the second holes H2 may overlap an entirety of the first hole H1 that they overlap with.

As illustrated in FIGS. 2 and 3, each of the second holes H2 may overlap with at least one first hole H1 in the third direction (or the Z-axis direction). Thus, even when the first and second sound generating devices 20 and 30 are disposed at the rear of the display device 10, the first and second sounds SOD1 and SOD2 from the first and second sound generating devices 20 and 30 may be output to the front of the display device 10 sequentially through the second holes H2 of the first panel bottom member 400 and the first holes H1 of the display panel 100 without being blocked by the display panel 100 and the first panel bottom member 400. Accordingly, even when the first and second sound generating devices 20 and 30 are disposed at the rear of the display device 10, sound with a sense of presence may be provided.

Figure 4:
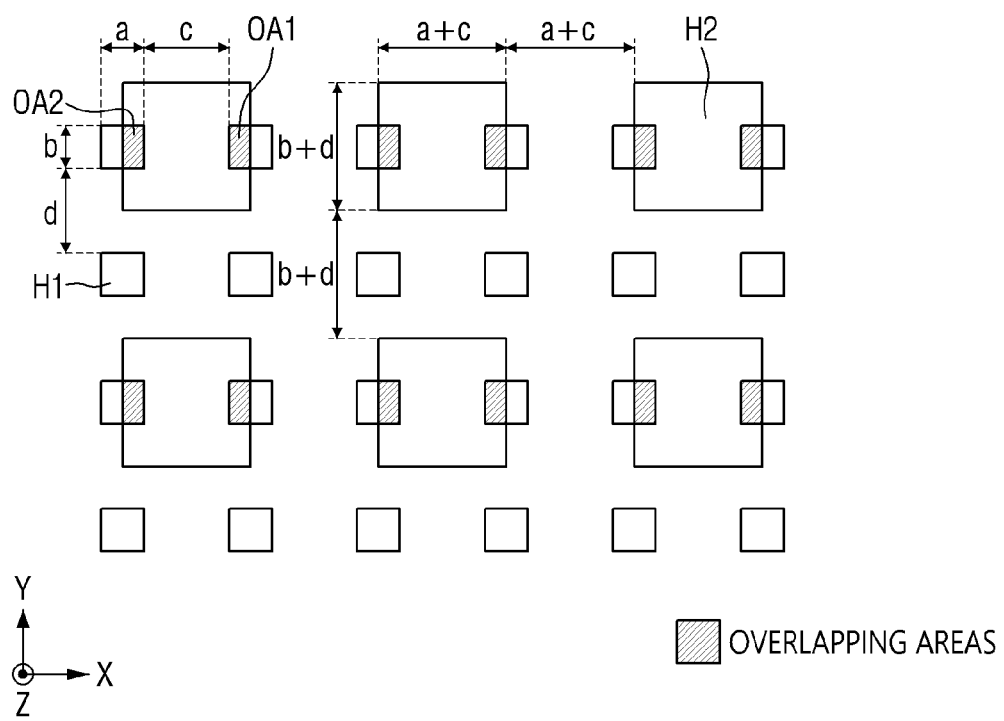
FIG. 4 illustrates the overlapping areas of the first holes of the display panel of FIG. 2 and the second holes of the first panel bottom member of FIG. 2.

FIG. 4 illustrates the overlapping areas of the first holes of the display panel of FIG. 2 and the second holes of the first panel bottom member of FIG. 2.

The embodiment of FIG. 4 differs from the embodiment of FIG. 3 in that each of the second holes H2 overlaps with two first holes H1. The embodiment of FIG. 4 will hereinafter be described, focusing mainly on the differences with the embodiment of FIG. 3.

Referring to FIG. 4, a second hole H2 may overlap with a row of first holes H1 among four first holes H1 that form a 2×2 matrix, but not with the other row of first holes H1 among the four first holes H1. An overlapping area OA1 of the second hole H2 and one of two first holes H1 that the second hole H2 overlaps with may be different from an overlapping area OA2 of the second hole H2 and the other first hole H1, but the invention is not limited thereto. In an alternative embodiment, the overlapping area OA1 may be substantially the same as the overlapping area OA2.

Figure 5:
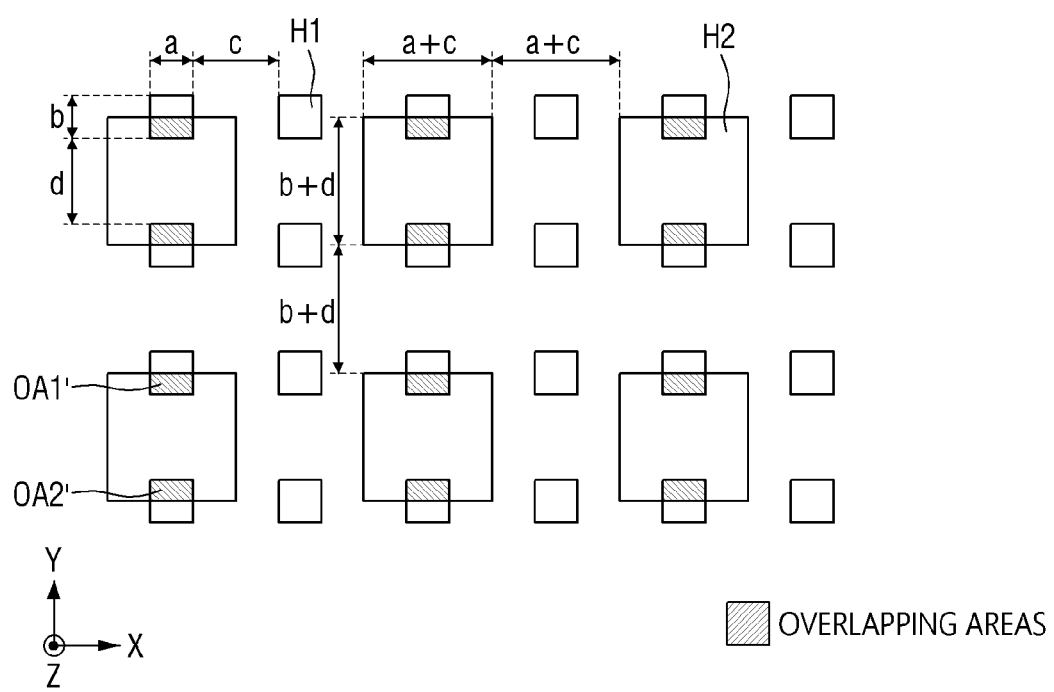
FIG. 5 illustrates the overlapping areas of the first holes of the display panel of FIG. 2 and the second holes of the first panel bottom member of FIG. 2.

FIG. 5 illustrates the overlapping areas of the first holes of the display panel of FIG. 2 and the second holes of the first panel bottom member of FIG. 2.

The embodiment of FIG. 5 differs from the embodiment of FIG. 3 in that each of the second holes H2 overlaps with two first holes H1. The embodiment of FIG. 5 will hereinafter be described, focusing mainly on the differences with the embodiment of FIG. 3.

Referring to FIG. 5, a second hole H2 may overlap with a column of first holes H1 among four first holes H1 that form a 2×2 matrix, but not with the other column of first holes H1 among the four first holes H1. An overlapping area OA1' of the second hole H2 and one of two first holes H1 that the second hole H2 overlaps with may be different from an overlapping area OA2' of the second hole H2 and the other first hole H1, but the invention is not limited thereto. In an alternative embodiment, the overlapping area OA1' may be substantially the same as the overlapping area OA2'.

Figure 6:
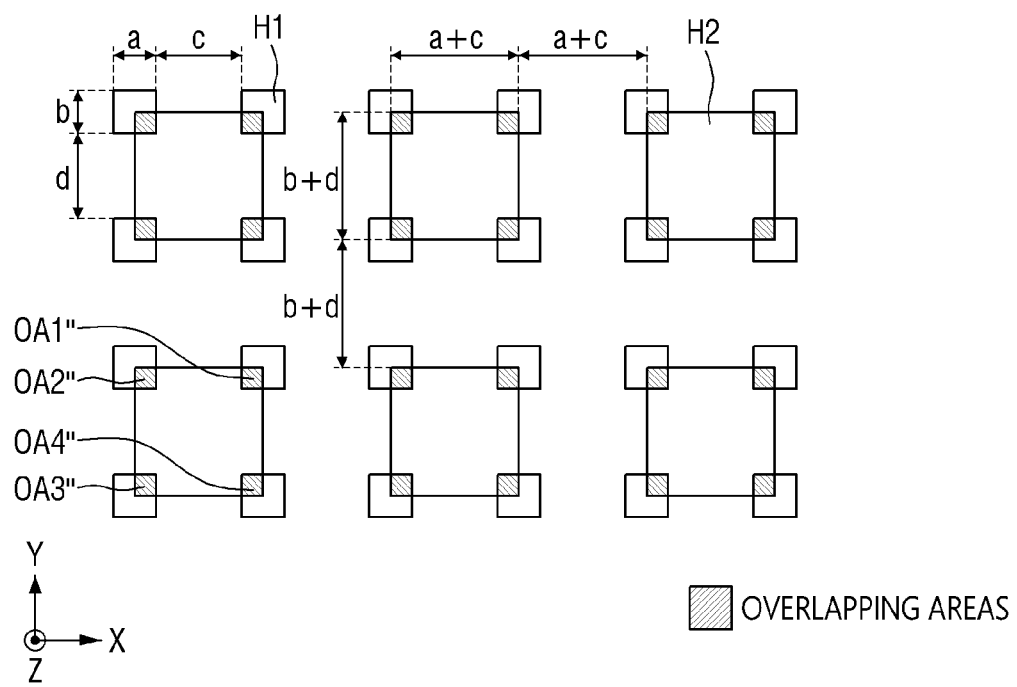
FIG. 6 illustrates the overlapping areas of the first holes of the display panel of FIG. 2 and the second holes of the first panel bottom member of FIG. 2.

FIG. 6 illustrates the overlapping areas of the first holes of the display panel of FIG. 2 and the second holes of the first panel bottom member of FIG. 2.

The embodiment of FIG. 6 differs from the embodiment of FIG. 3 in that each of the second holes H2 overlaps with four first holes H1. The embodiment of FIG. 6 will hereinafter be described, focusing mainly on the differences with the embodiment of FIG. 3.

Referring to FIG. 6, a second hole H2 may overlap with all four first holes H1 that form a 2×2 matrix. Each of the first holes H1 of the display panel 100 may overlap with one of the second holes H2.

Overlapping areas OA1", OA2", OA3", and OA4" of the second hole H2 and the four first holes H1 that the second hole H2 overlaps with may all be different, but the invention is not limited thereto. In an alternative embodiment, the overlapping areas OA1", OA2", OA3", and OA4" may be substantially the same.

Figure 8:
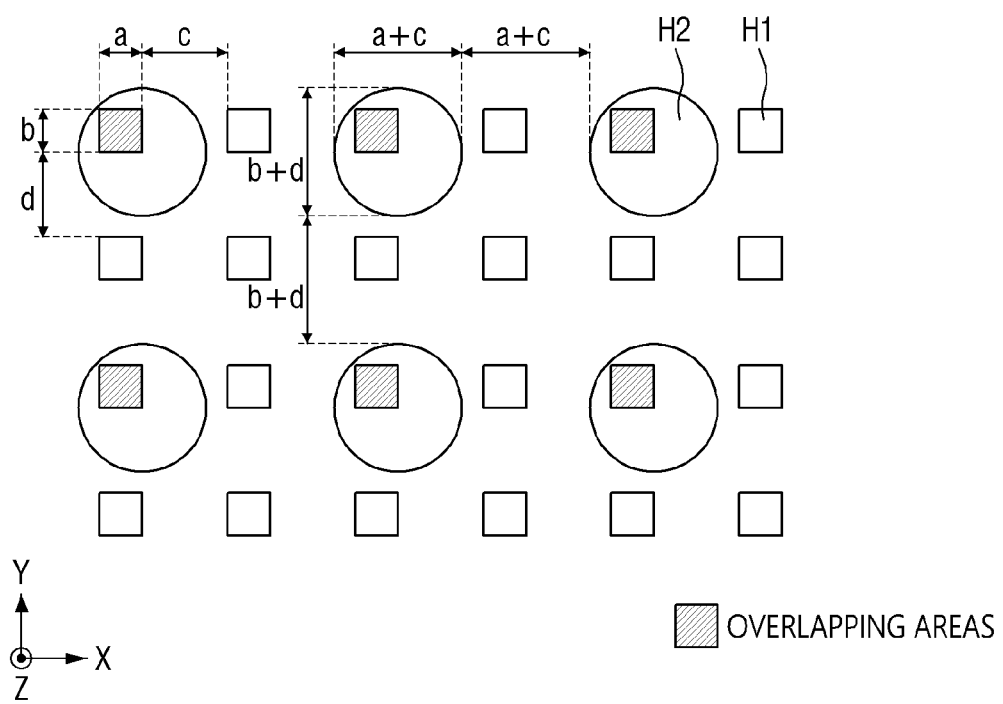
FIG. 8 illustrates the overlapping areas of the first holes of the display panel of FIG. 7 and the second holes of the first panel bottom member of FIG. 7.

FIG. 7 is a plan view illustrating another embodiment of first holes of a display panel and second holes of a first panel bottom member according to the invention. FIG. 8 illustrates the overlapping areas of the first holes of the display panel of FIG. 7 and the second holes of the first panel bottom member of FIG. 7.

The embodiment of FIGS. 7 and 8 is substantially the same as the embodiment of FIGS. 2 and 3, except that second holes H2 have a circular shape in a plan view, and thus, a detailed description of the embodiment of FIGS. 7 and 8 will be omitted.

FIG. 8 illustrates that each of the second holes H2 overlaps with one first hole H1, but the invention is not limited thereto. In an alternative embodiment, each of the second holes H2 may overlap with two or more first holes H1.

Figure 10:
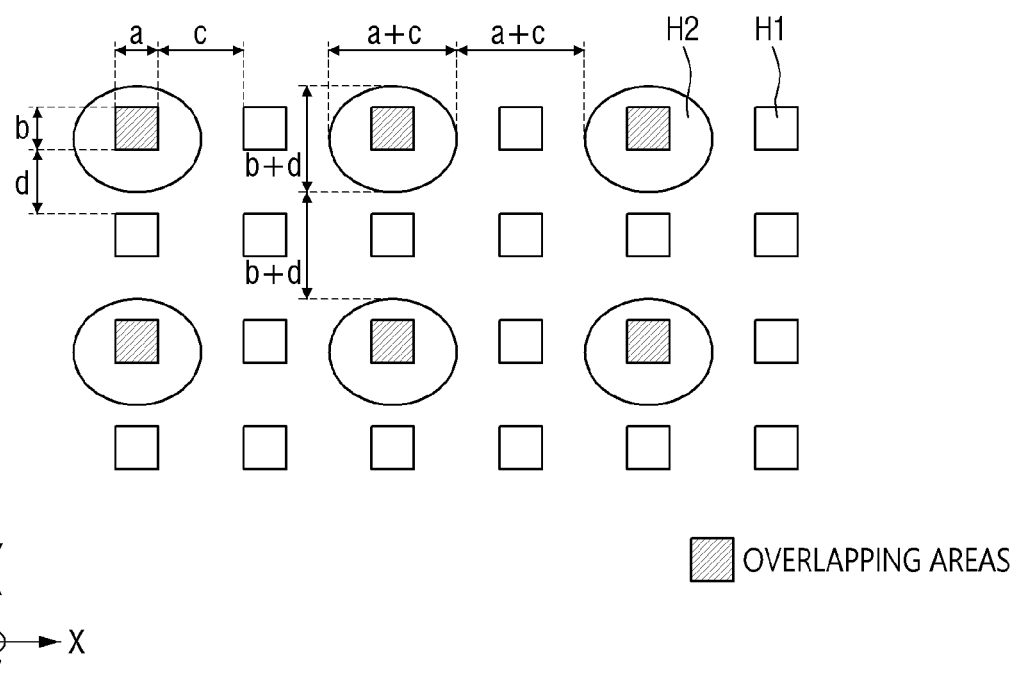
FIG. 10 illustrates the overlapping areas of the first holes of the display panel of FIG. 9 and the second holes of the first panel bottom member of FIG. 9.

FIG. 9 is a plan view illustrating another embodiment of first holes of a display panel and second holes of a first panel bottom member according to the invention. FIG. 10 illustrates the overlapping areas of the first holes of the display panel of FIG. 9 and the second holes of the first panel bottom member of FIG. 9.

The embodiment of FIGS. 9 and 10 is substantially the same as the embodiment of FIGS. 2 and 3, except that second holes H2 have an elliptical shape in a plan view, and thus, a detailed description of the embodiment of FIGS. 9 and 10 will be omitted.

FIG. 10 illustrates an embodiment that each of the second holes H2 overlaps with one first hole H1, but the invention is not limited thereto. In an alternative embodiment, each of the second holes H2 may overlap with two or more first holes H1.

Figure 12:
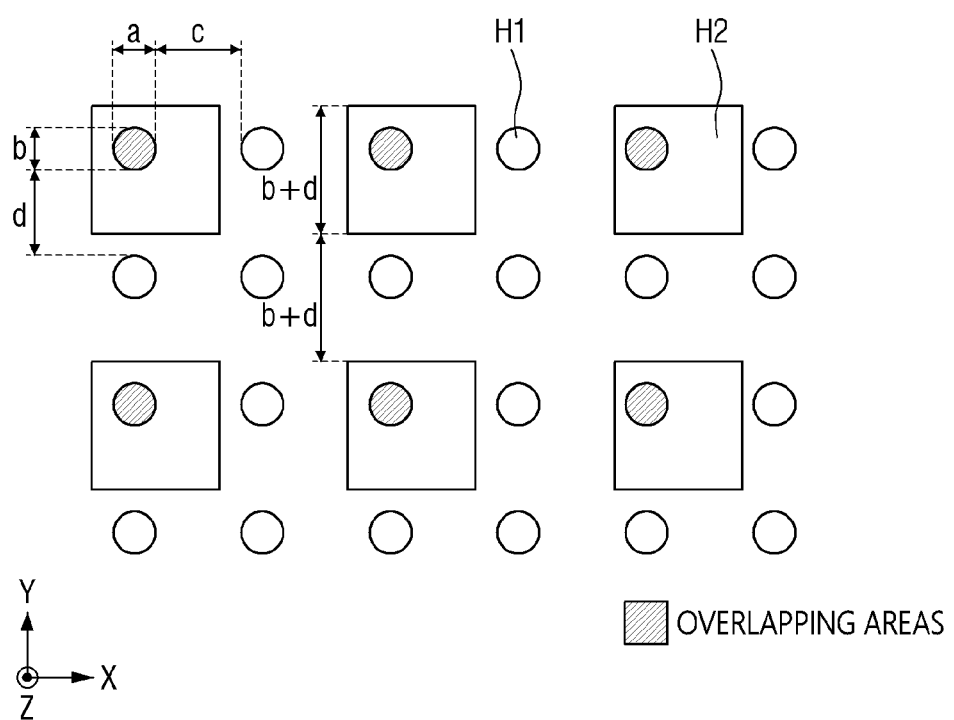
FIG. 12 illustrates the overlapping areas of the first holes of the display panel of FIG. 11 and the second holes of the first panel bottom member of FIG. 11.

FIG. 11 is a plan view illustrating another embodiment of first holes of a display panel and second holes of a first panel bottom member according to the invention. FIG. 12 illustrates the overlapping areas of the first holes of the display panel of FIG. 11 and the second holes of the first panel bottom member of FIG. 11.

The embodiment of FIGS. 11 and 12 is substantially the same as the embodiment of FIGS. 2 and 3, except that first holes H1 have a circular shape in a plan view, and thus, a detailed description of the embodiment of FIGS. 11 and 12 will be omitted.

FIG. 12 illustrates that each of the second holes H2 overlaps with one first hole H1, but the invention is not limited thereto. In an alternative embodiment, each of the second holes H2 may overlap with two or more first holes H1.

Figure 14:
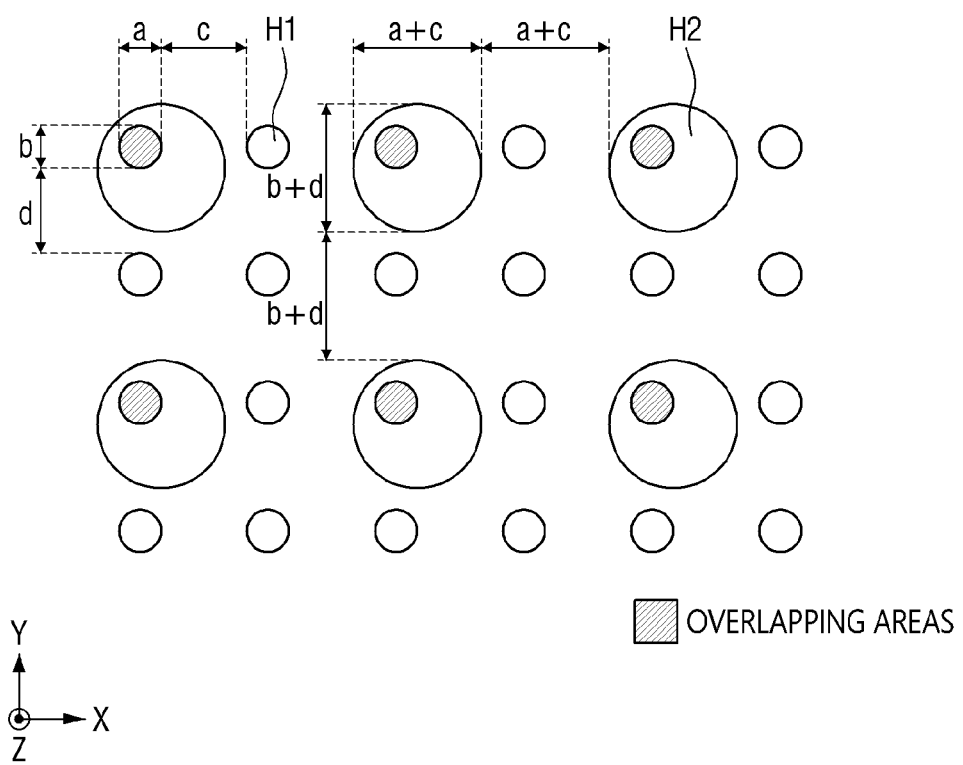
FIG. 14 illustrates the overlapping areas of the first holes of the display panel of FIG. 13 and the second holes of the first panel bottom member of FIG. 13.

FIG. 13 is a plan view illustrating another embodiment of first holes of a display panel and second holes of a first panel bottom member according to the invention. FIG. 14 illustrates the overlapping areas of the first holes of the display panel of FIG. 13 and the second holes of the first panel bottom member of FIG. 13.

The embodiment of FIGS. 13 and 14 is substantially the same as the embodiment of FIGS. 2 and 3, except that first holes H1 and second holes H2 have a circular shape in a plan view, and thus, a detailed description of the embodiment of FIGS. 13 and 14 will be omitted.

FIG. 14 illustrates an embodiment of that each of the second holes H2 overlaps with one first hole H1, but the invention is not limited thereto. In an alternative embodiment, each of the second holes H2 may overlap with two or more first holes H1.

Figure 16:
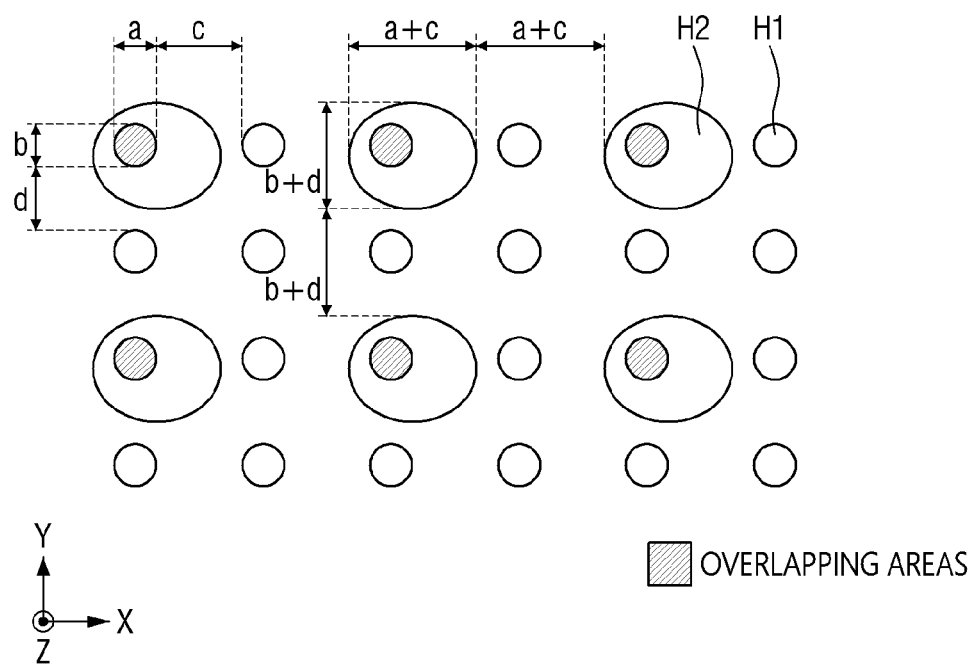
FIG. 16 illustrates the overlapping areas of the first holes of the display panel of FIG. 15 and the second holes of the first panel bottom member of FIG. 15.

FIG. 15 is a plan view illustrating another embodiment of first holes of a display panel and second holes of a first panel bottom member according to the invention. FIG. 16 illustrates the overlapping areas of the first holes of the display panel of FIG. 15 and the second holes of the first panel bottom member of FIG. 15.

The embodiment of FIGS. 15 and 16 is substantially the same as the embodiment of FIGS. 2 and 3, except that first holes H1 and second holes H2 have a circular shape and an elliptical shape, respectively, in a plan view, and thus, a detailed description of the embodiment of FIGS. 15 and 16 will be omitted.

FIG. 16 illustrates that each of the second holes H2 overlaps with one first hole H1, but the invention is not limited thereto. In an alternative embodiment, each of the second holes H2 may overlap with two or more first holes H1.

Figure 18:
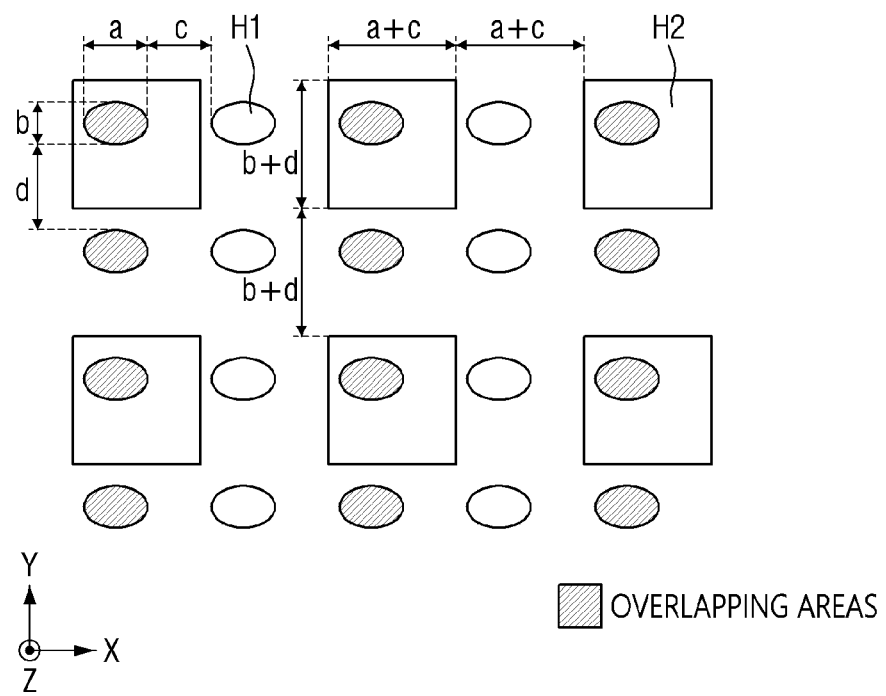
FIG. 18 illustrates the overlapping areas of the first holes of the display panel of FIG. 17 and the second holes of the first panel bottom member of FIG. 17.

FIG. 17 is a plan view illustrating another embodiment of first holes of a display panel and second holes of a first panel bottom member according to the invention. FIG. 18 illustrates the overlapping areas of the first holes of the display panel of FIG. 17 and the second holes of the first panel bottom member of FIG. 17.

The embodiment of FIGS. 17 and 18 is substantially the same as the embodiment of FIGS. 2 and 3, except that first holes H1 have an elliptical shape in a plan view, and thus, a detailed description of the embodiment of FIGS. 17 and 18 will be omitted.

FIG. 18 illustrates that each of the second holes H2 overlaps with one first hole H1, but the invention is not limited thereto. In an alternative embodiment, each of the second holes H2 may overlap with two or more first holes H1.

Figure 20:
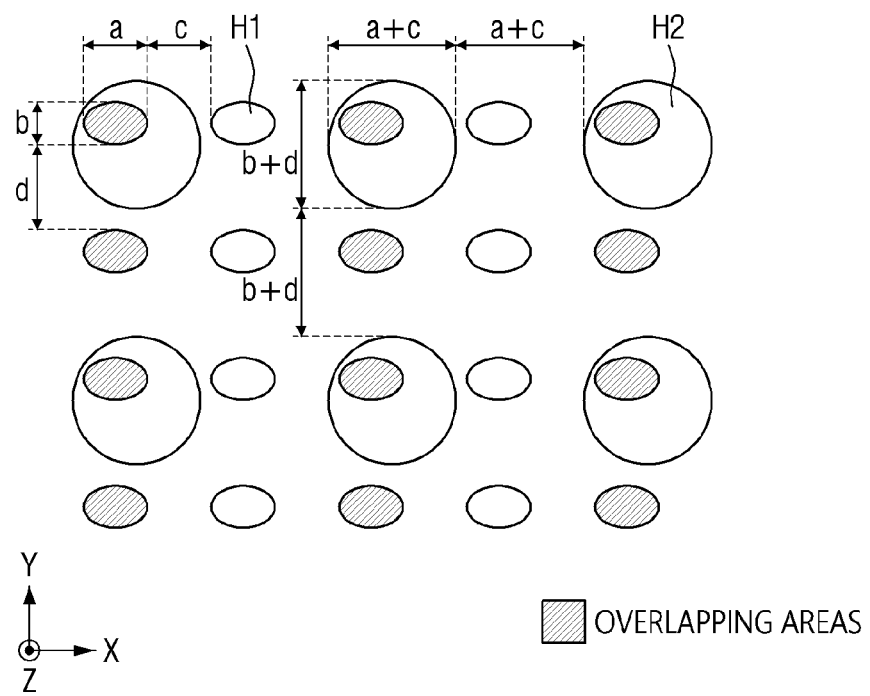
FIG. 20 illustrates the overlapping areas of the first holes of the display panel of FIG. 19 and the second holes of the first panel bottom member of FIG. 19.

FIG. 19 is a plan view illustrating another embodiment of first holes of a display panel and second holes of a first panel bottom member according to the invention. FIG. 20 illustrates the overlapping areas of the first holes of the display panel of FIG. 19 and the second holes of the first panel bottom member of FIG. 19.

The embodiment of FIGS. 19 and 20 is substantially the same as the embodiment of FIGS. 2 and 3, except that first holes H1 and second holes H2 have an elliptical shape and a circular shape, respectively, in a plan view, and thus, a detailed description of the embodiment of FIGS. 19 and 20 will be omitted.

FIG. 20 illustrates that each of the second holes H2 overlaps with one first hole H1, but the invention is not limited thereto. In an alternative embodiment, each of the second holes H2 may overlap with two or more first holes H1.

Figure 22:
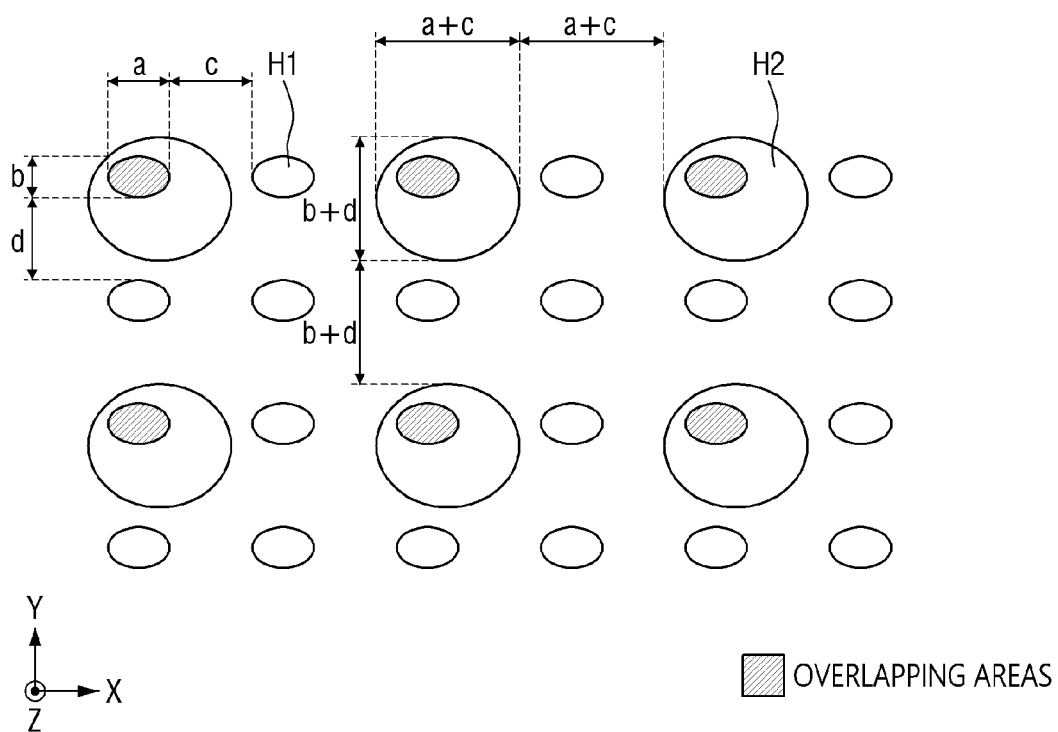
FIG. 22 illustrates the overlapping areas of the first holes of the display panel of FIG. 21 and the second holes of the first panel bottom member of FIG. 21.

FIG. 21 is a plan view illustrating another embodiment of first holes of a display panel and second holes of a first panel bottom member according to the invention. FIG. 22 illustrates the overlapping areas of the first holes of the display panel of FIG. 21 and the second holes of the first panel bottom member of FIG. 21.

The embodiment of FIGS. 21 and 22 is substantially the same as the embodiment of FIGS. 2 and 3, except that first holes H1 and second holes H2 have an elliptical shape in a plan view, and thus, a detailed description of the embodiment of FIGS. 21 and 22 will be omitted.

The first holes H1 may have a different elliptical shape from the second holes H2. In an embodiment, the long-axis length of the first holes H1 may be different from the long-axis length of the second holes H2, or the short-axis length of the first holes H1 may be different from the short-axis length of the second holes H2.

FIG. 22 illustrates that each of the second holes H2 overlaps with one first hole H1, but the invention is not limited thereto. In an alternative embodiment, each of the second holes H2 may overlap with two or more first holes H1.

FIGS. 2 through 22 illustrate that the first holes H1 and the second holes H2 have a polygonal, circular, or elliptical shape in a plan view, but the planar shapes of the first holes H1 and the second holes H2 may vary.

Figure 23A:
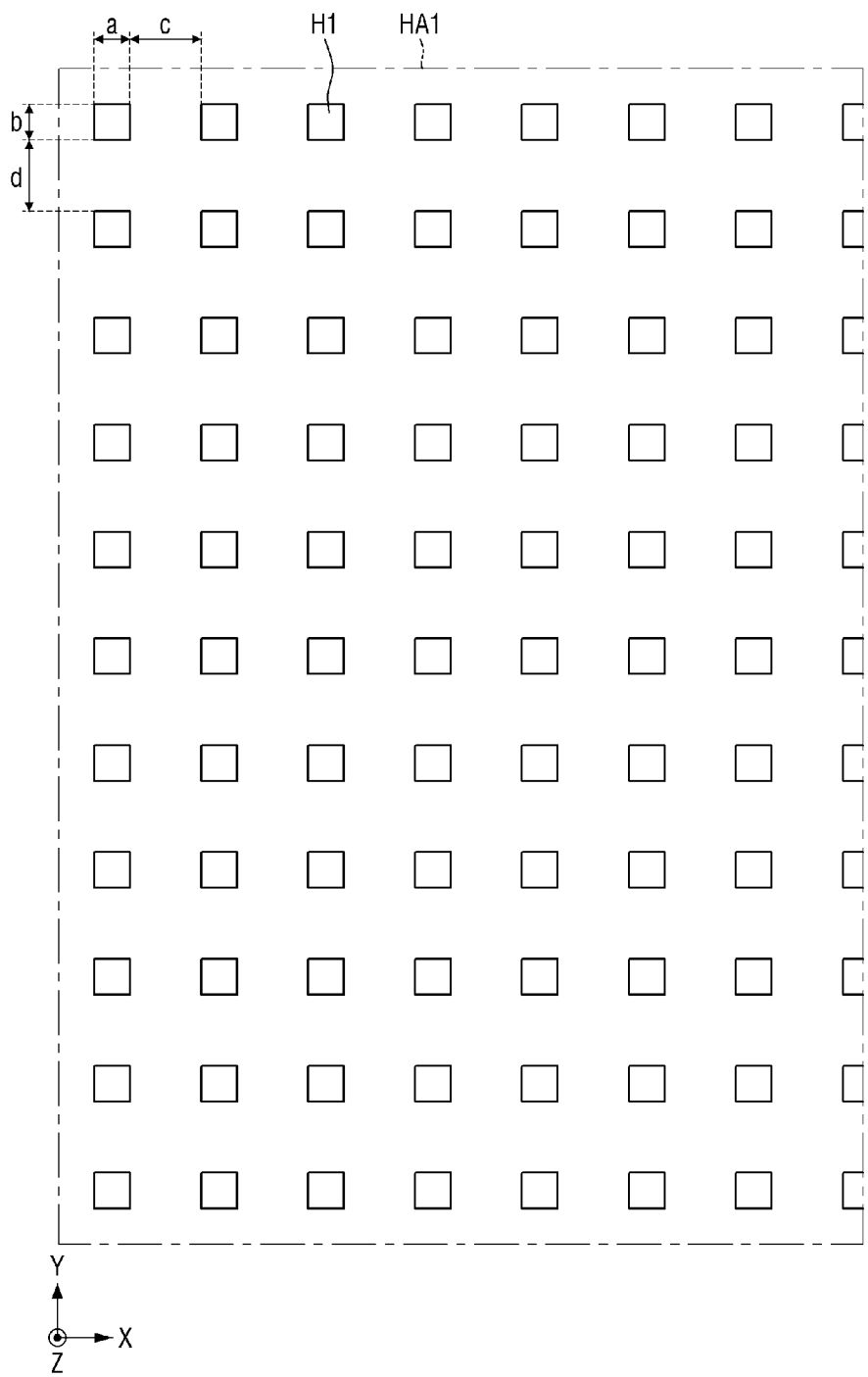
FIG. 23A is a plan view illustrating views illustrating another embodiment of first holes of a display panel according to the invention.
Figure 23B:
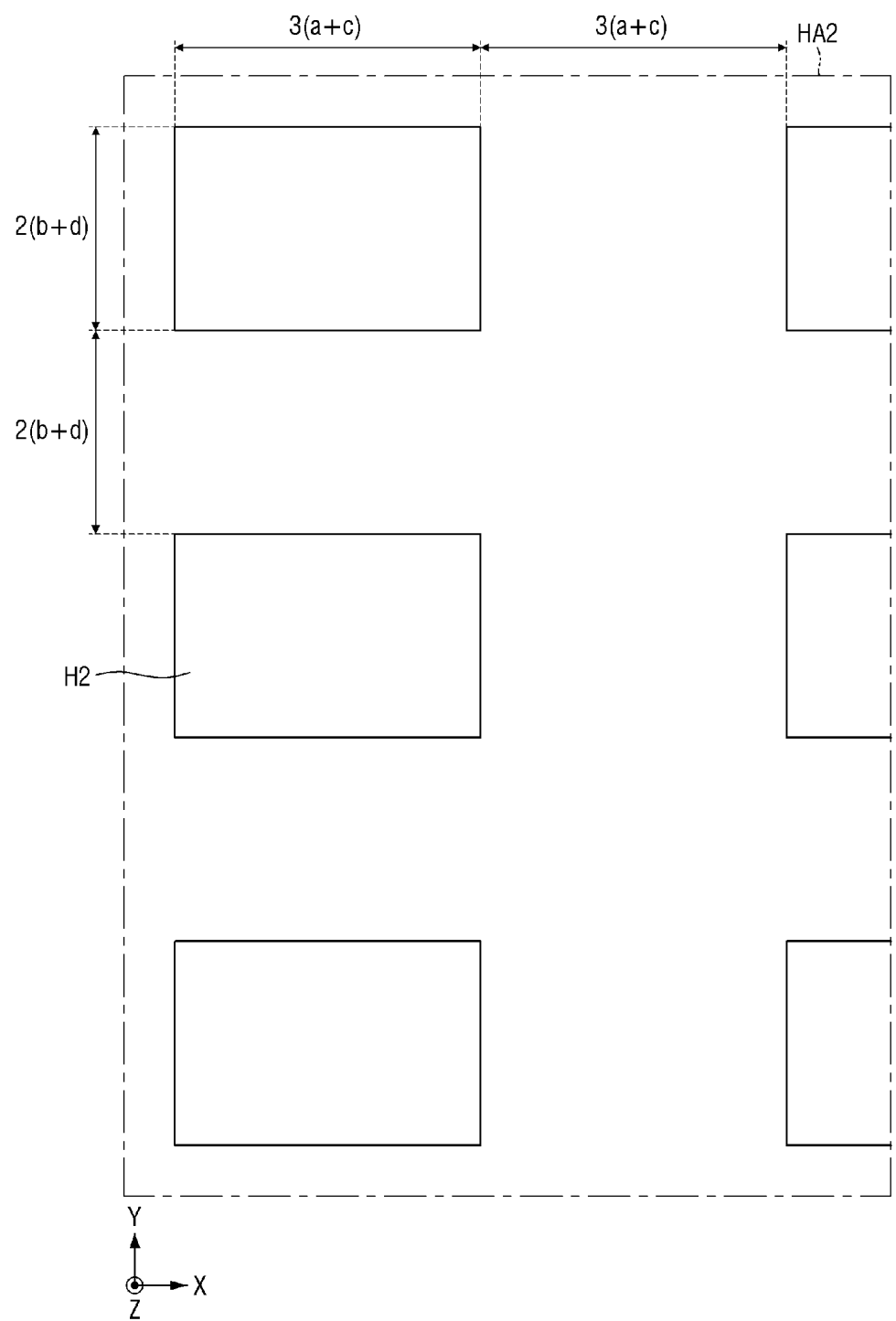
FIG. 23B is a plan view illustrating another embodiment of second holes of a first panel bottom member according to the invention.
Figure 24:
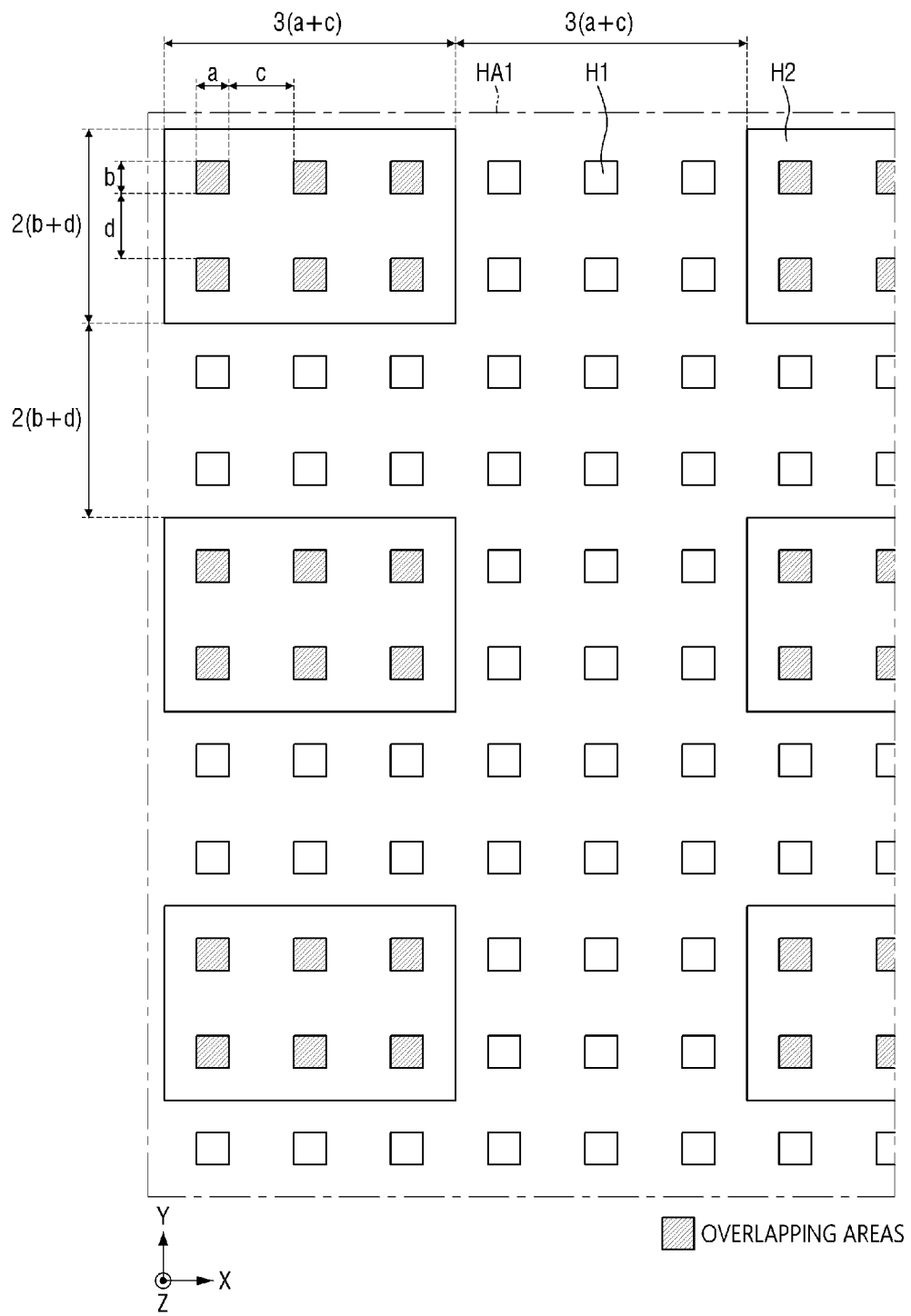
FIG. 24 illustrates the overlapping areas of the first holes of the display panel of FIG. 23A and the second holes of the first panel bottom member of FIG. 23B.

FIG. 23A is a plan view illustrating views illustrating another embodiment of first holes of a display panel according to the invention, and FIG. 23B is a plan view illustrating another embodiment of second holes of a first panel bottom member according to the invention. FIG. 24 illustrates the overlapping areas of the first holes of the display panel of FIG. 23A and the second holes of the first panel bottom member of FIG. 23B.

The embodiment of FIGS. 23A, 23B, and 24 differs from the embodiment of FIGS. 2 and 3 in that the maximum length of each second hole H2 in the second direction (or the Y-axis direction)maximum length of each second hole H2 in the first direction (or the X-axis direction) and the minimum distance between the neighboring second holes H2 in the first direction (or the X-axis direction) are both 3×(a+c), and that the maximum length of each second hole H2 in the second direction (or the Y-axis direction) and the minimum distance between the neighboring second holes H2 in the second direction (or the Y-axis direction) are both 2×(b+d). The embodiment of FIGS. 23A, 23B, and 24 will hereinafter be described, focusing mainly on the differences with the embodiment of FIGS. 2 and 3.

Referring to FIGS. 23A, 23B, and 24, the maximum length of each second hole H2 in the first direction (or the X-axis direction) and the minimum distance between the neighboring second holes H2 in the first direction (or the X-axis direction) may be three times the sum of a maximum length a of each first hole H1 in the first direction (or the X-axis direction) and a minimum distance c between the neighboring first holes H1 in the first direction (or the X-axis direction), i.e., 3×(a+c), and the maximum length of each second hole H2 in the second direction (or the Y-axis direction) and the minimum distance between the neighboring second holes H2 in the second direction (or the Y-axis direction) may be two times the sum of a maximum length b of each second hole H2 in the second direction (or the Y-axis direction) and a minimum distance d between the neighboring second holes H2 in the second direction (or the Y-axis direction), i.e., 2×(b+d). In this case, each of the second holes H2 may overlap with at least six first holes H1 in a third direction (or a Z-axis direction) without the need to align a display panel 100 in which the first holes H1 are defined and a first panel bottom member 400 in which the second holes H2 are defined.

In an embodiment, each of the second holes H2 may overlap with six first holes H1 among twenty four first holes H1 that form a 6×4 matrix, but not with the other first holes H1 among the twenty four first holes H1. In this embodiment, each of the second holes H2 may overlap an entirety of the six first holes H1.

In another embodiment, each of the second holes H2 may overlap with nine first holes H1 among twenty four first holes H1 that form a 6×4 matrix, but not with the other first holes H1 among the twenty four first holes H1. In this embodiment, each of the second holes H2 may overlap an entirety of three of the nine first holes H1 and partially with six of the nine first holes H1.

In yet another example, each of the second holes H2 may overlap with twelve first holes H1 among twenty four first holes H1 that form a 6×4 matrix, but not with the other first holes H1 among the twenty four first holes H1. In this embodiment, each of the second holes H2 may overlap an entirety of six of the twelve first holes H1 and partially with six of the twelve first holes H1.

Figure 25:
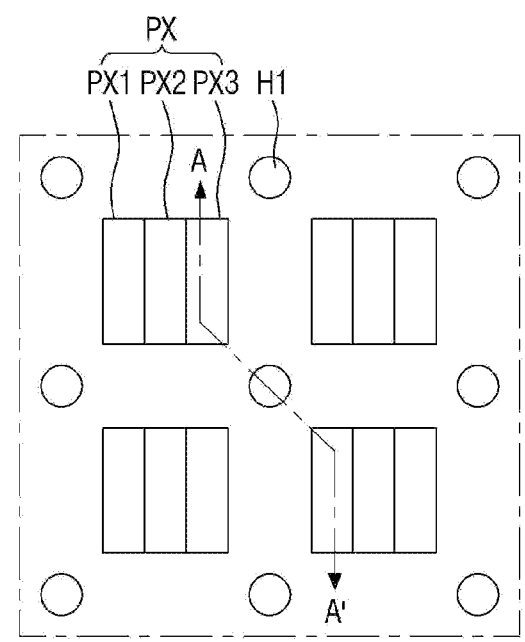
FIG. 25 is a plan view illustrating another embodiment of pixels and first holes of a display panel according to the invention.

FIG. 25 is a plan view illustrating another embodiment of pixels and first holes of a display panel according to the invention. FIG. 25 illustrates pixels PX and the first holes H1 in the display area DA of the display panel 100 of FIG. 1A.

Referring to FIG. 25, the pixels PX may be arranged in the first direction (or the X-axis direction) and the second direction (or the Y-axis direction). That is, the pixels PX may be arranged in a matrix form.

The first holes H1 may be arranged in the first direction (or the X-axis direction) and the second direction (or the Y-axis direction). That is, the first holes H1 may be arranged in a matrix form.

The first holes H1 may not overlap with the pixels PX in the first direction (or the X-axis direction). The first holes H1 may not overlap with the pixels PX in the second direction (or the Y-axis direction). Each of the first holes H1 may be disposed between a pair of adjacent pixels PX in a diagonal direction DRA or DRB. In an embodiment, each of the first holes H1 may be disposed between a pair of adjacent pixels PX in the direction DRA, which is at an inclination angle of about 43 degrees with respect to the first direction (or the X-axis direction) or between a pair of adjacent pixels in the direction DRB, which is between the second direction (or the Y-axis direction) and an opposite direction of the first direction (or the X-axis direction).

FIG. 25 illustrates that the first holes H1 have a circular shape in a plan view, but the planar shape of the first holes H1 is not particularly limited.

Each of the pixels PX may include a plurality of subpixels. FIG. 25 illustrates that each of the pixels PX includes three subpixels, i.e., first, second, and third subpixels PX1, PX2, and PX3, but the number of subpixels included in each of the pixels PX is not particularly limited. In an alternative embodiment, each of the pixels PX may include four or more subpixels.

The subpixels of each of the pixels PX may be arranged in the first direction (or the X-axis direction). That is, first, second, and third subpixels PX1, PX2, and PX3 may be sequentially arranged in the first direction (or the X-axis direction).

A first subpixel PX1 refers to a minimal unit of emitting light of a first color, a second subpixel PX2 refers to a minimal unit of emitting light of a second color, and a third subpixel PX3 refers to a minimal unit of emitting light of a third color. In an embodiment, the first, second, and third colors may be red, green, and blue, respectively, for example. In an embodiment, the first-color light may be red light having a central wavelength of 600 nanometers (nm) to 750 nm, the second-color light may be green light having a central wavelength of 480 nm to 560 nm, and the third-color light may be blue light having a central wavelength of 370 nm to 490 nm.

Figure 26A:
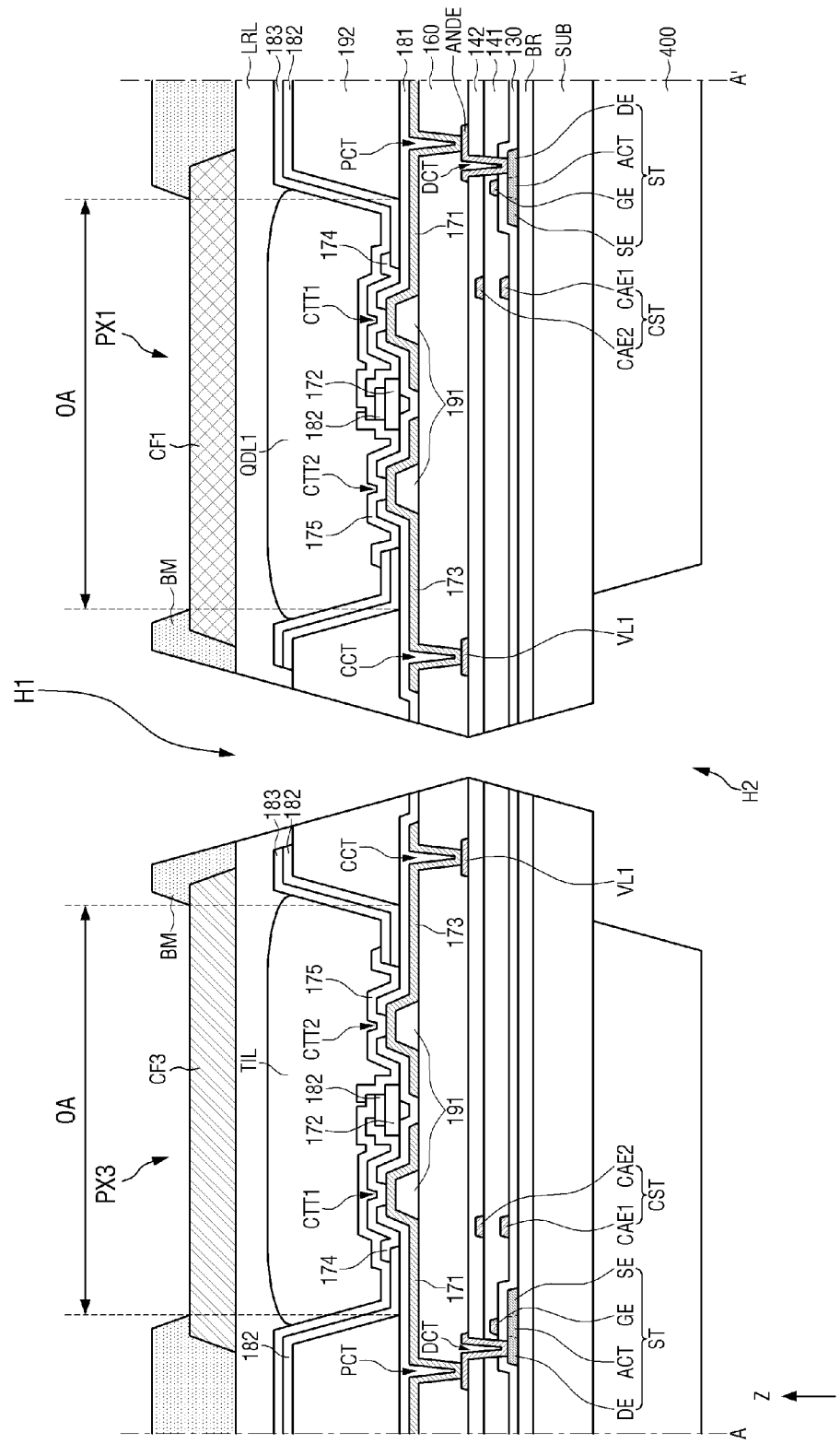
FIGS. 26A and 26B are cross-sectional views taken along line A-A' of FIG. 25.

FIG. 26A is a cross-sectional view taken along line A-A' of FIG. 25.

Referring to FIG. 26A, each of subpixels PX1, PX2, and PX3 may include at least one thin-film transistor ST, at least one capacitor CST, a first electrode 171, light-emitting elements 172, a second electrode 173, a first contact electrode 174, and a second contact electrode 175.

A substrate SUB may include an insulating material such as glass or quartz. The substrate SUB may be a rigid substrate.

A barrier film BR may be disposed on a first surface of the substrate SUB. The barrier film BR is a film for protecting the thin-film transistor ST from moisture that may infiltrate into the substrate SUB, which is susceptible to moisture. The barrier film BR may include a plurality of inorganic films that are alternately stacked. In an embodiment, the barrier film BR may be provided as a multifilm in which inorganic films including at least one of silicon oxide ($SiO_x$), silicon nitride ($SiN_x$), and silicon oxynitride (SiON) are alternately stacked.

A semiconductor layer including an active layer ACT, a source electrode SE, and a drain electrode DE of the thin-film transistor ST may be disposed on the barrier film BR. In an embodiment, the semiconductor layer may include polycrystalline silicon, monocrystalline silicon, low-temperature polycrystalline silicon, amorphous silicon, or an oxide semiconductor. The source electrode SE and the drain electrode DE may be obtained by doping a silicon semiconductor or an oxide semiconductor with ions or impurities and may thus have conductivity. The active layer ACT may overlap with a gate electrode GE of the thin-film transistor ST in the third direction (or the Z-axis direction), and the source electrode SE and the drain electrode DE may not overlap with the gate electrode GE in the third direction (or the Z-axis direction).

A gate insulating film 130 may be disposed on the active layer ACT, the source electrode SE, and the drain electrode DE. The gate insulating film 130 may include an inorganic film such as, for example, a film of silicon oxide ($SiO_x$), silicon nitride ($SiN_x$), or silicon oxynitride (SiON).

A first gate conductive layer including the gate electrode GE of the thin-film transistor ST and a first capacitor electrode CAE1 of the capacitor CST may be disposed on the gate insulating film 130. The gate electrode GE may overlap with the active layer ACT in the third direction (or the Z-axis direction). In an embodiment, the first gate conductive layer may be provided as a single film or a multifilm including molybdenum (Mo), aluminum (Al), chromium (Cr), gold (Au), titanium (Ti), nickel (Ni), neodymium (Nd), copper (Cu), or an alloy thereof.

A first inter-insulating film 141 may be disposed on the gate electrode GE and the first capacitor electrode CAE1. In an embodiment, the first inter-insulating film 141 may include an inorganic film such as, for example, a film of $SiO_x$, $SiN_x$, or SiON.

A second gate conductive layer including a second capacitor electrode CAE2 of the capacitor CST may be disposed on the first inter-insulating film 141. As the first inter-insulating film 141 has a predetermined dielectric constant, the capacitor CST may be provided by the first capacitor electrode CAE1, the second capacitor electrode CAE2, and the first inter-insulating film 141. In an embodiment, the second capacitor electrode CAE2 may be provided as a single film or a multifilm including Mo, Al, Cr, Au, Ti, Ni, Nd, Cu, or an alloy thereof.

A second inter-insulating film 142 may be disposed on the second capacitor electrode CAE2. In an embodiment, the second inter-insulating film 142 may include an inorganic film such as, for example, a film of $SiO_x$, $SiN_x$, or SiON.

A data conductive layer including a connecting electrode ANDE and a first power supply line VL1 may be disposed on the second inter-insulating film 142. The connecting electrode ANDE may be connected to the drain electrode DE through a drain contact hole DCT, which penetrates the gate insulating film 130 and the first and second inter-insulating films 141 and 142 to expose the drain electrode DE. FIG. 26A illustrates that the connecting electrode ANDE is connected to the drain electrode DE, but the invention is not limited thereto. In an alternative embodiment, the connecting electrode ANDE may be connected to the source electrode SE through a source contact hole (not illustrated), which penetrates the gate insulating film 130 and the first and second inter-insulating films 141 and 142 to expose the source electrode SE. A first power supply voltage may be applied to the first power supply line VL1. The first power supply line VL1 may extend in the first direction (or the X-axis direction), but the invention is not limited thereto. In an embodiment, the data conductive layer may be provided as a single film or a multifilm including Mo, Al, Cr, Au, Ti, Ni, Nd, Cu, or an alloy thereof.

A planarization film 160, which is for planarization for any height difference provided by the thin-film transistor ST, may be disposed on the connecting electrode ANDE. In an embodiment, the planarization film 160 may be provided as an organic film including an acrylic resin, an epoxy resin, a phenolic resin, a polyamide resin, or a polyimide resin.

The first electrode 171, the second electrode 173, and the inner banks 191 may be disposed on the planarization film 160.

The inner banks 191 may be disposed in an opening OA defined by an outer bank 192. Light-emitting elements 172 may be disposed between a pair of adjacent inner banks 191. Each of the inner banks 191 may have a bottom surface that is in contact with the planarization film 160, a top surface that is opposite to the bottom surface, and side surfaces that are between the top surface and the bottom surface. The inner banks 191 may have a trapezoidal shape in a cross-sectional view, but the invention is not limited thereto.

In an embodiment, the inner banks 191 may be provided as organic films including a photosensitive resin, an acrylic resin, an epoxy resin, a phenolic resin, a polyamide resin, or a polyimide resin. In an embodiment, the inner banks 191 may include a photosensitive resin such as positive photoresist or negative photoresist.

The first and second electrodes 171 and 173 may be disposed on the planarization film 160 and the inner banks 191. The first and second electrodes 171 and 173 may be spaced apart from each other and may be electrically isolated from each other.

The first electrode 171 may be disposed on at least one side surface and the top surface of one of the inner banks 191. The first electrode 171 may be connected to the connecting electrode ANDE through a pixel contact hole PCT, which penetrates the planarization film 160. Accordingly, the first electrode 171 may be electrically connected to the drain electrode DE of the thin-film transistor ST. The pixel contact hole PCT may overlap with the outer bank 192 in the third direction (or the Z-axis direction).

The second electrode 173 may be disposed on at least one side surface and the top surface of one of the inner banks 191. The second electrode 173 may be connected to the first power supply line VL1 through a common contact hole CCT, which penetrates the planarization film 160. The common contact hole CCT may overlap with the outer bank 192 in the third direction (or the Z-axis direction).

The first and second electrodes 171 and 173 may include a conductive material with high reflectance. In an embodiment, the first and second electrodes 171 and 173 may include a metal such as silver (Ag), Cu, or Al. Accordingly, light traveling to the first and second electrodes 171 and 173, among beams of light emitted from the light-emitting elements 172 may be reflected by the first and second electrodes 171 and 173 and may thus travel to the tops of the light-emitting elements 172.

A first insulating film 181 may be disposed on the first and second electrodes 171 and 173. The first insulating film 181 may be disposed on parts of the planarization film 160 that are not covered, but exposed by the first and second electrodes 171 and 173. In an embodiment, the first insulating film 181 may include an inorganic film such as, for example, a film of $SiO_x$, $SiN_x$, or SiON.

The outer bank 192 may be disposed on the first insulating film 181. The outer bank 192 may define the opening OA. The outer bank 192 may not overlap with the inner banks 191. The outer bank 192 may have a bottom surface that is in contact with the first insulating film 181, a top surface that is opposite to the bottom surface, and side surfaces that are between the top surface and the bottom surface. The outer bank 192 may have a trapezoidal shape in a plan view, but the invention is not limited thereto.

In an embodiment, the outer bank 192 may be provided as an organic film including a photosensitive resin, an acrylic resin, an epoxy resin, a phenolic resin, a polyamide resin, or a polyimide resin. In an embodiment, the outer bank 192 may include a photosensitive resin such as positive photoresist or negative photoresist.

The light-emitting elements 172 may be disposed on the first insulating film 181. The light-emitting elements 172 may have a rod, wire, or tube shape. In an embodiment, the light-emitting elements 172 may be provided as cylinders or rods. In another embodiment, the light-emitting elements 172 may have a polyhedral shape such as the shape of a regular cube or a quadrangular (e.g., rectangular) parallelepiped or a polygonal column shape such as the shape of a hexagonal column. In yet another example, the light-emitting elements 172 may have a truncated cone shape that extends in one direction and has a partially inclined outer surface. In an embodiment, the light-emitting elements 172 may have a length of 1 micrometer (μm) to 10 μm or 2 μm to 6 μm, preferably, 3 μm to 5 μm. In an embodiment, the light-emitting elements 172 may have a diameter of 300 nm to 700 nm and may have an aspect ratio of 1.2 to 100.

A second insulating film 182 may be disposed on the light-emitting elements 172. The second insulating film 182 may also be disposed on the outer bank 192. In an embodiment, the second insulating film 182 may include an inorganic film such as, for example, a film of $SiO_x$, $SiN_x$, or SiON.

The first contact electrode 174 may be connected to the first electrode 171 through a first contact hole CCT1, which penetrates the first insulating film 181. The first contact hole CCT1 may overlap with one of the inner banks 191 in the third direction (or the Z-axis direction). The first contact electrode 174 may be in contact with first ends of the light-emitting elements 172. Accordingly, the first ends of the light-emitting elements 172 may be electrically connected to the first electrode 171 via the first contact electrode 174. The first contact electrode 174 may be disposed on the second insulating film 182.

A third insulating film 183 may be disposed on the first contact electrode 174. The third insulating film 183 may cover the first contact electrode 174 to electrically isolate the first and second contact electrodes 174 and 175. The third insulating film 183 may also cover parts of the second insulating film 182 on the outer bank 192. In an embodiment, the third insulating film 183 may include an inorganic film such as, for example, a film of $SiO_x$, $SiN_x$, or SiON.

The second contact electrode 175 may be connected to the second electrode 173 through a second contact hole CCT2, which penetrates the first insulating film 181. The second contact hole CCT2 may overlap with one of the inner banks 191 in the third direction (or the Z-axis direction). The second contact hole CCT2 may be in contact with second ends of the light-emitting elements 172. Accordingly, the second ends of the light-emitting elements 172 may be electrically connected to the second electrode 173 via the second contact electrode 175. The second contact electrode 175 may be disposed on the third insulating film 183.

In an embodiment, the first and second contact electrodes 174 and 175 may include a transparent conductive oxide ("TCO") capable of transmitting light therethrough, such as, for example, indium tin oxide ("ITO") or indium zinc oxide ("IZO"). Light emitted from the light-emitting elements 172 may be prevented from being blocked by the first and second contact electrodes 174 and 175.

The first ends of the light-emitting elements 172 may be electrically connected to the drain electrode D of the thin-film transistor ST via the first contact electrode 174 and the first electrode 171, and the second ends of the light-emitting elements 172 may be electrically connected to the first power supply line VL1 via the second contact electrode 175 and the second electrode 173. Thus, the light-emitting elements 172 may emit light in accordance with currents that flow from the first ends to the second ends thereof.

A first wavelength conversion layer QDL1 may be disposed in a first subpixel PX1, a second wavelength conversion layer (not illustrated) may be disposed in a second subpixel PX2, and a transparent insulating film TIL may be disposed in a third subpixel PX3. Light-emitting elements 172 of each of the first, second, and third subpixels PX1, PX2, and PX3 may emit third-color light. In an embodiment, the third-color light may be short-wavelength light having a central wavelength of 370 nm to 490 nm, such as, for example, blue light or ultraviolet ("UV") light.

The first wavelength conversion layer QDL1 may convert third-color light emitted from the light-emitting elements 172 of the first subpixel PX1 into first-color light. In an embodiment, the first-color light may be red light having a central wavelength of 600 nm to 750 nm.

The second wavelength conversion layer may convert third-color light emitted from the light-emitting elements 172 of the second subpixel PX2 into second-color light. In an embodiment, the second-color light may be green light having a central wavelength of 480 nm to 560 nm.

Each of the first wavelength conversion layer QDL1 and the second wavelength conversion layer may include a base resin, a wavelength shifter, and a scatterer.

The base resin may include a material having a high light transmittance and an excellent dispersion property for the wavelength shifter and the scatterer. In an embodiment, the base resin may include an organic material such as an epoxy resin, an acrylic resin, a cardo resin, or an imide resin.

The wavelength shifter may convert or shift the wavelength of incident light. The wavelength shifter may be quantum dots, quantum rods, or a phosphor. The quantum-dot size of the first wavelength conversion layer QDL1 may be different from the quantum-dot size of the second wavelength conversion layer.

The scatterer may scatter incident light in random directions substantially without changing the wavelength of light passing through the first wavelength conversion layer QDL1 or the second wavelength conversion layer. Accordingly, the path of light passing through the first wavelength conversion layer QDL1 or the second wavelength conversion layer may be lengthened, and as a result, the color conversion efficiency of the wavelength shifter may be improved. The scatterer may be light-scattering particles. In an embodiment, the scatterer may be particles of a metal oxide such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). In an alternative embodiment, the scatterer may be particles of an organic material such as an acrylic resin or a urethane resin.

The transparent insulating film TIL may transmit short-wavelength light such as blue light or UV light therethrough. The transparent insulating film TIL may be provided as an organic film having high transmittance. In an embodiment, the transparent insulating film TIL may be provided as an organic film including a photosensitive resin, an acrylic resin, an epoxy resin, a phenolic resin, a polyamide resin, or a polyimide resin.

The first wavelength conversion layer QDL1 may be disposed on the second contact electrode 175 and the third insulating film 183 of the first subpixel PX1. The arrangement of the second wavelength conversion layer may be substantially the same as the arrangement of the first wavelength conversion layer QDL1 in the first subpixel PX1, and thus, a detailed description thereof will be omitted.

A low-refractive index film LRL may be disposed on the first wavelength conversion layer QDL1, the second wavelength conversion layer, and the transparent insulating film TIL. The low-refractive index film LRL may have a lower refractive index than the base resin of the first wavelength conversion layer QDL1, the base resin of the second wavelength conversion layer, and the transparent insulating film TIL. In an embodiment, the low-refractive index film LRL may be provided as an organic film including a photosensitive resin, an acrylic resin, an epoxy resin, a phenolic resin, a polyamide resin, or a polyimide resin.

A first color filter CF1, a second color filter, a third color filter CF3, and a black matrix BM may be disposed on the low-refractive index film LRL.

The first color filter CF1 may overlap with the first wavelength conversion layer QDL1 in the third direction (or the Z-axis direction). The first color filter CF1 may transmit first-color light, for example, red-wavelength light, therethrough. Thus, short-wavelength light that is emitted from the light-emitting elements 172 of the first subpixel PX1 and fails to be converted into first-color light may not be able to pass through the first color filter CF1. On the contrary, first-color light obtained by the first wavelength conversion layer QDL1 from the short-wavelength light emitted from the light-emitting elements 172 of the first subpixel PX1 may be able to pass through the first color filter CF1.

The second color filter may overlap with the second wavelength conversion layer in the third direction (or the Z-axis direction). The second color filter may transmit second-color light, for example, green-wavelength light, therethrough. Thus, short-wavelength light that is emitted from the light-emitting elements 172 of the second subpixel PX2 and fails to be converted into second-color light may not be able to pass through the second color filter. On the contrary, second-color light obtained by the second wavelength conversion layer from the short-wavelength light emitted from the light-emitting elements 172 of the second subpixel PX2 may be able to pass through the second color filter.

The third color filter CF3 may overlap with the transparent insulating film TIL in the third direction (or the Z-axis direction). The third color filter CF3 may transmit third-color light, for example, blue-wavelength light, there-through. Thus, short-wavelength light emitted from the light-emitting elements 172 of the third subpixel PX3 may be able to pass through the third color filter CF3.

The black matrix BM may be disposed between the first color filter CF1, the second color filter, and the third color filter CF3. The black matrix BM may cover the edges of the first color filter CF1, the edges of the second color filter, and the edges of the third color filter CF3. The black matrix BM may include a light-blocking material capable of blocking the transmission of light. In this case, the black matrix BM may include an organic black pigment or an inorganic black pigment such as carbon black.

A first hole H1 may penetrate the display panel 100. In an embodiment, the first hole H1 may penetrate the substrate SUB, the barrier film BR, the gate insulating film 130, the first inter-insulating film 141, the second inter-insulating film 142, the planarization film 160, the first insulating film 181, the outer bank 192, the low-refractive index film LRL, and the black matrix BM of the display panel 100.

The barrier film BR, the gate insulating film 130, the first inter-insulating film 141, the second inter-insulating film 142, the planarization film 160, the first insulating film 181, the outer bank 192, the low-refractive index film LRL, and the black matrix BM may be removed from the first hole H1 via etching. Thus, the diameter of the first hole H1 may become smaller in a direction from the black matrix BM to the barrier film BR.

The substrate SUB may be removed from the first hole H1 via a laser process. Thus, the size of the first hole H1 may become smaller in a direction from the bottom to the top of the substrate SUB.

The first panel bottom member 400 may be disposed on a second surface of the substrate SUB. The first panel bottom member 400 may include at least one of a light-absorbing member for absorbing incident light from the outside, a buffer member for absorbing external shock, and a heat dissipation member for efficiently releasing heat from the display panel 100.

A second hole H2 may be defined in the first panel bottom member 400. The second hole H2 may overlap with at least part of the first hole H1 in the third direction (or the Z-axis direction). FIG. 26A illustrates that the second hole H2 overlaps an entirety of the first hole H1 in the third direction (or the Z-axis direction).

The second hole H2 may be provided by removing part of the first panel bottom member 400 via a laser process. FIG. 26A illustrates that the diameter of the second hole H2 gradually decreases in a direction form the bottom to the top of the first panel bottom member 400, but the invention is not limited thereto. In an alternative embodiment, the diameter of the second hole H2 may gradually increase in the direction form the bottom to the top of the first panel bottom member 400.

As illustrated in FIG. 26A, as the first hole H1 is defined through the display panel 100 and the second hole H2 is defined through the first panel bottom member 400, the first and second sounds SOD1 and SOD2 from the first and second sound generating devices 20 and 30, which are disposed at the rear of the display device 10, may be output to the front of the display panel 100 through the first hole H1 and the second hole H2. That is, the first and second holes H1 and H2 may be holes that pass sound therethrough. Thus, even when the first and second sound generating devices 20 and 30 are disposed at the rear of the display device 10, the first and second sounds SOD1 and SOD2 from the first and second sound generating devices 20 and 30 may not be blocked by the display panel 100. Accordingly, even when the first and second sound generating devices 20 and 30 are disposed at the rear of the display device 10, sound with a sense of presence may be provided.

Figure 26B:
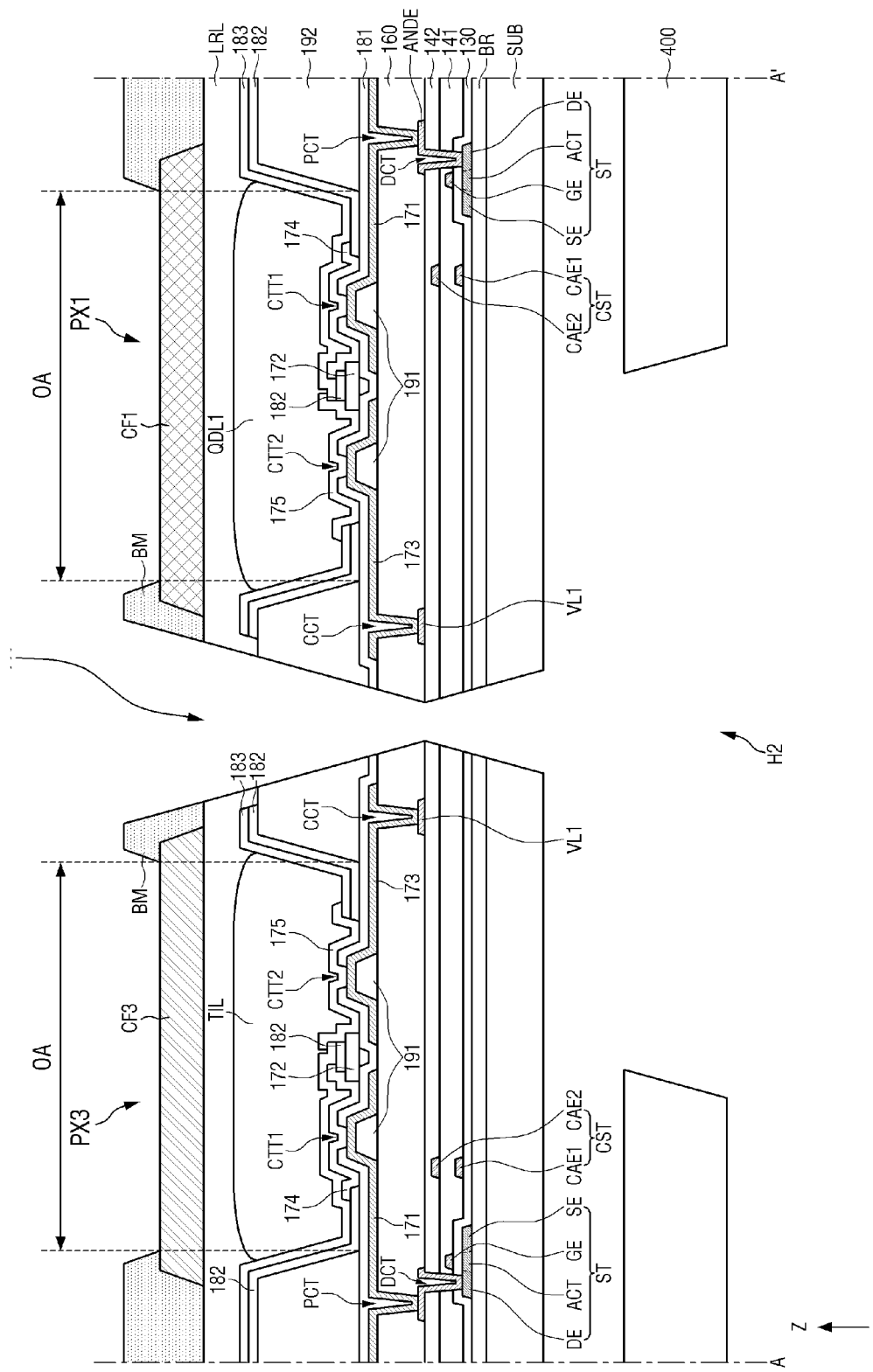

FIG. 26B is a cross-sectional view taken along line A-A' of FIG. 25.

The embodiment of FIG. 26B differs from the embodiment of FIG. 26A in that the first panel bottom member 400 is a lower chassis that forms the exterior of the rear surface of the display device 10. The embodiment of FIG. 26B will hereinafter be described, focusing mainly on the differences with the embodiment of FIG. 26A.

Referring to FIG. 26B, the first panel bottom member 400 may include a metal or tempered glass. In this case, there may exist a gap between the first panel bottom member 400 and the display panel 100.

Figure 27A:
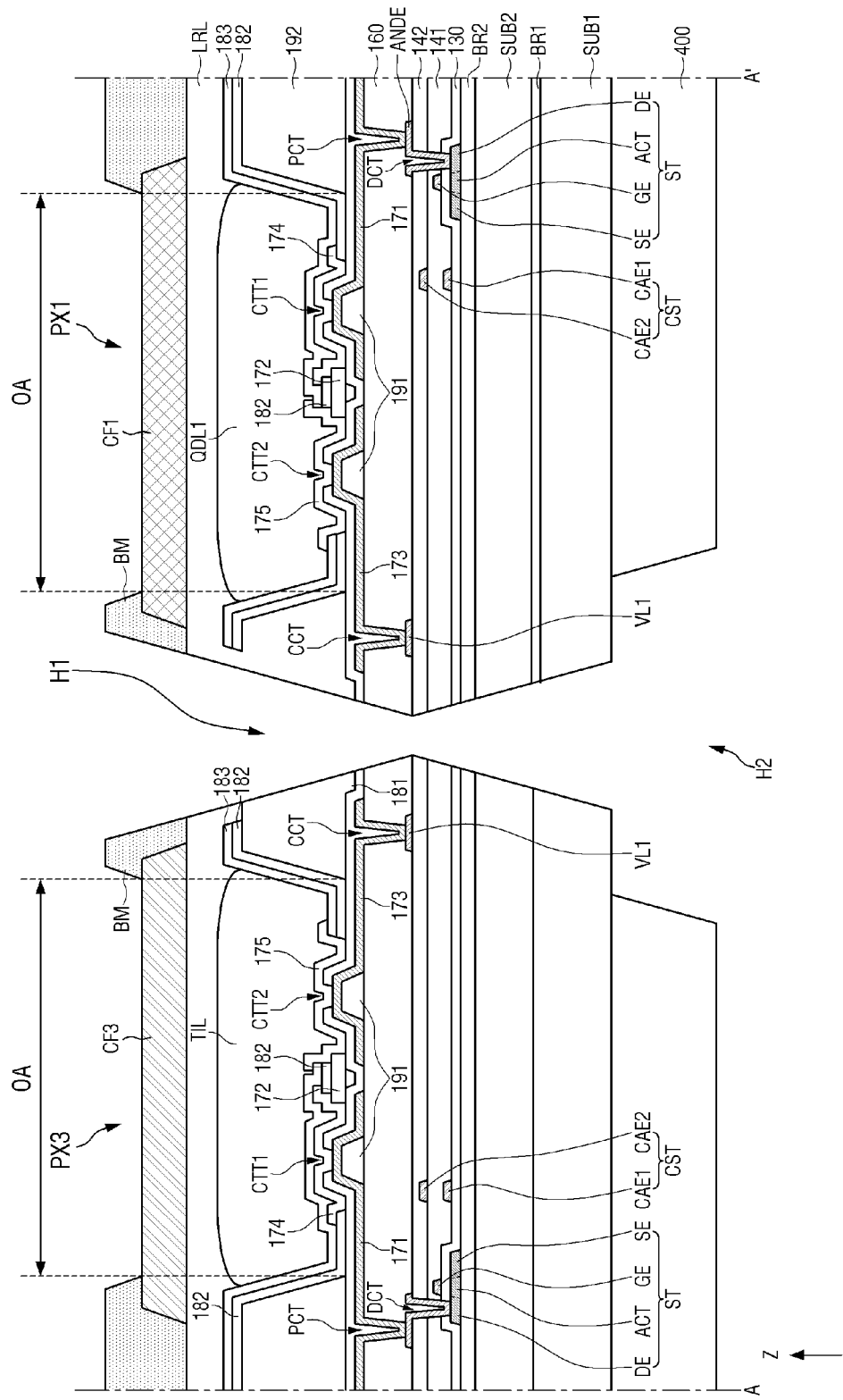
FIGS. 27A and 27B are cross-sectional views taken along line A-A' of FIG. 25.

FIG. 27A is a cross-sectional view taken along line A-A' of FIG. 25.

The embodiment of FIG. 27A differs from the embodiment of FIG. 26A in that a first substrate SUB1, a first barrier film BR1, a second substrate SUB2, and a second barrier film BR2 are provided, instead of the substrate SUB and the barrier film BR. The embodiment of FIG. 27A will hereinafter be described, focusing mainly on the differences with the embodiment of FIG. 26A.

Referring to FIG. 27A, the first substrate SUB1 may be provided as an organic film such as a polyimide film. The first substrate SUB1 may be a flexible substrate that is bendable, foldable, or rollable.

A first barrier film BR1 may be disposed on the first substrate SUB1. The first barrier film BR1 is a film for protecting thin-film transistors ST from moisture that may infiltrate into the first substrate SUB1, which is susceptible to moisture. The first barrier film BR1 may include a plurality of inorganic films that are alternately stacked. In an embodiment, the first barrier film BR1 may be provided as a multifilm in which inorganic films including at least one of $SiO_x$, $SiN_x$, and SiON are alternately stacked.

The second substrate SUB2 may be disposed on the first barrier film BR1. The second substrate SUB2 may be provided as an organic film such as a polyimide film. The second substrate SUB2 may be a flexible substrate that is bendable, foldable, or rollable.

The second barrier film BR2 may be disposed on the second substrate SUB2. The second barrier film BR2 is a film for protecting the thin-film transistors ST from moisture that may infiltrate into the second substrate SUB2, which is susceptible to moisture. The second barrier film BR2 may include a plurality of inorganic films that are alternately stacked. In an embodiment, the second barrier film BR2 may be provided as a multifilm in which inorganic films including at least one of $SiO_x$, $SiN_x$, and SiON are alternately stacked.

In a case where the first and second substrates SUB1 and SUB2 are both provided as organic films, as illustrated in FIG. 27A, a display panel 100 may be fabricated as a flexible display panel that is bendable, foldable, or rollable.

Figure 27B:
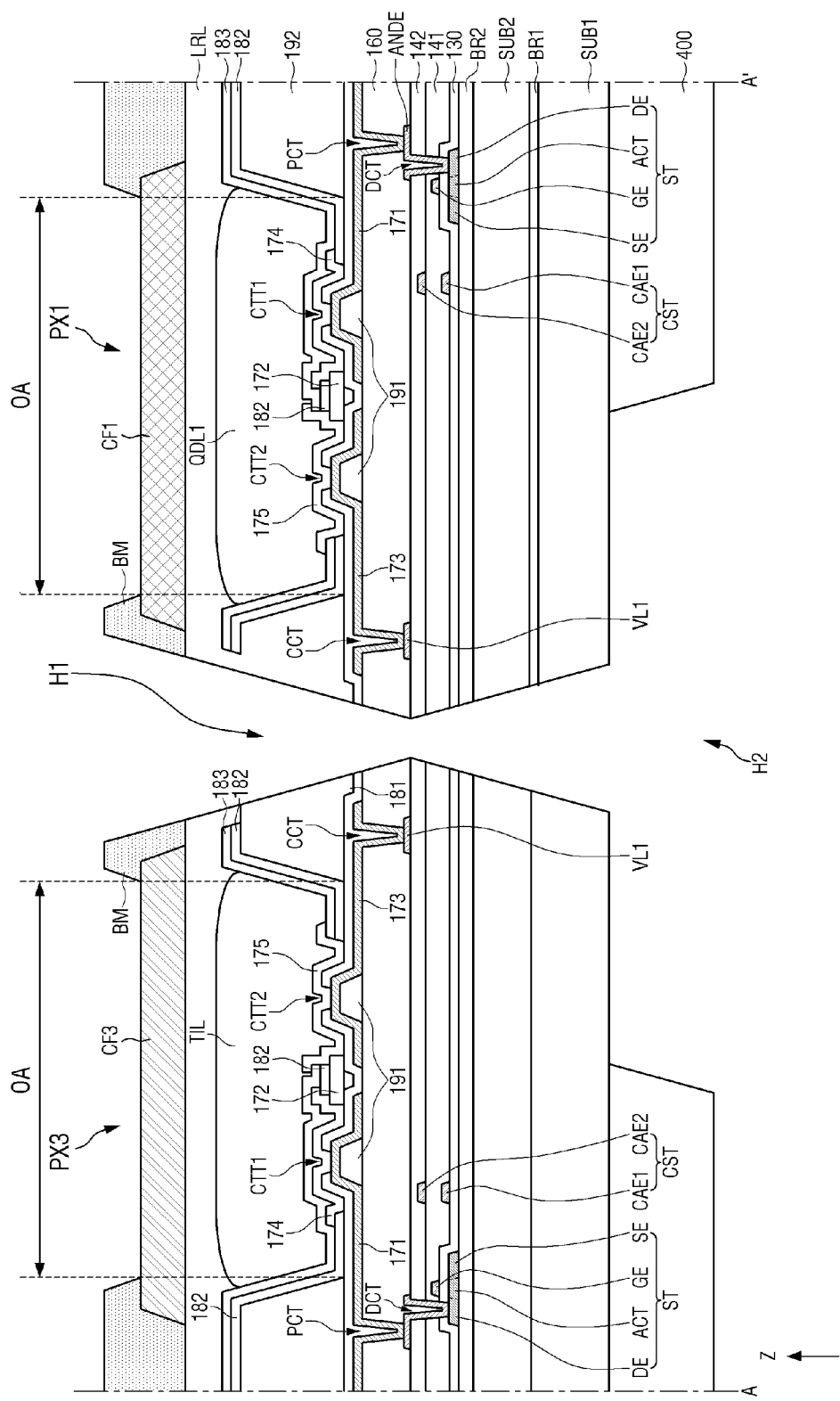

FIG. 27B is a cross-sectional view taken along line A-A' of FIG. 25.

The embodiment of FIG. 27B differs from the embodiment of FIG. 26B only in that a first substrate SUB1, a first barrier film BR1, a second substrate SUB2, and a second barrier film BR2 are provided, instead of the substrate SUB and the barrier film BR. Thus, a description of the embodiment of FIG. 27B will be omitted.

Figure 28A:
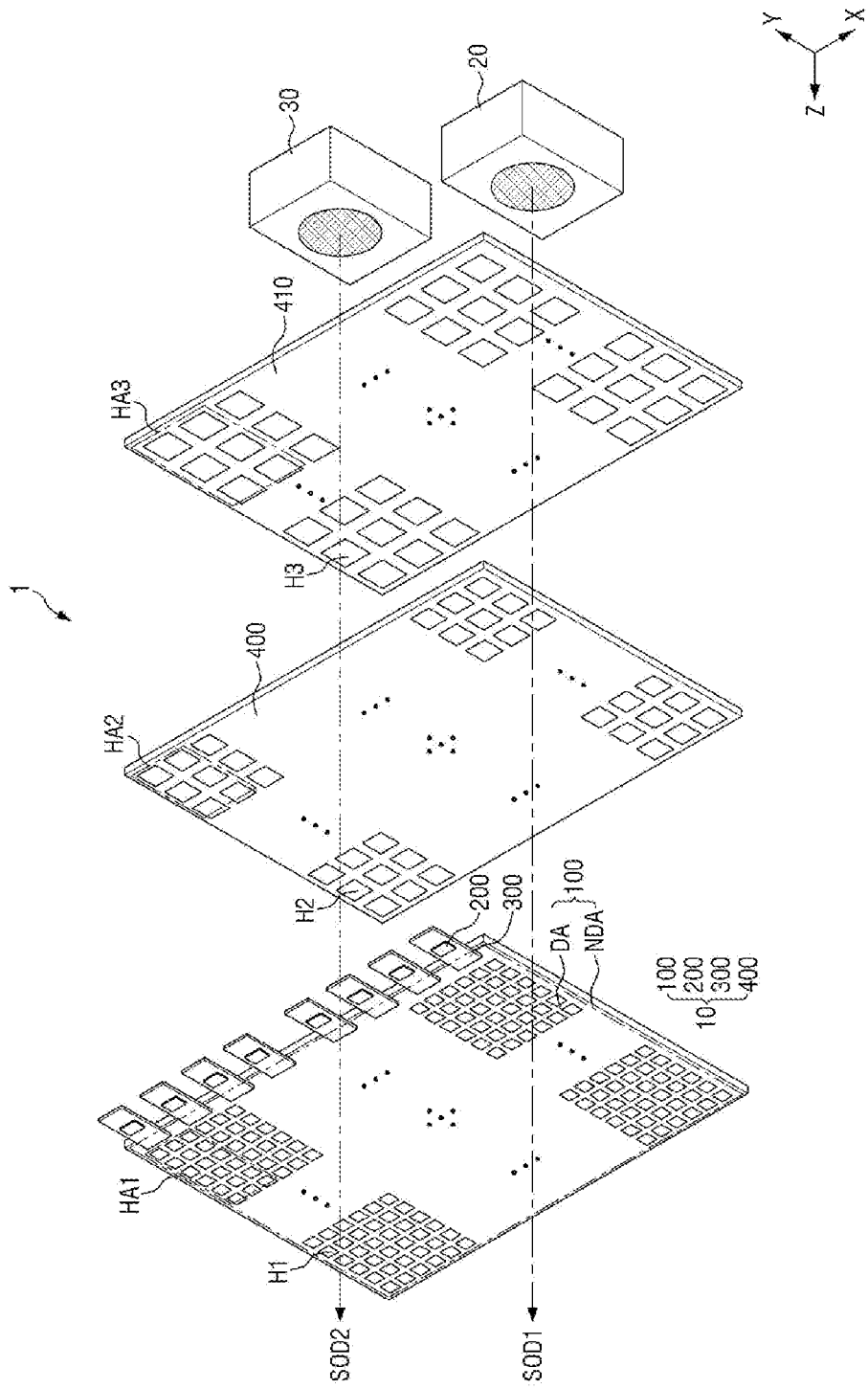
FIG. 28A is an exploded perspective view of another embodiment of a sound system including a display device according to the invention.
Figure 28B:
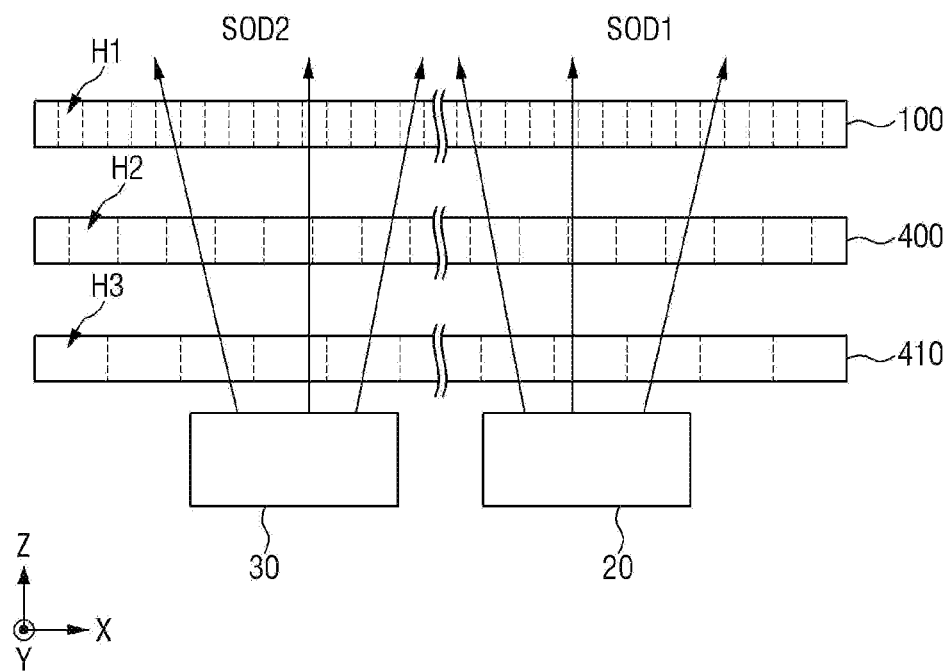
FIG. 28B is a side view of the sound system of FIG. 28A.

FIG. 28A is an exploded perspective view of another embodiment of a sound system including a display device according to the invention. FIG. 28B is a side view of the sound system of FIG. 28A.

The embodiment of FIGS. 28A and 28B differs from the embodiment of FIGS. 1A and 1B in that a second panel bottom member 410 is further disposed in a display device 10. The embodiment of FIGS. 28A and 28B will hereinafter be described, focusing mainly on the differences with the embodiment of FIGS. 1A and 1B.

Referring to FIGS. 28A and 28B, the second panel bottom member 410 may be disposed on one surface of a first panel bottom member 400. In an embodiment, in a case where a display panel 100 is disposed on the front surface of the first panel bottom member 400, the second panel bottom member 410 may be disposed on the rear surface of the first panel bottom member 400.

Third holes H3 may be defined in the second panel bottom member 410. The third holes H3 may be holes that penetrate the second panel bottom member 410. The third holes H3 may be arranged in a first direction (or an X-axis direction) and a second direction (or a Y-axis direction). That is, the third holes H3 may be arranged in a matrix form. Each of the third holes H3 may overlap with at least one first hole H1 and at least one second hole H2 in a third direction (or a Z-axis direction).

The first panel bottom member 400 may be a heat dissipation member, and the second panel bottom member 410 may be a lower chassis. The first panel bottom member 400 may release heat generated by the display panel 100. In an embodiment, the first panel bottom member 400 may include a layer of a metal with high thermal conductivity such as graphite, Ag, Cu, or Al. The second panel bottom member 410 may form the exterior of the rear surface of the display device 10. In an embodiment, the second panel bottom member 410 may include a metal or tempered glass.

Figure 29A:
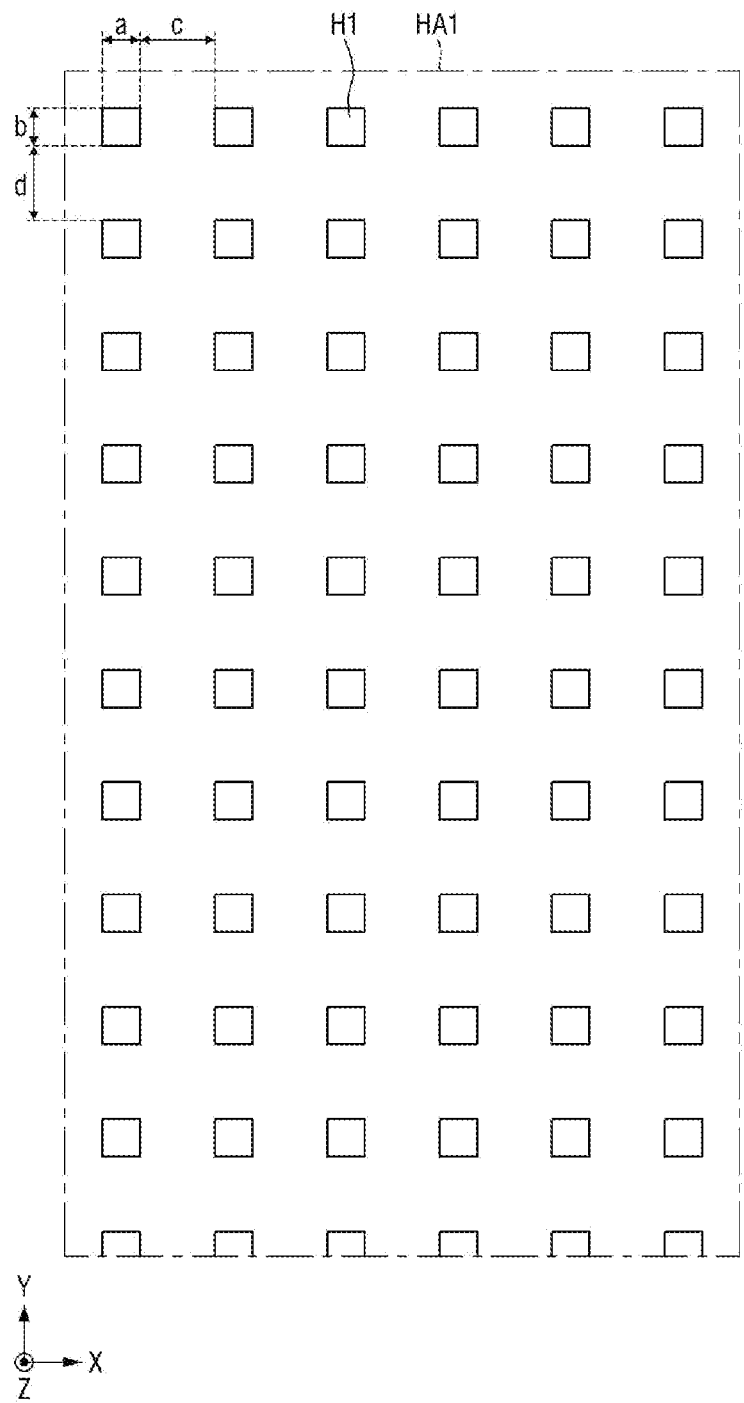
FIGS. 29A through 29C are plan views illustrating another embodiment of first holes of a display panel, second holes of a first panel bottom member, and third holes of a second panel bottom member, respectively, according to the invention.
Figure 29B:
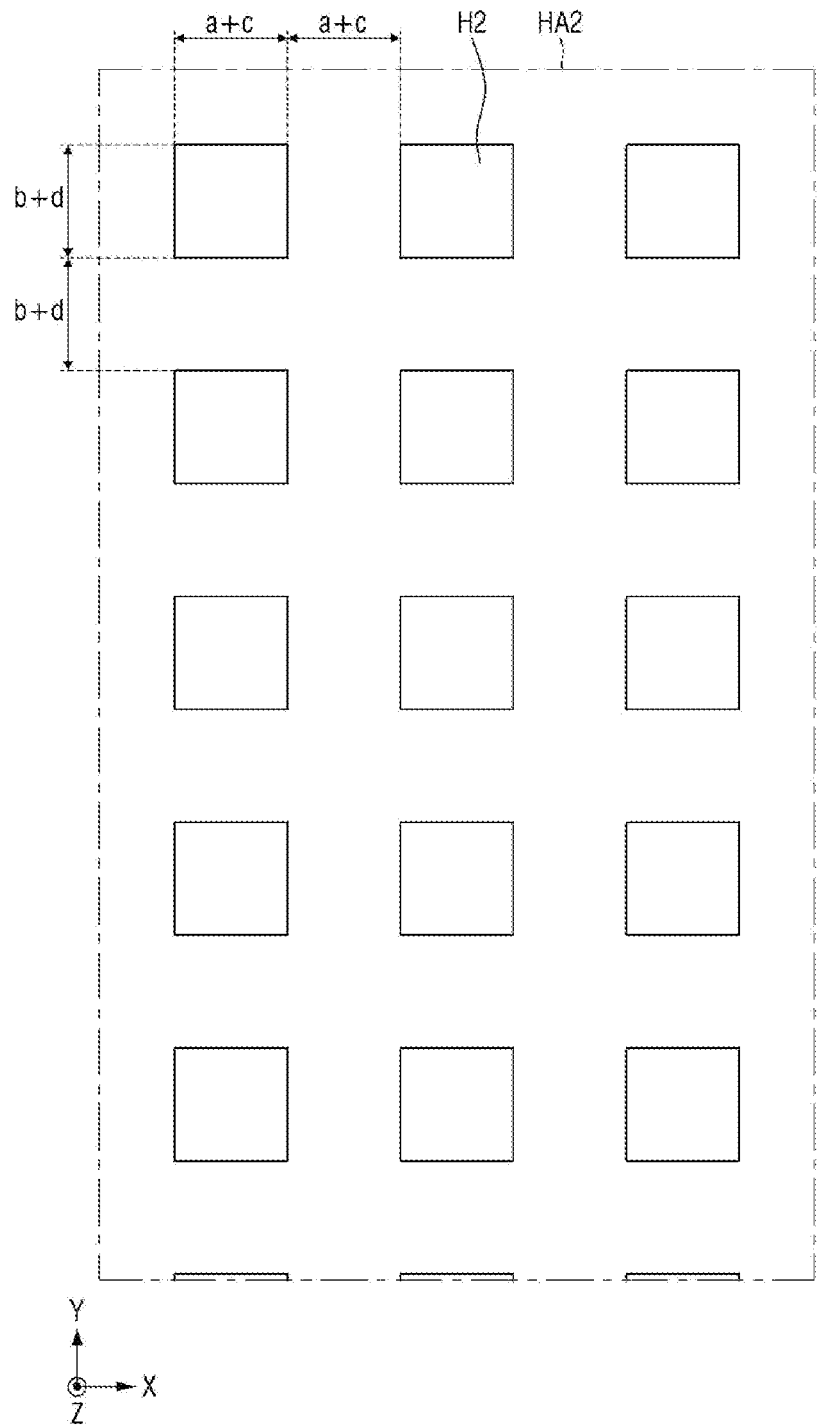
Figure 29C:
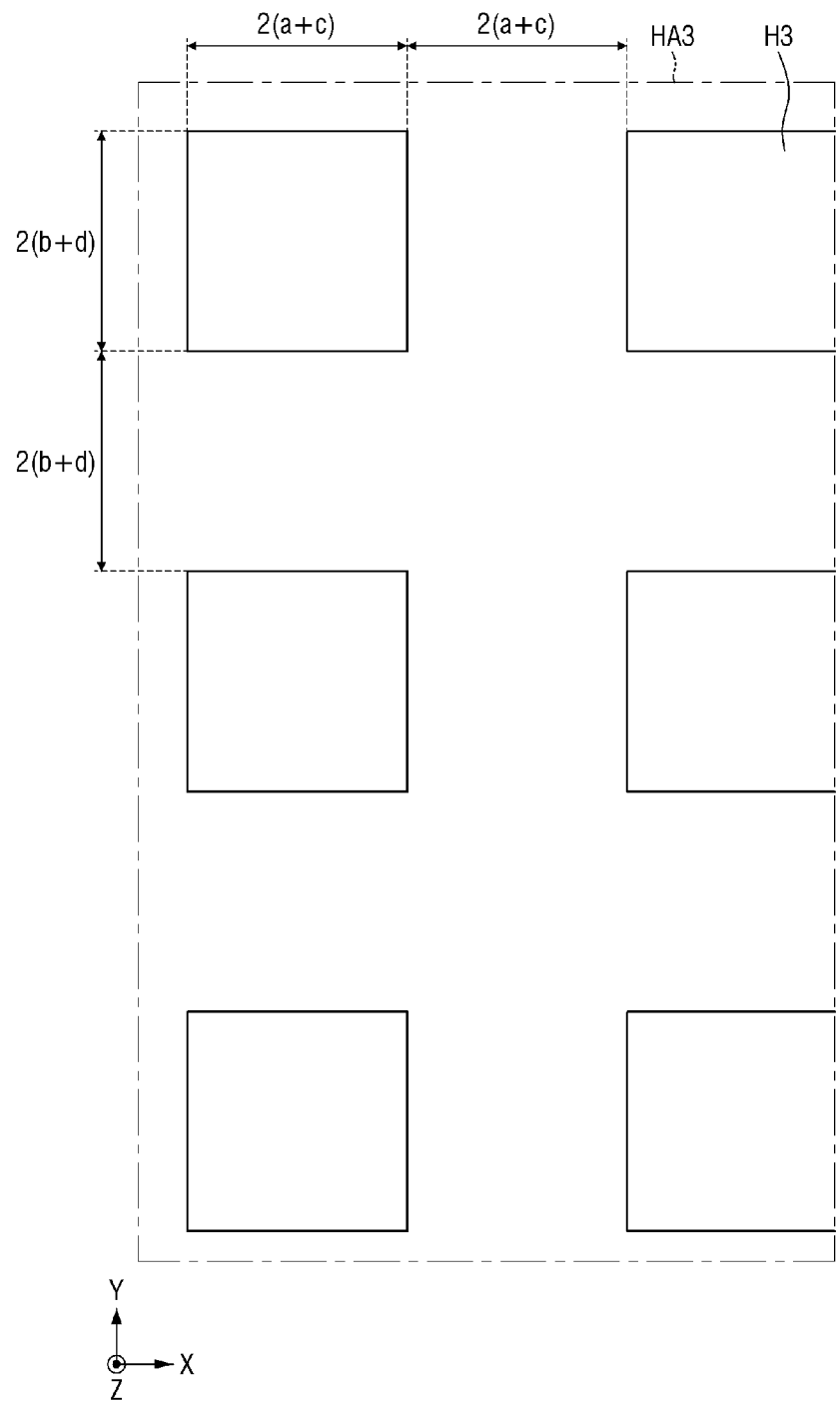
Figure 30:
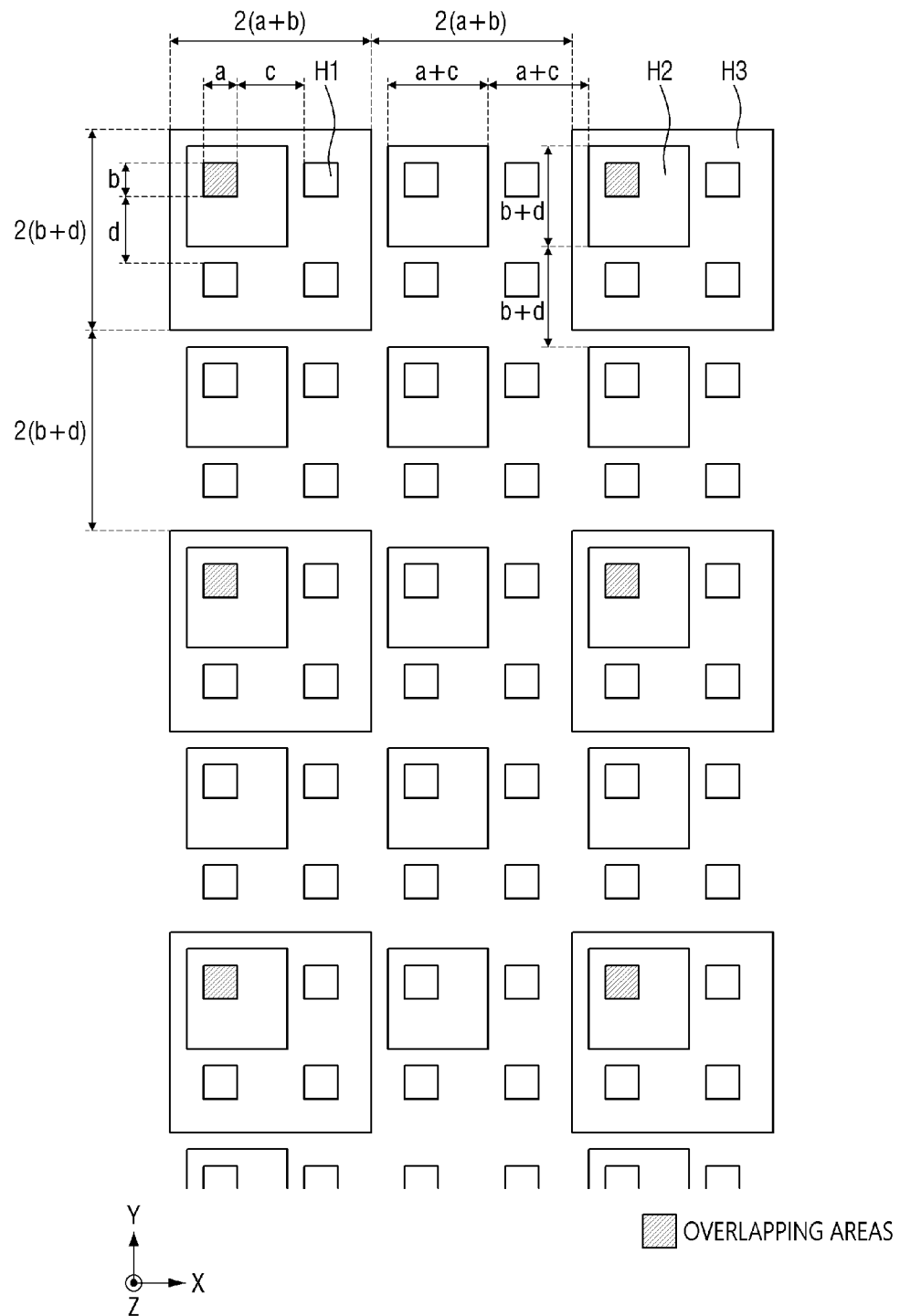
FIG. 30 illustrates the overlapping areas of the first holes of the display panel of FIG. 29A, the second holes of the first panel bottom member of FIG. 29B, and the third holes of the second panel bottom member of FIG. 29C.

FIGS. 29A through 29C are plan views illustrating another embodiment of first holes of a display, second holes of a first panel bottom member, and third holes of a second panel bottom member, respectively, according to the invention. FIG. 30 illustrates the overlapping areas of the first holes of the display panel of FIG. 29A, the second holes of the first panel bottom member of FIG. 29B, and the third holes of the second panel bottom member of FIG. 29C.

The embodiment of FIGS. 29A through 29C and 30 differs from the embodiment of FIGS. 2 and 3 in that third holes H3 are further provided. The embodiment of FIGS. 29A through 29C and 30 will hereinafter be described, focusing mainly on the differences with the embodiment of FIGS. 2 and 3.

Referring to FIGS. 29A through 29C and 30, the third holes H3 may have a polygonal shape in a plan view. FIGS. 29A through 29C and 30 illustrate that the third holes H3 have a quadrangular (e.g., rectangular) shape in a plan view, but the invention is not limited thereto. In an alternative embodiment, the third holes H3 may have a circular or elliptical shape in a plan view. In an alternative embodiment, the third holes H3 may have various other shapes in a plan view. The planar shape of the third holes H3 may differ from the planar shapes of first holes H1 and second holes H2.

The third holes H3 may have a larger size than those of the first holes H1 and the second holes H2. That is, the third holes H3 may have a larger area than those of the first holes H1 and the second holes H2.

The maximum length of each third hole H3 in the first direction (or the X-axis direction) and the minimum distance between neighboring third holes H3 in the first direction (or the X-axis direction) may be defined as "g×(a+c)", and the maximum length of each third hole H3 in the second direction (or the Y-axis direction) and the minimum distance between the neighboring third holes H3 in the second direction (or the Y-axis direction) may be defined as "h×(b+d)". Here, g is a positive integer greater than e, and h is a positive integer greater than f. FIGS. 29 through 29C and 30 illustrate that g and h are both 2.

That is, the maximum length of each third hole H3 in the first direction (or the X-axis direction) and the minimum distance between neighboring third holes H3 in the first direction (or the X-axis direction) may be defined as two times the sum of a maximum length a of each first hole H1 in the first direction (or the X-axis direction) and a minimum distance c between the neighboring first holes H1 in the first direction (or the X-axis direction), i.e., 2×(a+c). Also, the maximum length of each third hole H3 in the second direction (or the Y-axis direction) and the minimum distance between the neighboring third holes H3 in the second direction (or the Y-axis direction) may be defined as two times the sum of a maximum length b of each second hole H2 in the second direction (or the Y-axis direction) and a minimum distance d between the neighboring second holes H2 in the second direction (or the Y-axis direction), i.e., 2×(b+d).

In this case, each of the second holes H2 may overlap with at least one first hole H1 in a third direction (or a Z-axis direction) without the need to align the display panel 100 in which the first holes H1 are defined and the first panel bottom member 400 in which the second holes H2 are defined. FIG. 30 illustrates that each of the second holes H2 overlaps with one first hole H1 and each of the third holes H3 overlaps with one second hole H2.

That is, each of the third holes H3 may overlap with at least one first hole H1 and at last one second hole H2 in the third direction (or the Z-axis direction). Thus, even when first and second sound generating devices 20 and 30 are disposed at the rear of the display device 10, first and second sounds SOD1 and SOD2 from the first and second sound generating devices 20 and 30 may be output to the front of the display device 10 sequentially through the third holes H3 of the second panel bottom member 410, the second holes H2 of the first panel bottom member 400, and the first holes H1 of the display panel 100, without being blocked by the display panel 100, the first panel bottom member 400, and the second panel bottom member 410. Accordingly, even when the first and second sound generating devices 20 and 30 are disposed at the rear of the display device 10, sound with a sense of presence may be provided.

Figure 31:
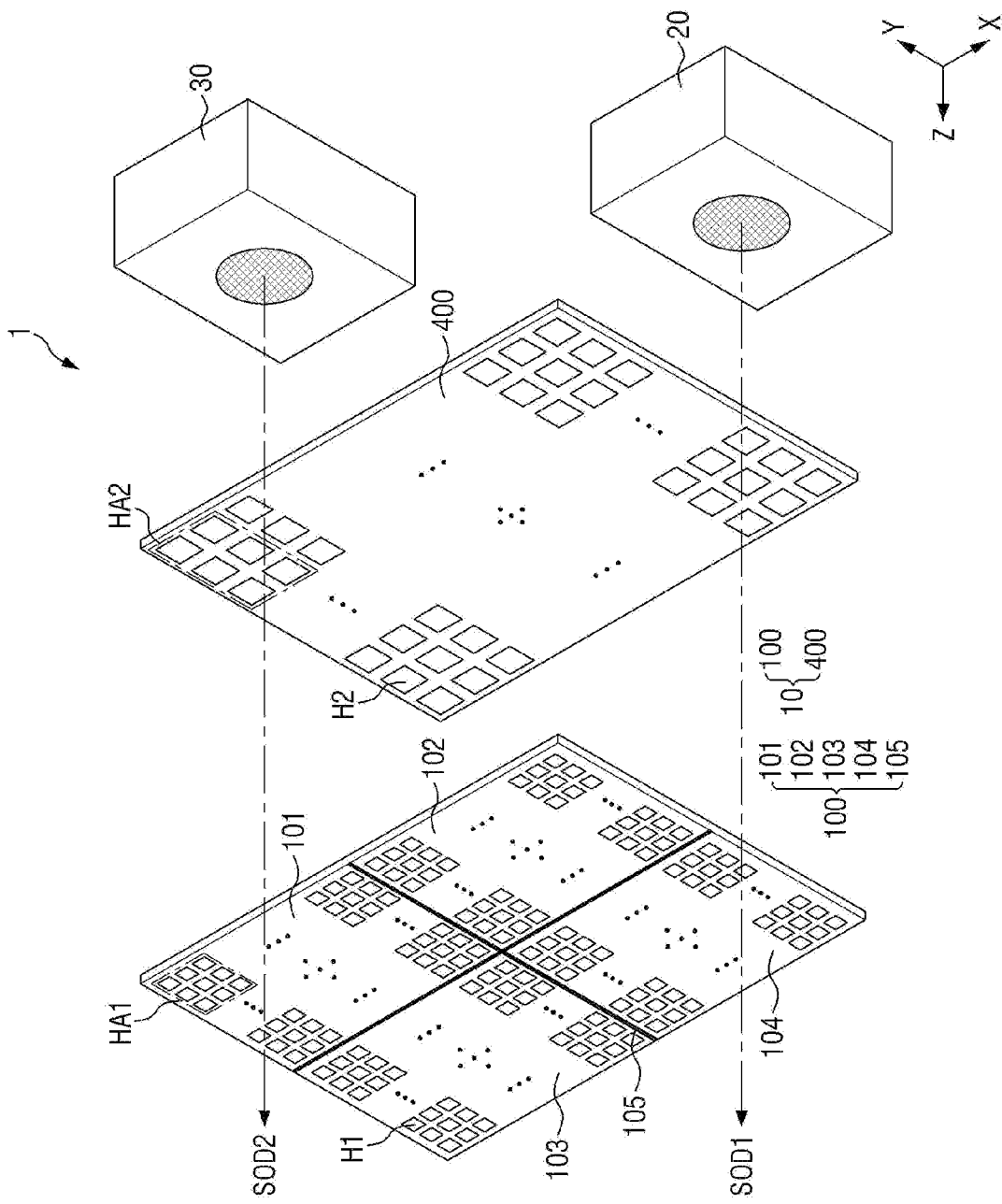
FIG. 31 is an exploded perspective view of another embodiment of a sound system including a display device according to the invention.

FIG. 31 is an exploded perspective view of another embodiment of a sound system including a display device according to the invention.

The embodiment of FIG. 31 differs from the embodiment of FIG. 1A in that a display panel 100 includes a plurality of first, second, third and fourth display panels 101, 102, 103, and 104 and a bonding member 105. The embodiment of FIG. 31 will hereinafter be described, focusing mainly on the differences with the embodiment of FIG. 1A.

Referring to FIG. 31, the display panel 100 may be a tiled display panel including the first, second, third, and fourth display panels 101, 102, 103, and 104. FIG. 31 illustrates that the display panel 100 includes four display panels, i.e., the first, second, third, and fourth display panels 101, 102, 103, and 104, but the invention is not limited thereto.

The first, second, third, and fourth display panels 101, 102, 103, and 104 may be arranged in a lattice form, but the invention is not limited thereto. The first, second, third, and fourth display panels 101, 102, 103, and 104 may be connected to one another in a first direction (or an X-axis direction) or a second direction (or a Y-axis direction) of a display device 10, and as a result, the display panel 100 may have a particular shape.

FIG. 31 illustrates that the first, second, third, and fourth display panels 101, 102, 103, and 104 have the same size, but the invention is not limited thereto. In an alternative embodiment, the first, second, third, and fourth display panels 101, 102, 103, and 104 may have different sizes.

The first, second, third, and fourth display panels 101, 102, 103, and 104 may have a quadrangular (e.g., rectangular) shape having long sides and short sides. The first, second, third, and fourth display panels 101, 102, 103, and 104 may be arranged with their long sides or short sides connected to one another.

First holes H1 and pad holes PDH may be defined in each of the first, second, third, and fourth display panels 101, 102, 103, and 104. The first holes H1 and the pad holes PDH may be holes that penetrate the display panel 100.

The first holes H1 may be defined in the display area of each of the first, second, third, and fourth display panels 101, 102, 103, and 104. The first holes H1 may be arranged in the first direction (or the X-axis direction) and the second direction (or the Y-axis direction). That is, the first holes H1 may be arranged in a matrix form.

The pad holes PDH may be defined in the non-display area of each of the first, second, third, and fourth display panels 101, 102, 103, and 104. The pad holes PDH may be arranged in the first direction (or the X-axis direction) or the second direction (or the Y-axis direction). The pad holes PDH may be defined adjacent to one side of the display panel 100, in each of the first, second, third, and fourth display panels 101, 102, 103, and 104. In an embodiment, referring to FIG. 31, the pad holes PDH (refer to FIG. 32) may be defined adjacent to the upper side of the display panel 100, in the first or second display panel 101 or 102, and adjacent to the lower side of the display panel 100, in the third or fourth display panel 103 or 104.

The first, second, third, and fourth display panels 101, 102, 103, and 104 may be connected to one another by the bonding member 105. The bonding member 105 may be an adhesive member having adhesiveness.

Figure 32:
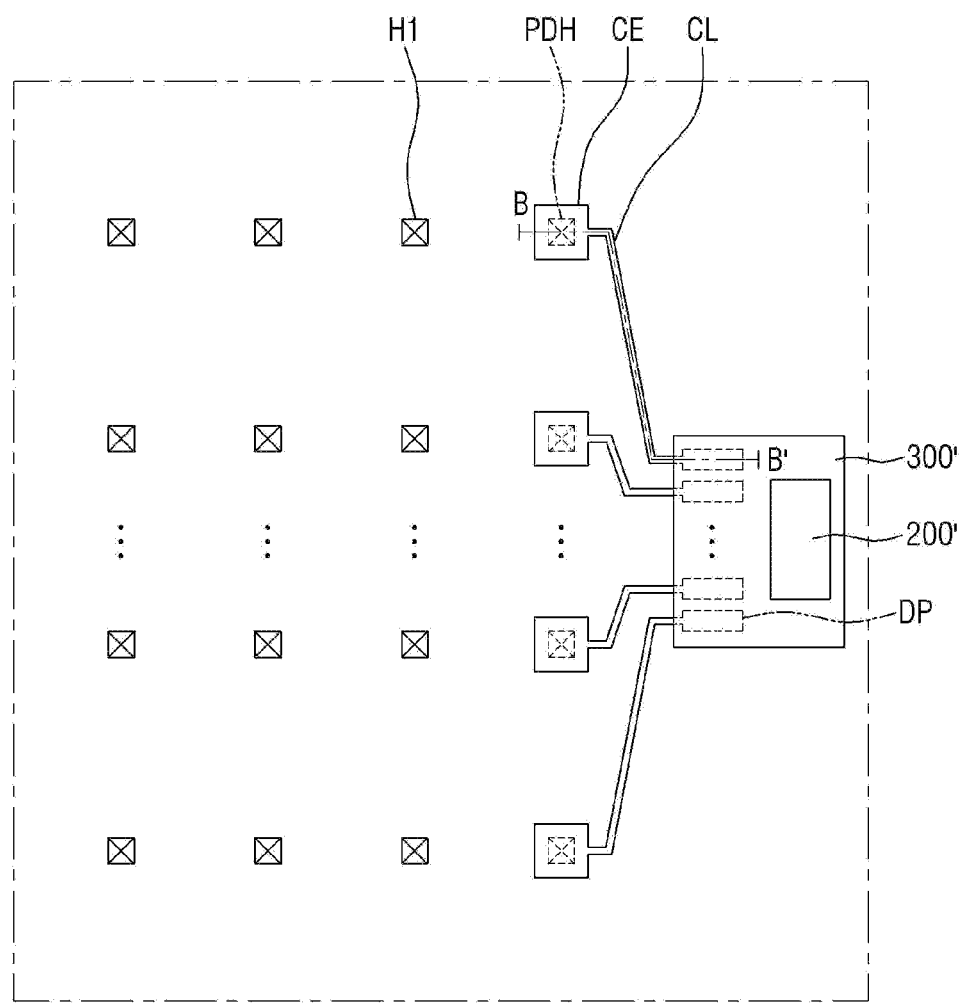
FIG. 32 is a rear plan view illustrating display pads, pad holes, a display driving circuit, and a circuit board of a first display panel of FIG. 31.
Figure 33:
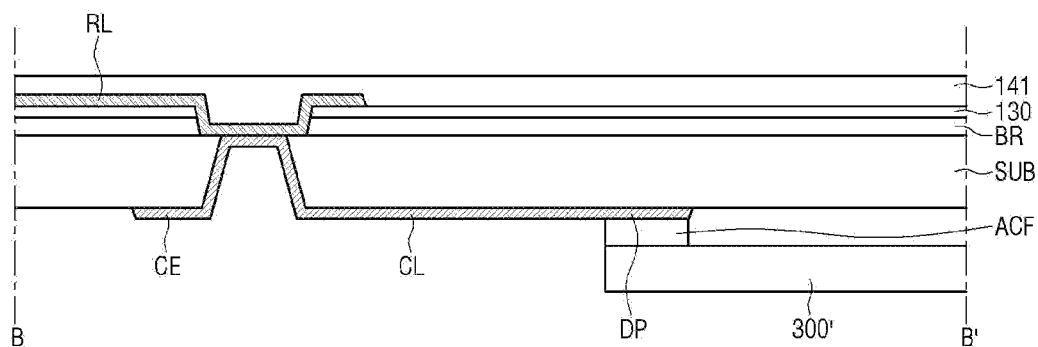
FIG. 33 is a cross-sectional view taken along line B-B' of FIG. 32.

FIG. 32 is a rear plan view illustrating display pads, pad holes, a display driving circuit, and a circuit board of the first display panel of FIG. 31. FIG. 33 is a cross-sectional view taken along line B-B' of FIG. 32.

Referring to FIGS. 32 and 33, connecting electrodes CE may be disposed in pad holes PDH of the first display panel 101. The connecting electrodes CE may be connected to routing lines RL, which are disposed on a gate insulating film 130, through the pad holes PDH. The connecting electrodes CE may be connected to connecting lines CL, and the connecting lines CL may be connected to display pads DP.

The connecting electrodes CE, the connecting lines CL, and the display pads DP may be disposed on the rear surface of a substrate SUB. The connecting electrodes CE, the connecting lines CL, and the display pads DP may be unitary. That is, the connecting electrodes CE, the connecting lines CL, and the display pads DP may include the same material.

The display pads DP may be connected to a circuit board 300' via an adhesive film ACF. As a result, the routing lines RL of the display panel 100 may be electrically connected to a display driving circuit 200' via the connecting electrodes CE, the connecting lines CL, and the display pads DP. The adhesive film ACF may be an anisotropic conductive film.

Figure 34:
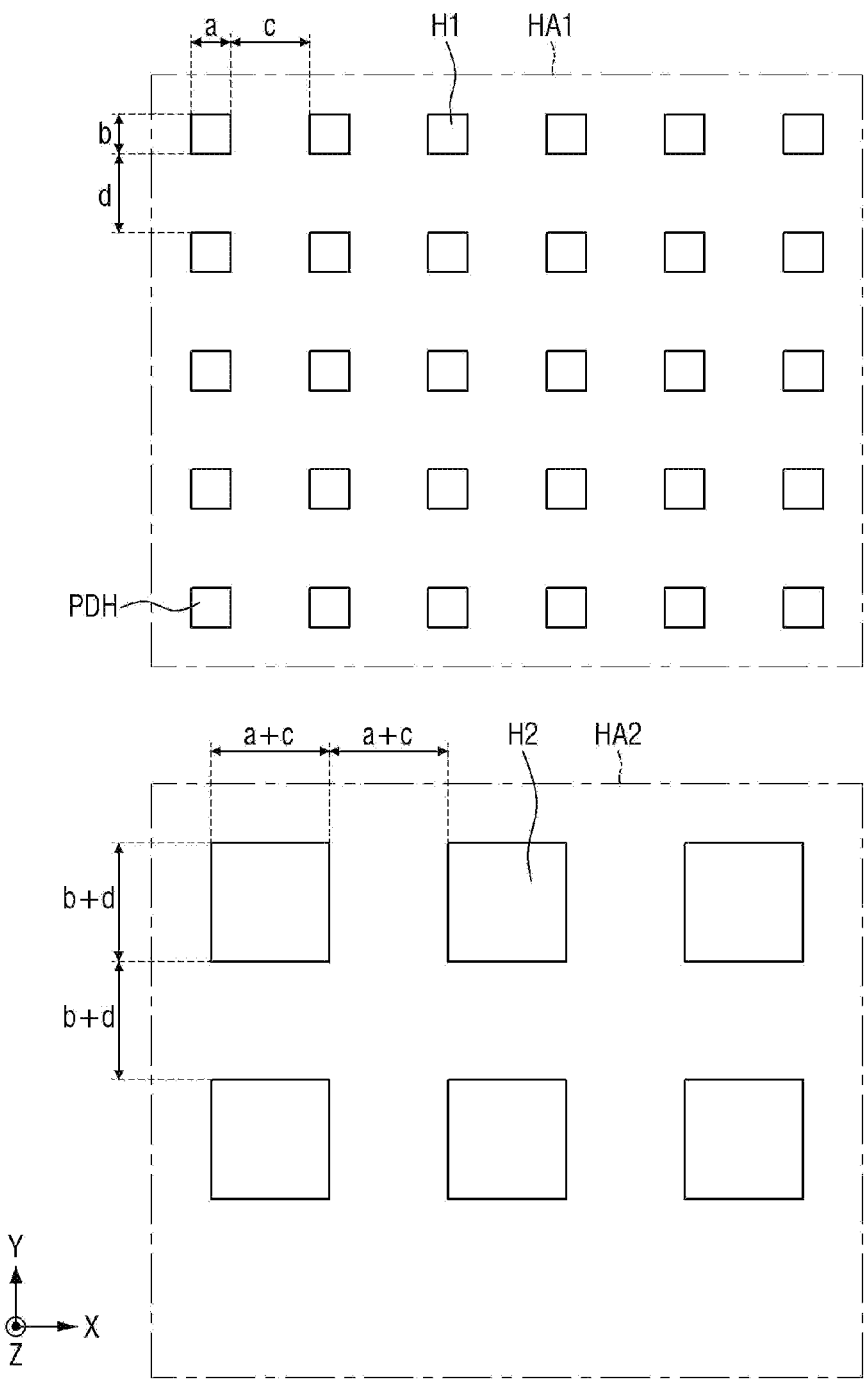
FIG. 34 is a plan view illustrating another embodiment of first holes and pad holes of a first display panel and second holes of a first panel bottom member according to the invention.
Figure 35:
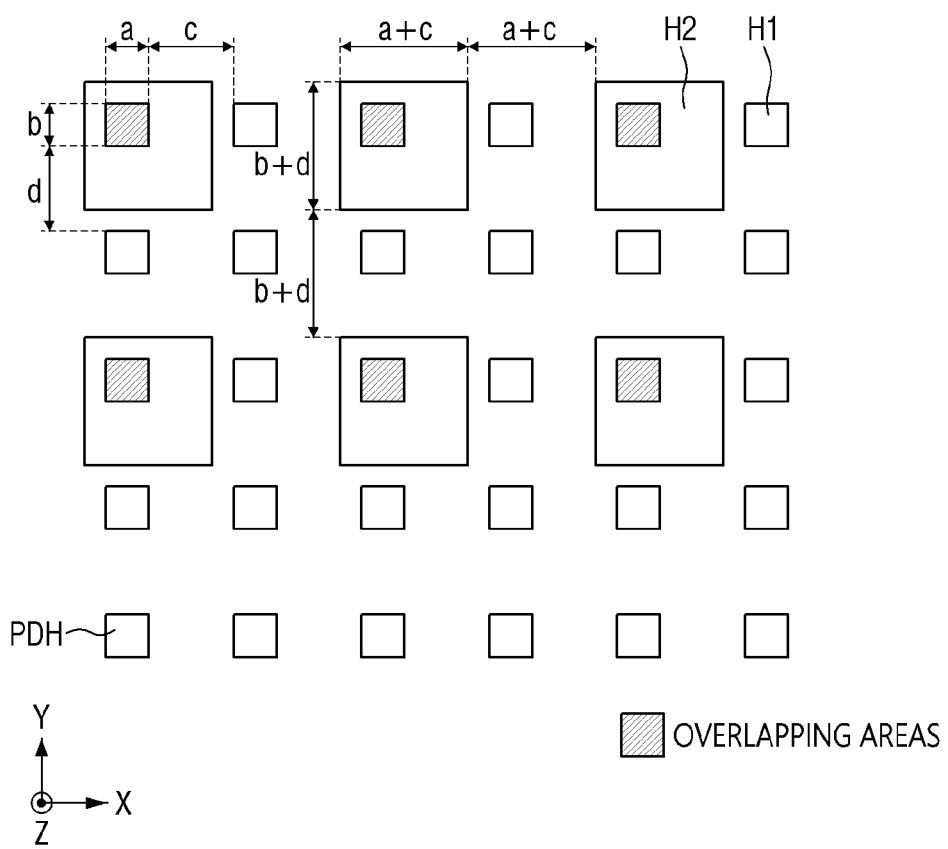
FIG. 35 illustrates the overlapping areas of the first holes and the pad holes of the first display panel of FIG. 34 and the second holes of the first panel bottom member of FIG. 34.

FIG. 34 is a plan view illustrating another embodiment of first holes and pad holes of a first display panel and second holes of a first panel bottom member according to the invention. FIG. 35 illustrates the overlapping areas of the first holes and the pad holes of the first display panel of FIG. 34 and the second holes of the first panel bottom member of FIG. 34.

The embodiment of FIGS. 34 and 35 differs from the embodiment of FIGS. 2 and 3 in that pad holes PDH are further defined in a first display panel. The embodiment of FIGS. 34 and 35 will hereinafter be described, focusing mainly on the differences with the embodiment of FIGS. 2 and 3.

Referring to FIGS. 34 and 35, first holes H1 and the pad holes PDH may be defined by removing parts of a substrate SUB via a laser process. Thus, the first holes H1 and the pad holes PDH may have substantially the same size. That is, the first holes H1 and the pad holes PDH may have substantially the same area.

The pad holes PDH may be holes in which connecting electrodes CE, which connect routing lines on the front surface of the substrate SUB and connecting lines CL on the rear surface of the substrate SUB, are disposed. Thus, the pad holes PDH may not overlap with second holes H2 in a third direction (or a Z-axis direction).

Figure 36:
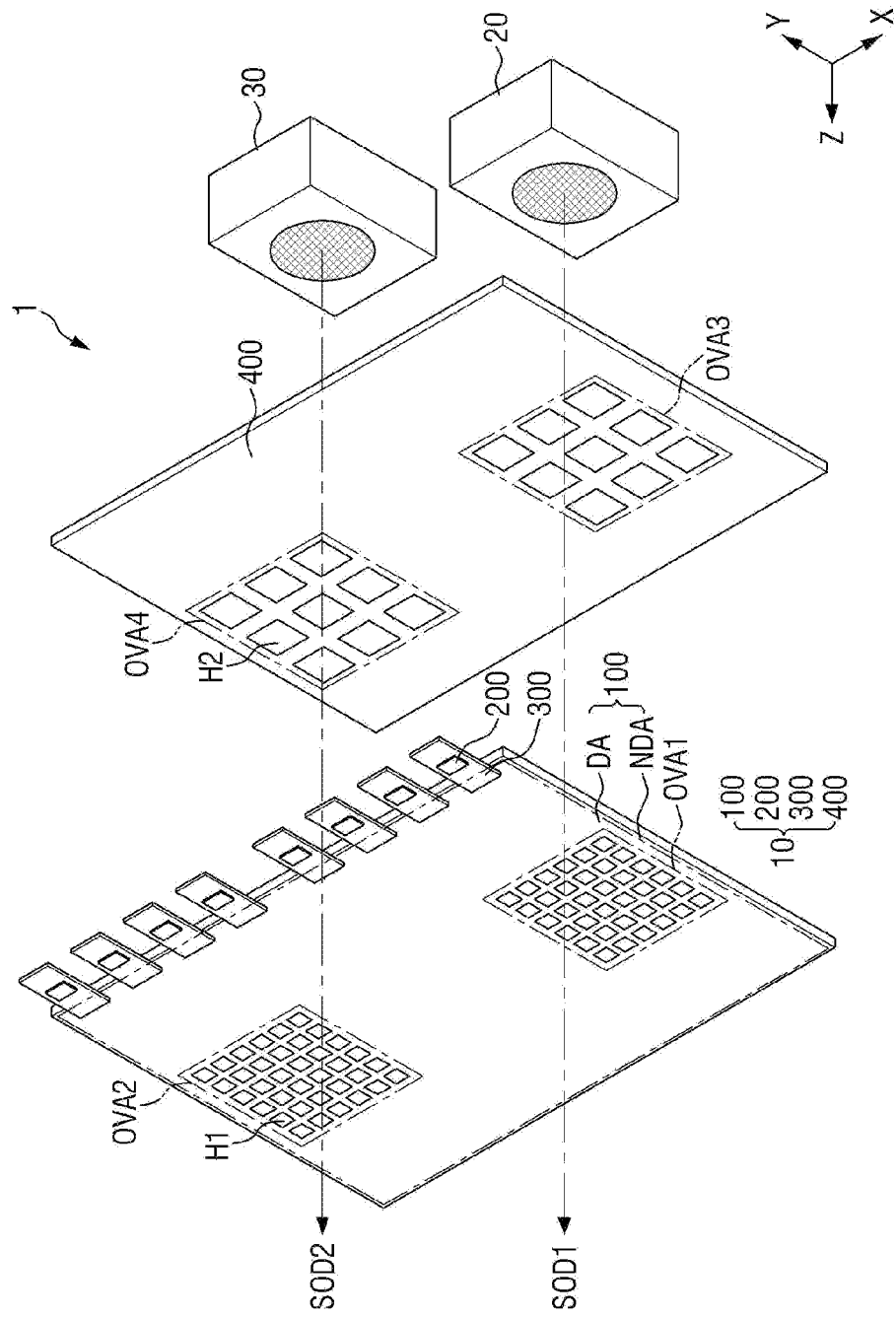
FIG. 36 is an exploded perspective view of another embodiment of a sound system including a display device according to the invention.

FIG. 36 is an exploded perspective view of another embodiment of a sound system including a display device according to the invention.

The embodiment of FIG. 36 differs from the embodiment of FIG. 1A in that first holes H1 of a display panel 100 and second holes H2 of a first panel bottom member 400 are defined only in regions that overlap with first and second sound generating devices 20 and 30 in a third direction (or a Z-axis direction). The embodiment of FIG. 36 will hereinafter be described, focusing mainly on the differences with the embodiment of FIG. 1A.

Referring to FIG. 36, some of the first holes H1 of the display panel 100 may be defined in a first overlapping area OVA1 of the display panel 100 and the first sound generating device 20. The other first holes H1 of the display panel 100 may be defined in a second overlapping area OVA2 of the display panel 100 and the second sound generating device 30. The first holes H1 of the display panel 100 may not be defined in areas other than the first and second overlapping areas OVA1 and OVA2.

Some of the second holes H2 of the first panel bottom member 400 may be defined in a third overlapping area OVA3 of the first panel bottom member 400 and the first sound generating device 20. The other second holes H2 of the first panel bottom member 400 may be defined in a fourth overlapping area OVA4 of the first panel bottom member 400 and the second sound generating device 30. The second holes H2 of the first panel bottom member 400 may not be defined in areas other than the third and fourth overlapping areas OVA3 and OVA4.

Figure 37:
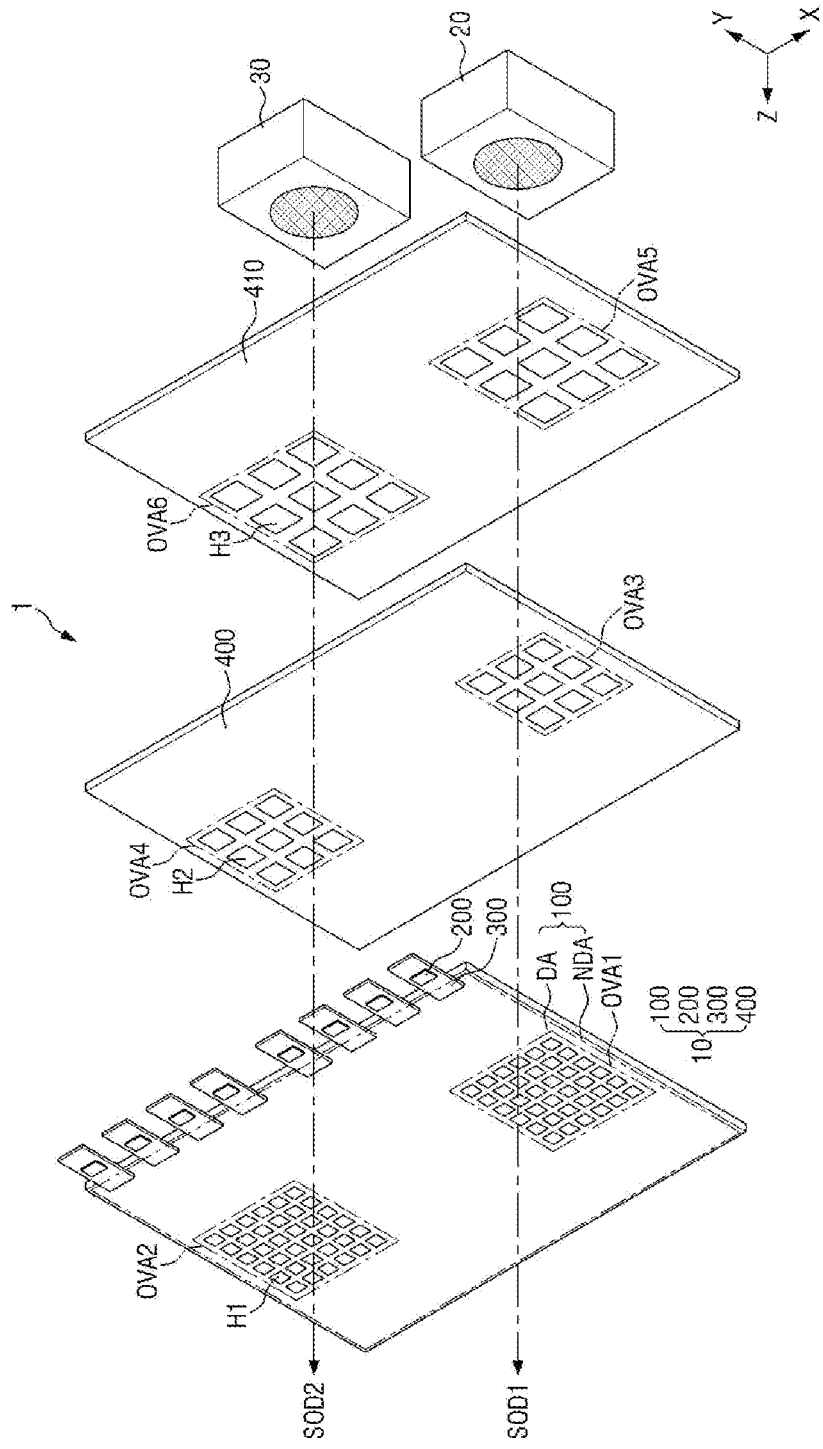
FIG. 37 is an exploded perspective view of another embodiment of a sound system including a display device according to the invention.

FIG. 37 is an exploded perspective view of another embodiment of a sound system including a display device according to the invention.

The embodiment of FIG. 37 differs from the embodiment of FIG. 36 in that third holes H3 of a second panel bottom member 410 are further defined only in regions that overlap with first and second sound generating devices 20 and 30 in a third direction (or a Z-axis direction). The embodiment of FIG. 37 will hereinafter be described, focusing mainly on the differences with the embodiment of FIG. 36.

Referring to FIG. 37, some of the third holes H3 of the second panel bottom member 410 may be defined in a fifth overlapping area OVA5 of the second panel bottom member 410 and the first sound generating device 20. The other third holes H3 of the second panel bottom member 410 may be defined in a sixth overlapping area OVA6 of the second panel bottom member 410 and the second sound generating device 30.

Figure 38:
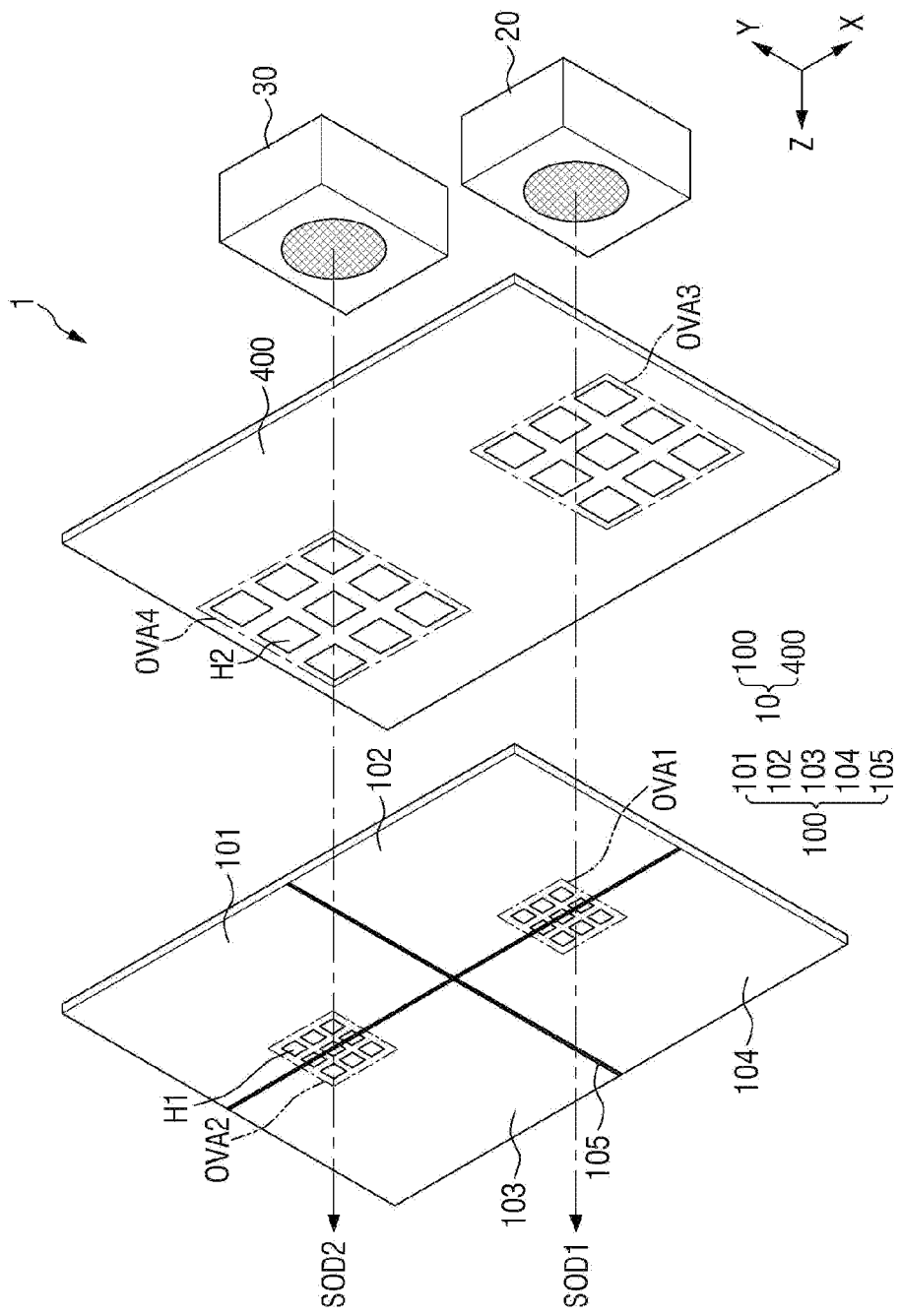
FIG. 38 is an exploded perspective view of another embodiment of a sound system including a display device according to the invention.

FIG. 38 is an exploded perspective view of another embodiment of a sound system including a display device according to the invention.

The embodiment of FIG. 38 differs from the embodiment of FIG. 37 only in that a display device 10 includes a plurality of first, second, third, and fourth display panels 101, 102, 103, and 104, and that a first overlapping area OVA1 is disposed in the second and fourth display panel 102 and 104 and a second overlapping area OVA2 is disposed in the first and third display panels 101 and 103. Thus, a description of the embodiment of FIG. 38 will be omitted.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details with functional equivalents may be made therein without departing from the spirit and scope of the invention.

What is claimed is:

1. A display device comprising:
a display panel through which first holes arranged in a first direction and a second direction which intersects the first direction are defined; and
a first panel bottom member which is disposed on one surface of the display panel and through which second holes arranged in the first and second directions are defined,
wherein a maximum length of a second hole among the second holes in the first direction satisfies "e×(a+c)" where a denotes a maximum length of a first hole among the first holes in the first direction, c denotes a minimum distance between neighboring first holes among the first holes in the first direction, and e is a positive integer, and
the first and second holes are empty holes.

2. The display device of claim 1, wherein a minimum distance between neighboring second holes among the second holes in the first direction satisfies "e×(a+c)".

3. The display device of claim 1, wherein a maximum length of the first hole in the first direction is smaller than the minimum distance between the neighboring first holes in the first direction.

4. The display device of claim 1, wherein a maximum length of a second hole among the second holes in the second direction satisfies "f×(b+d)" where b denotes a maximum length of the first hole in the second direction, d denotes a minimum distance between neighboring first holes in the second direction, and f is a positive integer.

5. The display device of claim 1, wherein a minimum distance between neighboring second holes in the second direction satisfies "f×(b+d)" where b denotes a maximum length of the first hole in the second direction, d denotes a minimum distance between neighboring first holes in the second direction, and f is a positive integer.

6. The display device of claim 4, wherein a maximum length of the first hole in the second direction is smaller than the minimum distance between the neighboring first holes in the second direction.

7. The display device of claim 1, wherein the first holes have a polygonal, circular, or elliptical shape in a plan view.

8. The display device of claim 1, wherein the second holes have a polygonal, circular, or elliptical shape in a plan view.

9. The display device of claim 1, further comprising:
a second panel bottom member which is disposed on one surface of the first panel bottom member and in which third holes arranged in the first and second directions are defined.

10. The display device of claim 9, wherein a maximum length of a third hole among the third holes in the first direction satisfies "g×(a+c)" where g is a positive integer greater than e.

11. The display device of claim 9, wherein a minimum distance between neighboring third holes in the first direction among the third holes satisfies "g×(a+c)" where g is a positive integer greater than e.

12. The display device of claim 9, wherein a maximum length of a third hole among the third holes in the second direction satisfies "h×(b+d)" where b denotes a maximum length of the first hole in the second direction, d denotes a minimum distance between neighboring first holes in the second direction, and h is a positive integer greater than f.

13. The display device of claim 9, wherein a minimum distance between neighboring third holes among the third holes in the second direction satisfies "h×(b+d)" where b denotes a maximum length of the first hole in the second direction, d denotes a minimum distance between neighboring first holes in the second direction, and h is a positive integer greater than f.

14. The display device of claim 9, wherein each of the third holes overlaps with at least one second hole and at least one first hole.

15. A display device comprising:
a first display panel through which first holes arranged in a first direction and a second direction which intersects the first direction are defined;
a first panel bottom member which is disposed on one surface of the first display panel and through which second holes arranged in the first and second directions are defined; and
a sound output device, which is disposed on one surface of the first panel bottom member and outputs sound,
wherein one of the second holes overlaps with at least one first hole among the first holes, and
the first and second holes are empty holes, and
wherein
the one of the second holes overlaps with at least two first holes, and
an overlapping area of the one of the second holes and one of the at least two first holes is different from an overlapping area of the one of the second holes and another first hole of the at least two first holes.

16. The display device of claim 15, wherein the one of the second holes has a larger size than the at least one first hole.

17. The display device of claim 15, further comprising:
a second panel bottom member which is disposed on one surface of the first panel bottom member and in which third holes arranged in the first and second directions are defined,
wherein one of the third holes overlaps with at least one first hole and at least one second hole.

18. The display device of claim 17, wherein the one of the third holes has a larger size than the at least one first hole and the at least one second hole.

19. The display device of claim 15, wherein
pad holes which penetrate a substrate of the first display panel are defined in the substrate.

20. The display device of claim 19, wherein the pad holes do not overlap with the second holes.

21. The display device of claim 19, wherein the first display panel further includes routing lines, which are disposed on a front surface of the substrate, connecting lines, which are disposed on a rear surface of the substrate, and connecting electrodes, which are disposed in the pad holes and connect the routing lines and the connecting lines.

22. The display device of claim 21, wherein the first display panel further includes display pads, which are connected to the connecting lines.

23. A display device comprising:
a first display panel through which first holes arranged in a first direction and a second direction which intersects the first direction are defined;
a second display panel disposed adjacent to the first display panel in the first or second direction,
a first panel bottom member which is disposed on one surface of the first display panel and through which second holes arranged in the first and second directions are defined; and
a sound output device, which is disposed on one surface of the first panel bottom member and outputs sound,
wherein one of the second holes overlaps with at least one first hole among the first holes, and
the first and second holes are empty holes,
wherein third holes and pad holes are defined in the second display panel, and
an arrangement of the third holes is identical to an arrangement of the first holes.

24. A sound system comprising:
a display panel in which first holes arranged in a first direction and a second direction which intersects the first direction are defined;
a first panel bottom member which is disposed on one surface of the display panel and in which second holes arranged in the first and second directions are defined; and
a sound output device, which is disposed on one surface of the first panel bottom member and outputs sound,
wherein a maximum length of a second hole among the second holes in the first direction satisfies "e×(a+c)" where a denotes a maximum length of a first hole among the first holes in the first direction, c denotes a minimum distance between neighboring first holes among the first holes in the first direction, and e is a positive integer.

* * * * *